(12) United States Patent
Kwak et al.

(10) Patent No.: US 10,937,975 B2
(45) Date of Patent: Mar. 2, 2021

(54) ORGANOMETALLIC COMPOUND, ORGANIC LIGHT-EMITTING DEVICE INCLUDING ORGANOMETALLIC COMPOUND, AND DIAGNOSTIC COMPOSITION INCLUDING ORGANOMETALLIC COMPOUND

(71) Applicants: Samsung Electronics Co., Ltd., Suwon-si (KR); VERSITECH LIMITED, Hong Kong (CH)

(72) Inventors: Yoonhyun Kwak, Seoul (KR); Chi Ming Che, Hong Kong (CH); Whail Choi, Seoul (KR); Tsz Lung Lam, Hong Kong (CH); So Ming Tong, Hong Kong (CH)

(73) Assignees: SAMSUNG ELECTRONICS CO., LTD., Gyeonggi-do (KR); VERSITECH LIMITED, Hong Kong (CN)

( * ) Notice: Subject to any disclaimer, the term of this patent is extended or adjusted under 35 U.S.C. 154(b) by 338 days.

(21) Appl. No.: 16/030,074

(22) Filed: Jul. 9, 2018

(65) Prior Publication Data

US 2019/0074454 A1  Mar. 7, 2019

(30) Foreign Application Priority Data

Sep. 7, 2017  (KR) .................. 10-2017-0114705

(51) Int. Cl.
*H01L 51/00* (2006.01)
*C07F 15/00* (2006.01)
*H01L 51/50* (2006.01)

(52) U.S. Cl.
CPC ...... *H01L 51/0087* (2013.01); *C07F 15/0086* (2013.01); *H01L 51/0081* (2013.01);
(Continued)

(58) Field of Classification Search
None
See application file for complete search history.

(56) References Cited

U.S. PATENT DOCUMENTS

| 2006/0134461 | A1 | 6/2006 | Hueo et al. |
| 2013/0274473 | A1 | 10/2013 | Che et al. |
| 2015/0115250 | A1 | 4/2015 | Ma et al. |

FOREIGN PATENT DOCUMENTS

| KR | 2013-0043459 A | 4/2013 |
| KR | 2013-0043460 A | 4/2013 |
| KR | 2015-0050383 A | 5/2015 |

*Primary Examiner* — Jay Yang
(74) *Attorney, Agent, or Firm* — Cantor Colburn LLP

(57) ABSTRACT

An organometallic compound represented by Formula 1:

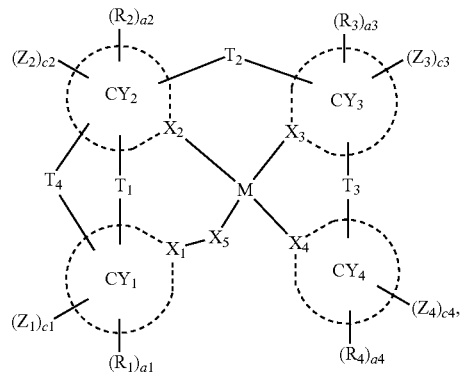

wherein, in Formula 1, groups and variables are the same as described in the specification.

20 Claims, 1 Drawing Sheet

(52) U.S. Cl.
CPC ...... *H01L 51/5012* (2013.01); *H01L 51/5016* (2013.01); *H01L 51/5056* (2013.01); *H01L 51/5072* (2013.01); *H01L 51/5088* (2013.01); *H01L 51/5092* (2013.01); *H01L 51/5096* (2013.01)

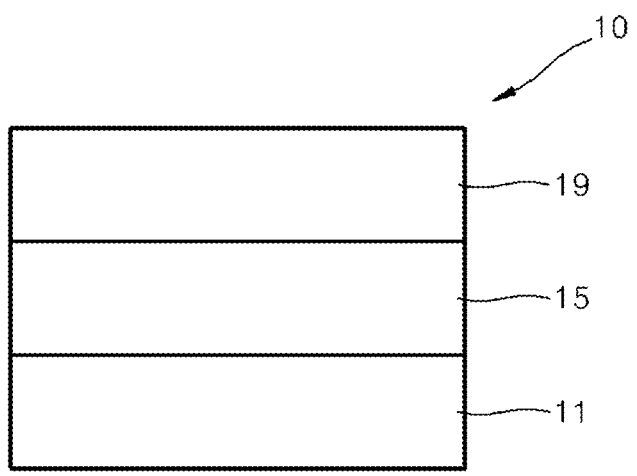

ORGANOMETALLIC COMPOUND, ORGANIC LIGHT-EMITTING DEVICE INCLUDING ORGANOMETALLIC COMPOUND, AND DIAGNOSTIC COMPOSITION INCLUDING ORGANOMETALLIC COMPOUND

CROSS-REFERENCE TO RELATED APPLICATION

This application claims priority to Korean Patent Application No. 10-2017-0114705, filed on Sep. 7, 2017, in the Korean Intellectual Property Office, and all the benefits accruing therefrom under 35 U.S.C. § 119, the content of which is incorporated herein in its entirety by reference.

BACKGROUND

1. Field

The present disclosure relates to an organometallic compound, an organic light-emitting device including the organometallic compound, and a diagnostic composition that includes the organometallic compound.

2. Description of the Related Art

Organic light-emitting devices (OLEDs) are self-emission devices which produce full-color images. In addition, OLEDs have wide viewing angles and exhibit excellent driving voltage and response speed characteristics.

Typical OLEDs include an anode, a cathode, and an organic layer between the anode and the cathode and including an emission layer. A hole transport region may be disposed between the anode and the emission layer, and an electron transport region may be between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state to thereby generate light.

Further, light-emitting compounds, e.g., phosphorescence-emitting compounds, can also be used to monitor, sense, or detect biological materials, including a variety of cells and proteins.

Various types of organic light emitting devices are known. However, there still remains a need in OLEDs having low driving voltage, high efficiency, high brightness, and long lifespan.

SUMMARY

Provided are an organometallic compound, an organic light-emitting device including the organometallic compound, and a diagnostic composition including the organometallic compound.

Additional aspects will be set forth in part in the description which follows and, in part, will be apparent from the description, or may be learned by practice of the presented embodiments.

According to an aspect of an embodiment, an organometallic compound is represented by Formula 1:

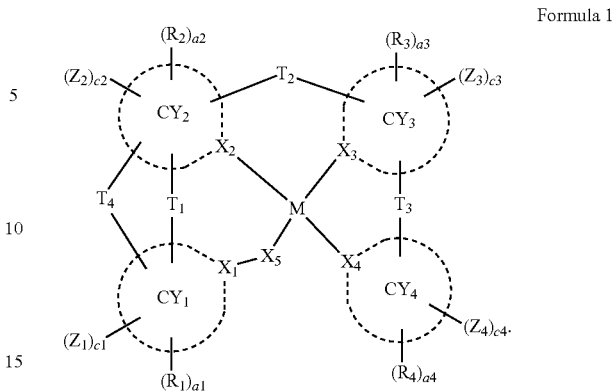

Formula 1

In Formula 1,

M is selected from beryllium (Be), magnesium (Mg), aluminum (Al), calcium (Ca), titanium (Ti), manganese (Mn), cobalt (Co), copper (Cu), zinc (Zn), gallium (Ga), germanium (Ge), zirconium (Zr), ruthenium (Ru), rhodium (Rh), palladium (Pd), silver (Ag), rhenium (Re), platinum (Pt), and gold (Au), $X_1$ is carbon (C), $X_2$ to $X_4$ are each independently selected from C and nitrogen (N), $X_5$ is selected from O, S, B(R'), N(R'), P(R'), C(R')(R"), Si(R')(R"), Ge(R')(R"), C(=O), B(R')(R"), N(R')(R"), and P(R')(R"), two selected from a bond between $X_2$ and M, a bond between $X_3$ and M, and a bond between $X_4$ and M are each a coordinate bond, while the rest is a covalent bond, a bond between $X_5$ and M is a covalent bond, rings $CY_1$ to $CY_4$ are each independently selected from a $C_5$-$C_{30}$ carbocyclic group and a $C_1$-$C_{30}$ heterocyclic group, $T_1$ is selected from a single bond, a double bond, *—N[($L_{61}$)$_{a61}$-($R_{61}$)]—*', *—B($R_{61}$)—*', *—P($R_{61}$)—*', *—C($R_{61}$)($R_{62}$)—*', *—Si($R_{61}$)($R_{62}$)—*', *—Ge($R_{61}$)($R_{62}$)—*', *—S—*', *—Se—*', *—O—*', *—C(=O)—*', *—S(=O)—*', *—S(=O)$_2$—*', *—C($R_{61}$)=*', *=C($R_{61}$)—*', *—C($R_{61}$)=C($R_{62}$)—*', *—C(=S)—*', and *—C≡C—*', $T_2$ is selected from a single bond, a double bond, *—N[($L_{63}$)$_{a63}$-($R_{63}$)]—*', *—B($R_{63}$)—*', *—P($R_{63}$)—*', *—C($R_{63}$)($R_{64}$)—*', *—Si($R_{63}$)($R_{64}$)—*', *—Ge($R_{63}$)($R_{64}$)—*', *—S—*', *—Se—*', *—O—*', *—C(=O)—*', *—S(=O)—*', *—S(=O)$_2$—*', *—C($R_{63}$)=*', *=C($R_{63}$)—*', *—C($R_{63}$)=C($R_{64}$)—*', *—C(=S)—*', and *—C≡C—*', $T_3$ is selected from a single bond, a double bond, *—N[($L_{65}$)$_{a65}$-($R_{65}$)]—*', *—B($R_{65}$)—*', *—P($R_{65}$)—*', *—C($R_{65}$)($R_{66}$)—*', *—Si($R_{65}$)($R_{66}$)—*', *—Ge($R_{65}$)($R_{66}$)—*', *—S—*', *—Se—*', *—O—*', *—C(=O)—*', *—S(=O)—*', *—S(=O)$_2$—*', *—C($R_{65}$)=*', *=C($R_{65}$)—*', *—C($R_{65}$)=C($R_{66}$)—*', *—C(=S)—*', and *—C≡C—*', and $T_4$ is selected from *—N[($L_{67}$)$_{a67}$-($R_{67}$)]—*', *—B($R_{67}$)—*', *—P($R_{67}$)—*', *—C($R_{67}$)($R_{68}$)—*', *—Si($R_{67}$)($R_{68}$)—*', *—Ge($R_{67}$)($R_{68}$)—*', *—S—*', *—Se—*', *—O—*', *—C(=O)—*', *—S(=O)—*', *—S(=O)$_2$—*', *—C($R_{67}$)=*', *=C($R_{67}$)—*', *—C($R_{67}$)=C($R_{68}$)—*', *—C(=S)—*', and *—C≡C—*', $L_{61}$, $L_{63}$, $L_{65}$, and $L_{67}$ are each independently selected from a single bond, a substituted or unsubstituted $C_5$-$C_{30}$ carbocyclic group, and a substituted or unsubstituted $C_1$-$C_{30}$ heterocyclic group, a61, a63, a65, and a67 are each independently an integer from 1 to 3; when a61 is 2 or greater, at least two $L_{61}$ groups are identical to or different from each other, when a63 is 2 or greater, at least two $L_{63}$ groups are identical to or different from each other, when a65 is 2 or greater, at least two $L_{65}$ groups are identical to or different from each other, when a67 is 2 or greater, at least two $L_{67}$ groups are identical to or different from each other, $R_{61}$ and $R_{62}$, $R_{63}$ and $R_{64}$, $R_{65}$ and $R_{66}$, and $R_{67}$ and $R_{68}$ are optionally linked via a first linking group to form a substituted or unsubstituted $C_5$-$C_{30}$ carbocyclic group or a substituted or unsubstituted $C_1$-$C_{30}$ heterocyclic group, $Z_1$ to $Z_4$ are each a group represented by *—N($R_{51}$)($R_{52}$), c1 to c4 are each independently an integer from 0 to 5, provided that a sum of c1 to c4 is 1 or greater, $R_1$ to $R_4$, $R_{51}$, $R_{52}$, $R_{61}$ to $R_{68}$, R', and R" are each independently selected from hydrogen, deuterium, —F, —Cl, —Br, —I, —SF$_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl-heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), and —P(=O)($Q_8$)($Q_9$), a1 to a4 are each independently an integer from 0 to 20, two groups selected from a plurality of $R_1$ groups are optionally linked to form a substituted or unsubstituted $C_5$-$C_{30}$ carbocyclic group or a substituted or unsubstituted $C_1$-$C_{30}$ heterocyclic group, two groups selected from a plurality of $R_2$ groups are optionally linked to form a substituted or unsubstituted $C_5$-$C_{30}$ carbocyclic group or a substituted or unsubstituted $C_1$-$C_{30}$ heterocyclic group, two groups selected from a plurality of $R_3$ groups are optionally linked to form a substituted or unsubstituted $C_5$-$C_{30}$ carbocyclic group or a substituted or unsubstituted $C_1$-$C_{30}$ heterocyclic group, two groups selected from a plurality of $R_4$ groups are optionally linked to form a substituted or unsubstituted $C_5$-$C_{30}$ carbocyclic group or a substituted or unsubstituted $C_1$-$C_{30}$ heterocyclic group, at least two of $R_1$ to $R_4$ are optionally linked to form a substituted or unsubstituted $C_5$-$C_{30}$ carbocyclic group or a substituted or unsubstituted $C_1$-$C_{30}$ heterocyclic group, $R_{51}$ and $R_{52}$ are optionally linked to form a substituted or unsubstituted $C_5$-$C_{30}$ carbocyclic group or a substituted or unsubstituted $C_1$-$C_{30}$ heterocyclic group,

* and *' each indicate a binding site to an adjacent atom, and at least one substituent of the substituted $C_5$-$C_{30}$ carbocyclic group, substituted $C_1$-$C_{30}$ heterocyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group is selected from:

deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkyl-heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —B($Q_{16}$)($Q_{17}$), and —P(=O)($Q_{18}$)($Q_{19}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkyl-heteroaryl group, a monovalent non-aromatic condensed polycyclic group, and a monovalent non-aromatic condensed heteropolycyclic group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkyl-heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), and —P(=O)($Q_{28}$)($Q_{29}$); and —N($Q_{31}$)($Q_{32}$), —Si($Q_{33}$)($Q_{34}$)($Q_{35}$), —B($Q_{36}$)($Q_{37}$), and —P(=O)($Q_{38}$)($Q_{39}$);

wherein $Q_1$ to $Q_9$, $Q_{11}$ to $Q_{19}$, $Q_{21}$ to $Q_{29}$, and $Q_{31}$ to $Q_{39}$ are each independently selected from hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one of a $C_1$-$C_{60}$ alkyl group and a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl-heteroaryl group, a monovalent non-aromatic condensed polycyclic group, and a monovalent non-aromatic condensed heteropolycyclic group.

According to an aspect of another embodiment, an organic light-emitting device includes:

a first electrode;

a second electrode; and an organic layer disposed between the first electrode and the second electrode, wherein the organic layer including an emission layer and at least one organometallic compound described above.

In the organic layer, the organometallic compound serves as a dopant.

According to an aspect of another embodiment, a diagnostic composition includes at least one organometallic compound represented by Formula 1.

BRIEF DESCRIPTION OF THE DRAWING

These and/or other aspects will become apparent and more readily appreciated from the following description of the embodiments, taken in conjunction with the FIGURE which is a schematic cross-sectional view of an organic light-emitting device according to an embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the FIGURES, to explain aspects of the present disclosure. As used herein, the term "and/or" includes any and all combinations of one or more of the associated listed items. Expressions such as "at least one of," when preceding a list of elements, modify the entire list of elements and do not modify the individual elements of the list.

An organometallic compound may be represented by Formula 1:

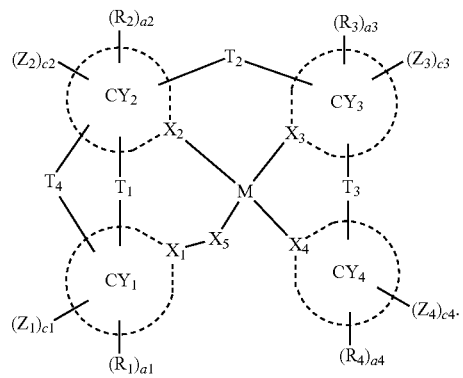

Formula 1

In Formula 1, M may be selected from beryllium (Be), magnesium (Mg), aluminum (Al), calcium (Ca), titanium (Ti), manganese (Mn), cobalt (Co), copper (Cu), zinc (Zn), gallium (Ga), germanium (Ge), zirconium (Zr), ruthenium (Ru), rhodium (Rh), palladium (Pd), silver, (Ag), rhenium (Re), platinum (Pt), and gold (Au).

In some embodiments, M in Formula 1 may be Pt, Pd, or Au, but embodiments are not limited thereto.

In Formula 1, $X_1$ may be C, $X_2$ to $X_4$ may each independently be C or N, $X_5$ may be O, S, B(R'), N(R'), P(R'), C(R')(R''), Si(R')(R''), Ge(R')(R''), C(=O), B(R')(R''), N(R')(R''), or P(R')(R'').

In an embodiment, $X_5$ may O or S, i) $X_2$ and $X_4$ may each be N, and $X_3$ may be C, or ii) $X_3$ and $X_4$ may each be N, and $X_2$ may be C, but embodiments are not limited thereto.

In Formula 1, two selected from a bond between $X_2$ and M, a bond between $X_3$ and M, and a bond between $X_4$ and M may each be a coordinate bond, while the rest may be a covalent bond, and a bond between $X_5$ and M may be a covalent bond. The organometallic compound represented by Formula 1 may be electrically neutral.

In some embodiments, in Formula 1, i) a bond between $X_2$ and M and a bond between $X_4$ and M may each be a coordinate bond, and a bond between $X_3$ and M may be a covalent bond, or ii) a bond between $X_3$ and M and a bond between $X_4$ and M may each be a coordinate bond, and a bond between $X_2$ and M may be a covalent bond, but embodiments are not limited thereto.

In Formula 1, rings $CY_1$ to $CY_4$ may each independently be selected from a $C_5$-$C_{30}$ carbocyclic group and a $C_1$-$C_{30}$ heterocyclic group.

In some embodiments, rings $CY_1$ to $CY_4$ may each independently be selected from a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, and a 5,6,7,8-tetrahydroquinoline group.

In some embodiments, at least one of rings $CY_1$ to $CY_4$ may be selected from condensed rings in which at least one 5-membered ring may be condensed with at least one 6-membered ring, the 5-membered ring may be selected from a cyclopentadiene group, a furan group, a thiophene group, a pyrrole group, a silole group, an oxazole group, an isoxazole group, an oxadiazole group, an isoxadiazole group, an oxatriazole group, a thiazole group, an isothiazole group, a thiadiazole group, an isothiadiazole group, a thiatriazole group, a pyrazole group, an imidazole group, a triazole group, a tetrazole group, an azasilole group, a diazasilole group, and a triazasilole group, and the 6-membered ring may be selected from a cyclohexane group, a cyclohexene group, a benzene group, a pyridine group, a pyrimidine group, a pyrazine group, and a pyridazine group.

In Formula 1, $T_1$ may be selected from a single bond, a double bond, *—N[($L_{61}$)$_{a61}$-($R_{61}$)]—*', *—B($R_{61}$)—*', *—P($R_{61}$)—*', *—C($R_{61}$)($R_{62}$)—*', *—Si($R_{61}$)($R_{62}$)—*', *—Ge($R_{61}$)($R_{62}$)—*', *—S—*', *—Se—*', *—O—*', *—C(=O)—*', *—S(=O)—*', *—S(=O)$_2$—*', *—C($R_{61}$)=*', *=C($R_{61}$)—*', *—C($R_{61}$)=C($R_{62}$)—*', C(=S)—*', and *—C≡C—*', $T_2$ may be selected from a single bond, a double bond, *—N[($L_{63}$)$_{a63}$-($R_{63}$)]—*, *—B($R_{63}$)—*', *—P($R_{63}$)—*', *—C($R_{63}$)($R_{64}$)—*', *—Si($R_{63}$)($R_{64}$)—*', *—Ge($R_{63}$)($R_{64}$)—*', *—S—*', *—Se—*', *—O—*', *—C(=O)—*', *—S(=O)—*', *—S(=O)$_2$—*', *—C($R_{63}$)=*', *=C($R_{63}$)—*', *—C($R_{63}$)=C($R_{64}$)—*', *—C(=S)—*', and *—C≡C—*', $T_3$ may be selected from a single bond, a double bond, *—N[($L_{65}$)$_{a65}$-($R_{65}$)]—*, *—B($R_{65}$)—*', *—P($R_{65}$)—*', *—C($R_{65}$)($R_{66}$)—*', *—Si($R_{65}$)($R_{66}$)—*', *—Ge($R_{65}$)($R_{66}$)—*', *—S—*', *—Se—*', *—O—*', *—C(=O)—*', *—S(=O)—*', *—S(=O)$_2$—*', *—C($R_{65}$)=*', *=C($R_{65}$)—*', *—C($R_{65}$)=C($R_{66}$)—*', *—C(=S)—*', and *—C≡C—*', and $T_4$ may be selected from *—N[($L_{67}$)$_{a67}$-($R_{67}$)]—*', *—B($R_{67}$)—*', *—P($R_{67}$)—*', *—C($R_{67}$)($R_{68}$)—*', *—Si($R_{67}$)($R_{68}$)—*', *—Ge($R_{67}$)($R_{68}$)—*', *—S—*', *—Se—*', *—O—*', *—C(=O)—*', *—S(=O)—*', *—S(=O)$_2$—*', *—C($R_{67}$)=*', *=C($R_{67}$)—*', *—C($R_{67}$)=C($R_{68}$)—*', *—C(=S)—*', and *—C≡C—*'.

$R_{61}$ and $R_{62}$, $R_{63}$ and $R_{64}$, $R_{65}$ and $R_{66}$, and $R_{67}$ and $R_{68}$ may optionally be linked via a first linking group to form a substituted or unsubstituted $C_5$-$C_{30}$ carbocyclic group or a substituted or unsubstituted $C_1$-$C_{30}$ heterocyclic group.

The first linking group may be selected from a single bond, *—N($R_9$)—*', *—B($R_9$)—*', *—P($R_9$)—*', *—C($R_9$)($R_{10}$)—*', *—Si($R_9$)($R_{10}$)—*', *—Ge($R_9$)($R_{10}$)—*', *—S—*', *—Se—*', *—O—*', *—C(=O)—*', *—S(=O)—*', *—S(=O)$_2$—*', *—C($R_9$)=*', *=C($R_9$)—*', *—C($R_9$)=C($R_{10}$)—*', *—C(=S)—*', and *—C≡C—*', provided that descriptions for $R_9$ and $R_{10}$ may each be the same as those for $R_1$ as described herein, and * and *' may each independently indicate a binding site to an adjacent atom.

$L_{61}$, $L_{63}$, $L_{65}$, and $L_{67}$ may each independently be selected from a single bond, a substituted or unsubstituted $C_5$-$C_{30}$ carbocyclic group, and a substituted or unsubstituted $C_1$-$C_{30}$ heterocyclic group.

In some embodiments, $L_{61}$, $L_{63}$, $L_{65}$, and $L_{67}$ may each independently be selected from a single bond, a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, and a benzothiadiazole group; and a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, and a benzothiadiazole group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a pyridinyl group, a pyrimidinyl group, a triazinyl group, a fluorenyl group, a dimethylfluorenyl group, a diphenylfluorenyl group, a carbazolyl group, a phenylcarbazolyl group, a dibenzofuranyl group, a dibenzothiophenyl group, a dibenzosilolyl group, a dimethyldibenzosilolyl group, a diphenyldibenzosilolyl group, —N($Q_{31}$)($Q_{32}$), —Si($Q_{33}$)($Q_{34}$)($Q_{35}$), —B($Q_{36}$)($Q_{37}$), and —P(=O)($Q_{38}$)($Q_{39}$), wherein $Q_{31}$ to $Q_{39}$ may each independently be selected from —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a $C_1$-$C_{10}$ alkyl group, and a phenyl group.

a61, a63, a65, and a67 may respectively indicate the number of $L_{61}$ groups, $L_{63}$ groups, $L_{65}$ groups, and $L_{67}$ groups. a61, a63, a65, and a67 may each independently be an integer from 1 to 3; when a61 is 2 or greater, at least two $L_{61}$ groups may be identical to or different from each other, when a63 is 2 or greater, at least two $L_{63}$ groups may be identical to or different from each other, when a65 is 2 or greater, at least two $L_{65}$ groups may be identical to or different from each other, and when a67 is 2 or greater, at least two $L_{67}$ groups may be identical to or different from each other. a61, a63, a65, and a67 may each independently be 1 or 2.

In an embodiment, in Formula 1, $T_1$ and $T_2$ may each be a single bond, and $T_3$ may be *—N[($L_{65}$)$_{a65}$-($R_{65}$)]—*', *—C($R_{65}$)($R_{66}$)—*', *—Si($R_{65}$)($R_{66}$)—*', *—S—*', or *—O—*', but embodiments are not limited thereto.

In one or more embodiments, in Formula 1, $T_4$ may be *—C($R_{67}$)($R_{68}$)—*', *—Si($R_{67}$)($R_{68}$)—*', or *—Ge($R_{67}$)($R_{68}$)—*', but embodiments are not limited thereto.

In Formula 1, $Z_1$ to $Z_4$ may each be a group represented by *—N($R_{51}$)($R_{52}$). $R_{51}$ and $R_{52}$ may be the same as those described herein.

In an embodiment, $R_{51}$ and $R_{52}$ may optionally be linked to each other via the first linking group to form a substituted or unsubstituted $C_5$-$C_{30}$ carbocyclic group or a substituted or unsubstituted $C_1$-$C_{30}$ heterocyclic group (e.g., see Compound 8). The first linking group may be the same as described herein. In some embodiments, $R_{51}$ and $R_{52}$ may optionally be linked via a single bond, but embodiments are not limited thereto.

In Formula 1, c1 to c4 may respectively indicate the number of $Z_1$ groups to $Z_4$ groups. c1 to c4 may each independently be 0, 1, 2, 3, 4, or 5. When c1 is 2 or greater, at least two $Z_1$ groups may be identical to or different from each other, when c2 is 2 or greater, at least two $Z_2$ groups may be identical to or different from each other, when c3 is 2 is or greater, at least two $Z_3$ groups may be identical to or different from each other, and when c4 is 2 is or greater, at least two $Z_4$ groups may be identical to or different from each other.

In some embodiments, c1 to c4 may each independently be 0, 1, or 2.

A sum of c1 to c4 may be 1 or greater. In other words, Formula 1 may essentially include at least one selected from $Z_1$ to $Z_4$.

In an embodiment, a sum of c1 to c4 may be 1 or 2.

In some embodiments, in Formula 1,
c1=1, c2=0, c3=0, and c4=0;
c1=0, c2=1, c3=0, and c4=0;
c1=0, c2=0, c3=1, and c4=0;
c1=0, c2=0, c3=0, and c4=1; or
c1=0, c2=2, c3=0, and c4=0, but embodiments are not limited thereto.

In one or more embodiments, c4 in Formula 1 may not be 0. In some embodiments, c4 in Formula 1 may be 1 or 2. In some embodiments, c4 in Formula 1 may be 1, but embodiments are not limited thereto.

$R_1$ to $R_4$, $R_{51}$, $R_{52}$, $R_{61}$ to $R_{68}$, R', and R" may each independently be selected from hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl-heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), and —P(=O)($Q_8$)($Q_9$), wherein $Q_1$ to $Q_9$ may be the same as those described herein.

In some embodiments, $R_1$ to $R_4$, $R_{51}$, $R_{52}$, $R_{61}$ to $R_{68}$, R', and R" may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and —N($Q_1$)($Q_2$), —Si($Q_3$)($Q_4$)($Q_5$), —B($Q_6$)($Q_7$), and —P(=O)($Q_8$)($Q_9$), wherein $Q_1$ to $Q_9$ may each independently be selected from —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a $C_1$-$C_{10}$ alkyl group, and a phenyl group.

In some embodiments, $R_1$ to $R_4$, $R_{51}$, $R_{52}$, $R_{61}$ to $R_{68}$, R', and R" may each independently be selected from hydrogen, deuterium, —F, a cyano group, a nitro group, —$SF_5$, —$CH_3$, —$CD_3$, —$CD_2H$, —$CDH_2$, —$CF_3$, —$CF_2H$, —$CFH_2$, groups represented by Formulae 9-1 to 9-19, and groups represented by Formulae 10-1 to 10-194:

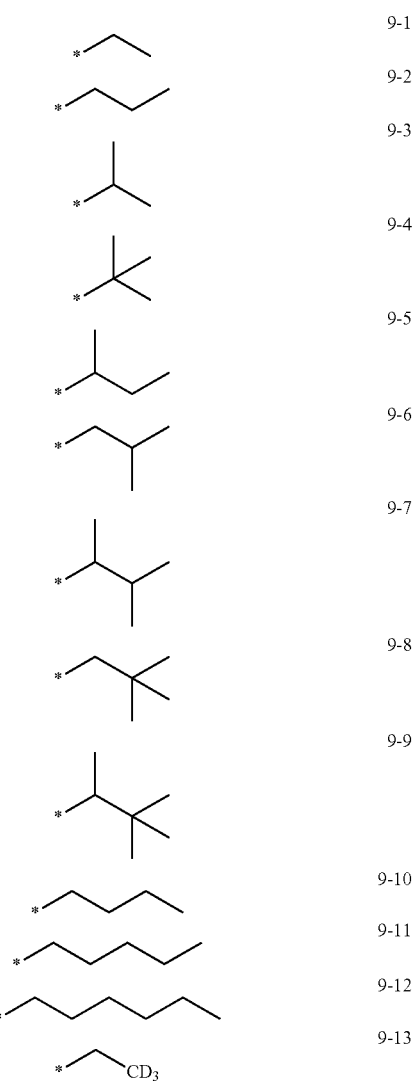

-continued
9-14
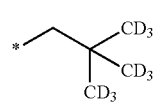
9-15
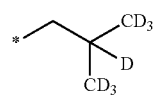
9-16
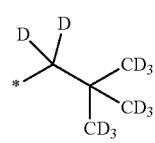
9-17
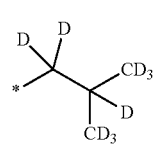
9-18
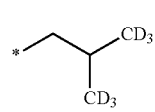
9-19
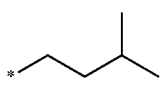
10-1
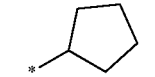
10-2
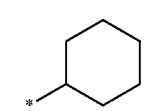
10-3
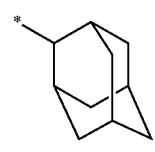
10-4
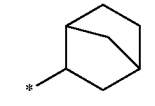
10-5
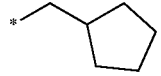
10-6
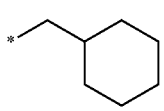
10-7
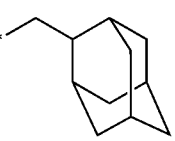
10-8
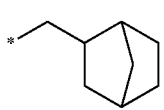
-continued
10-9
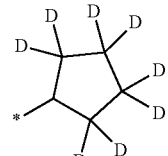
10-10
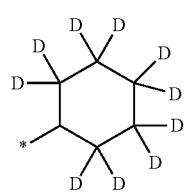
10-11
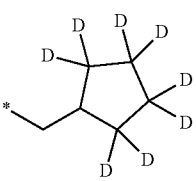
10-12
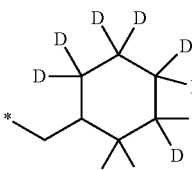
10-13
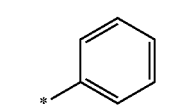
10-14
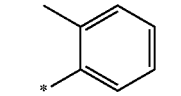
10-15
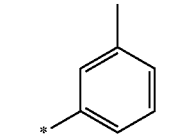
10-16
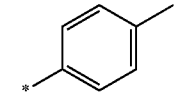
10-17
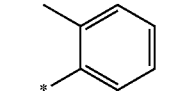
10-18
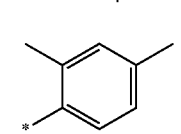

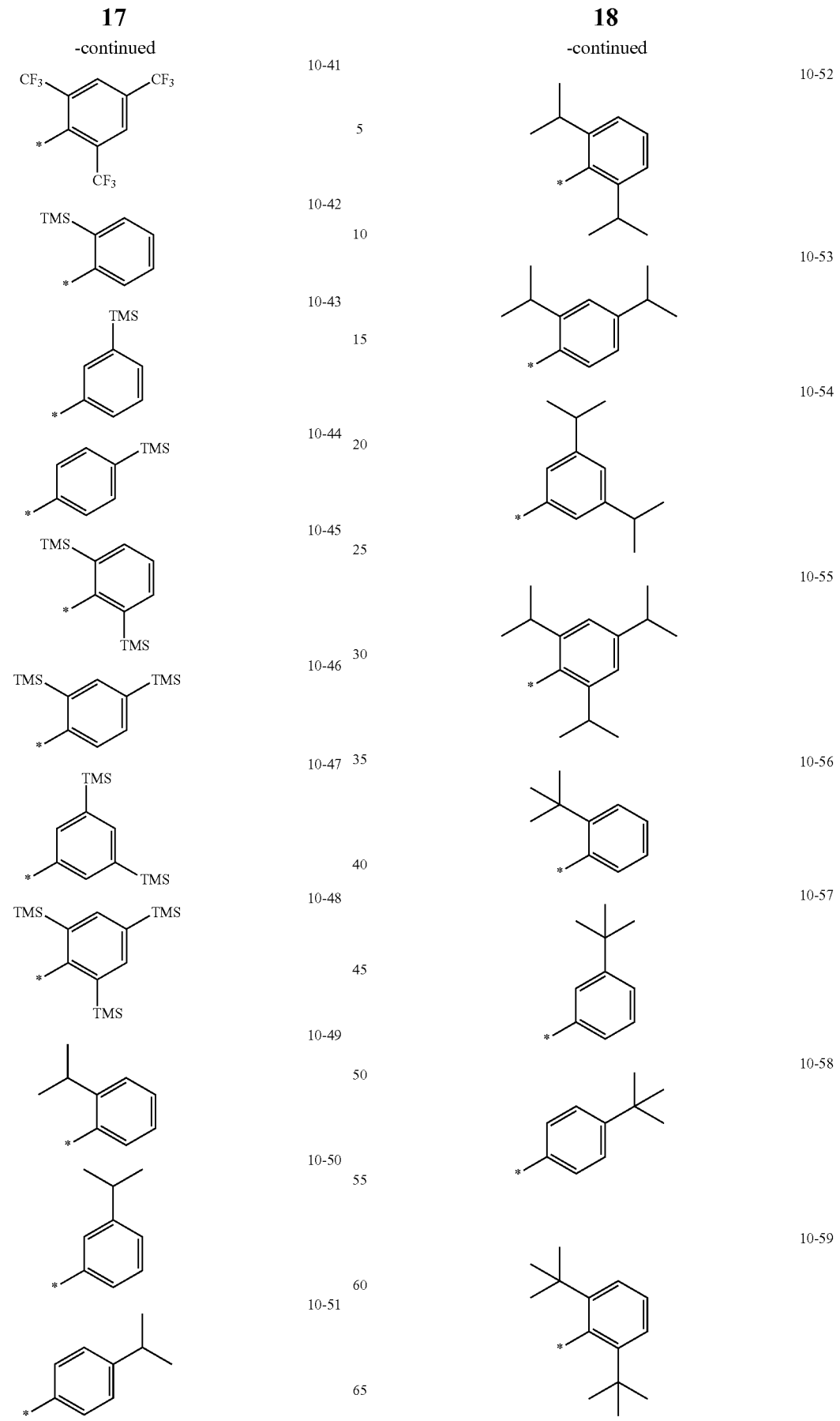

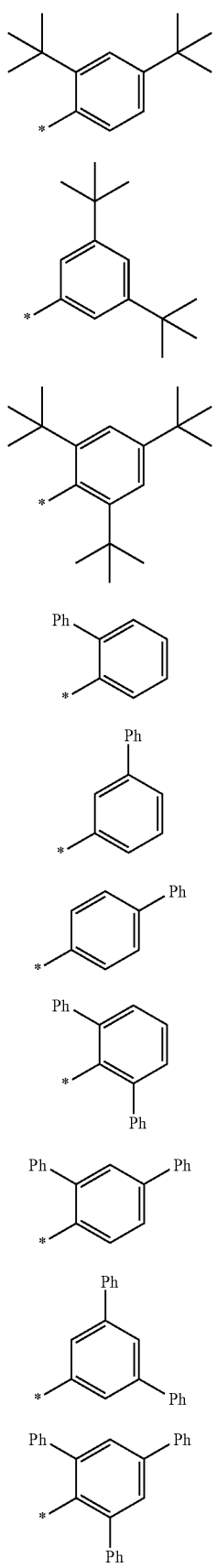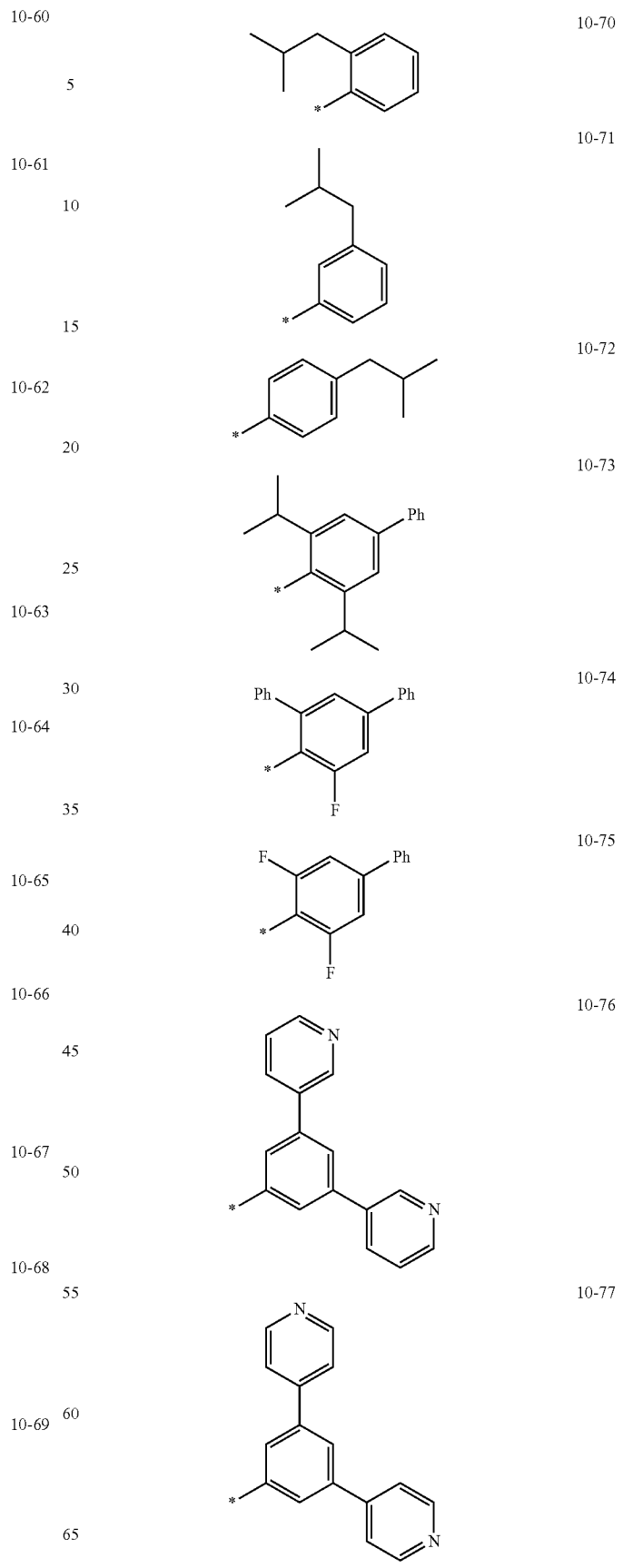

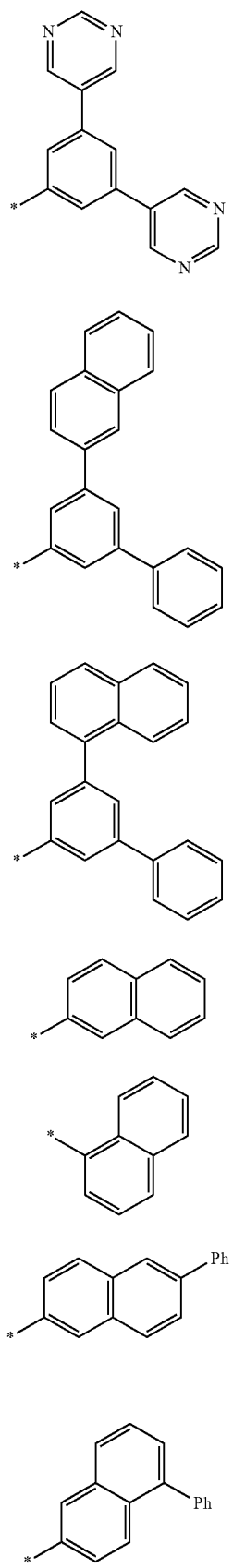

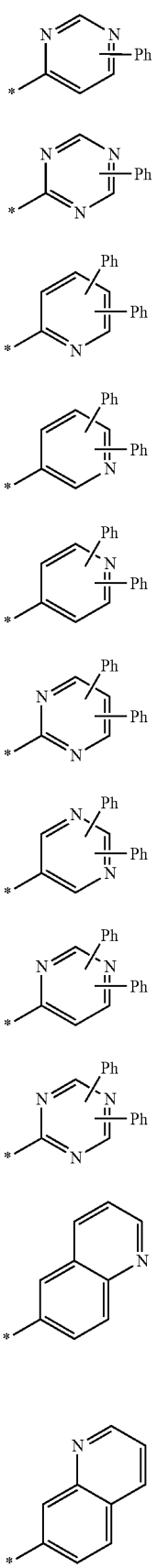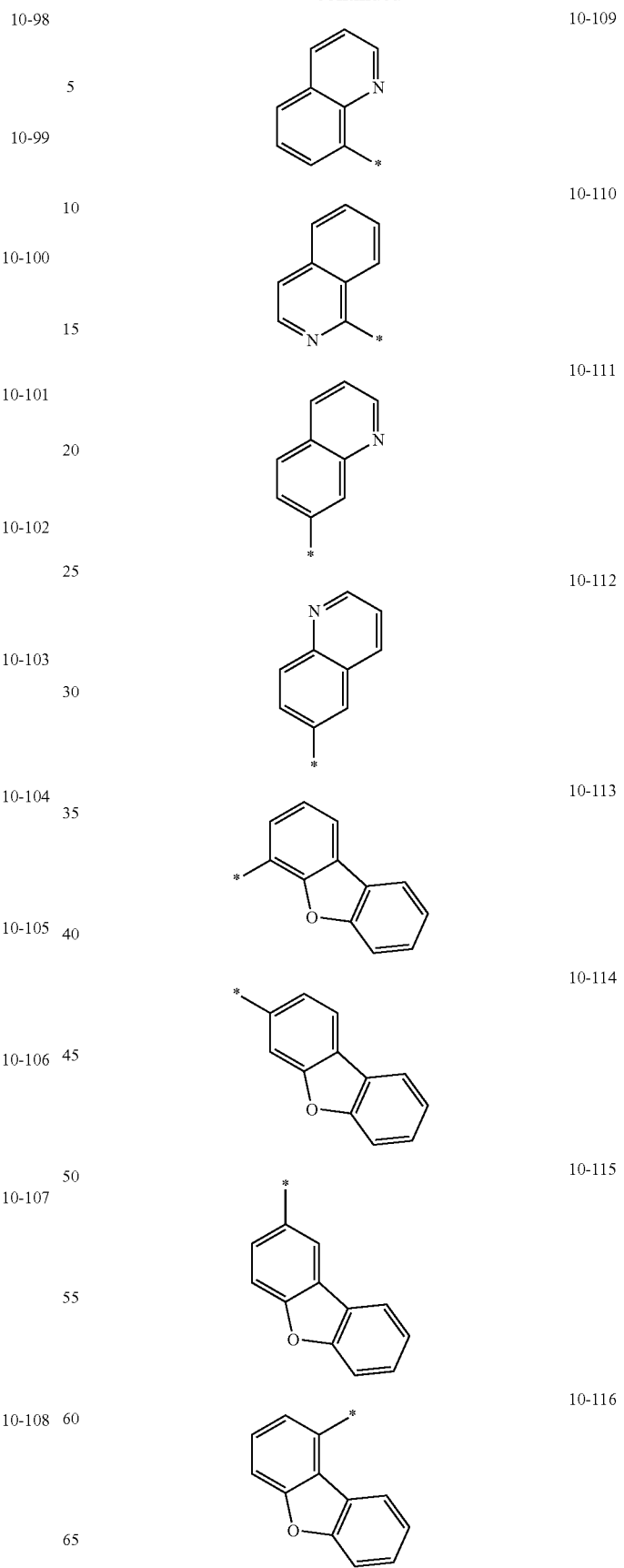

10-117 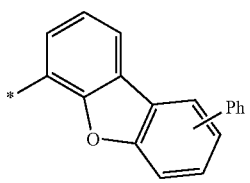
10-118 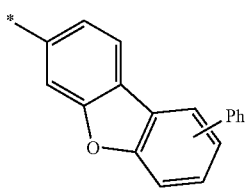
10-119 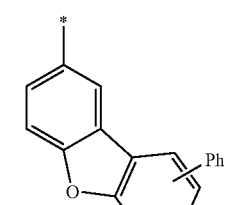
10-120 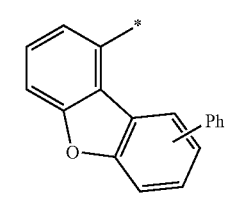
10-121 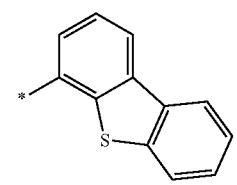
10-122 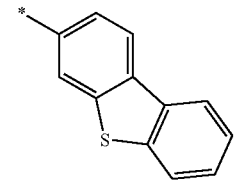
10-123 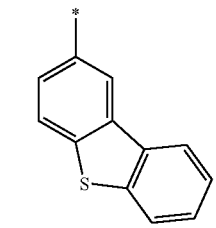
10-124 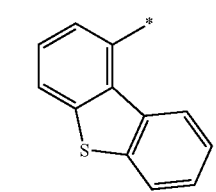
10-125 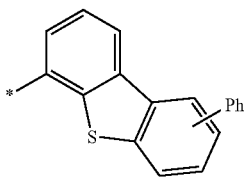
10-126 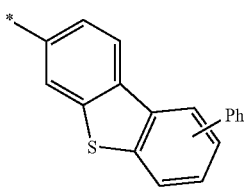
10-127 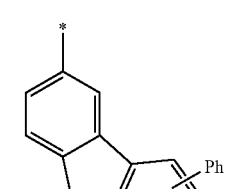
10-128 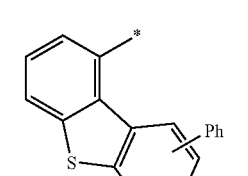
10-129 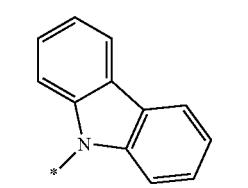
10-130 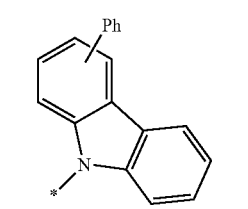
10-131 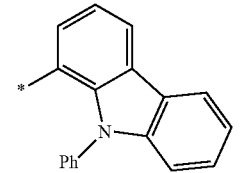
10-132 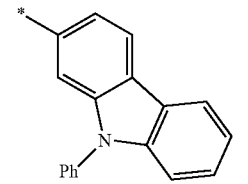

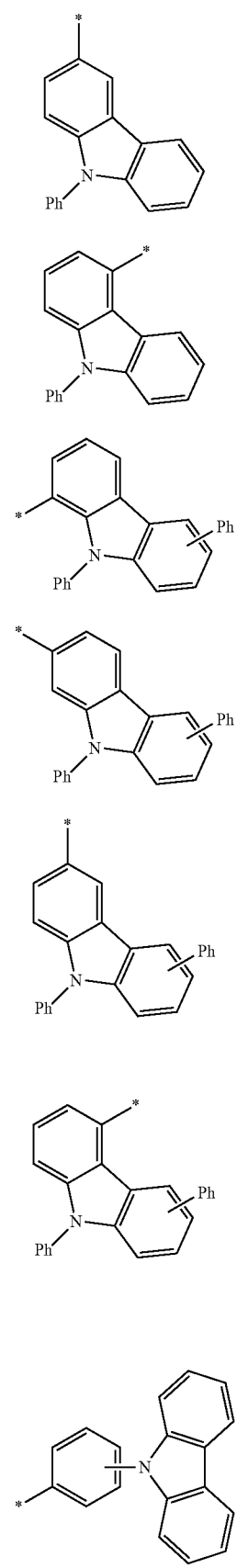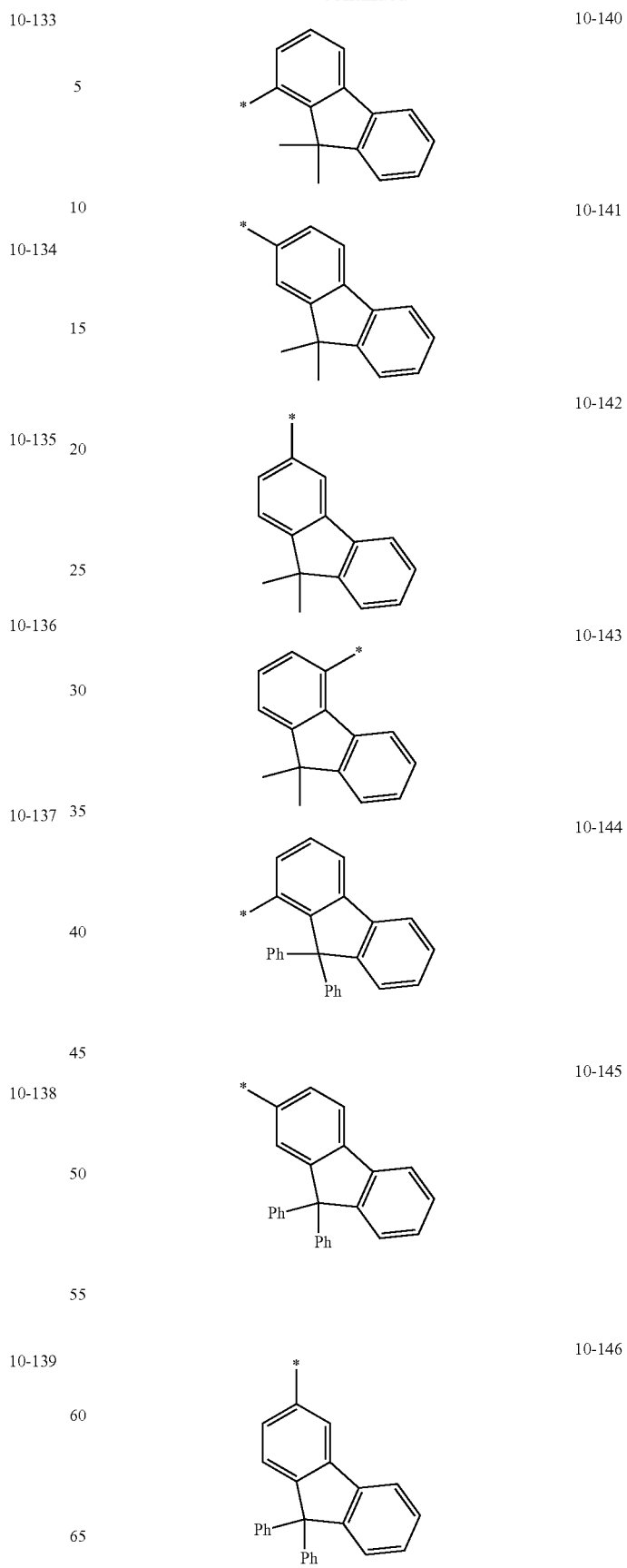

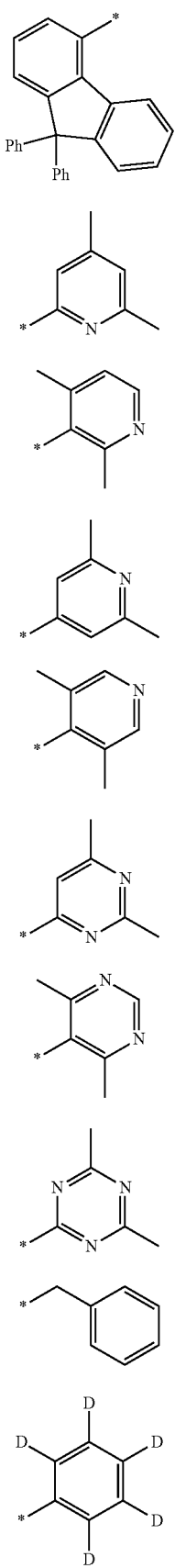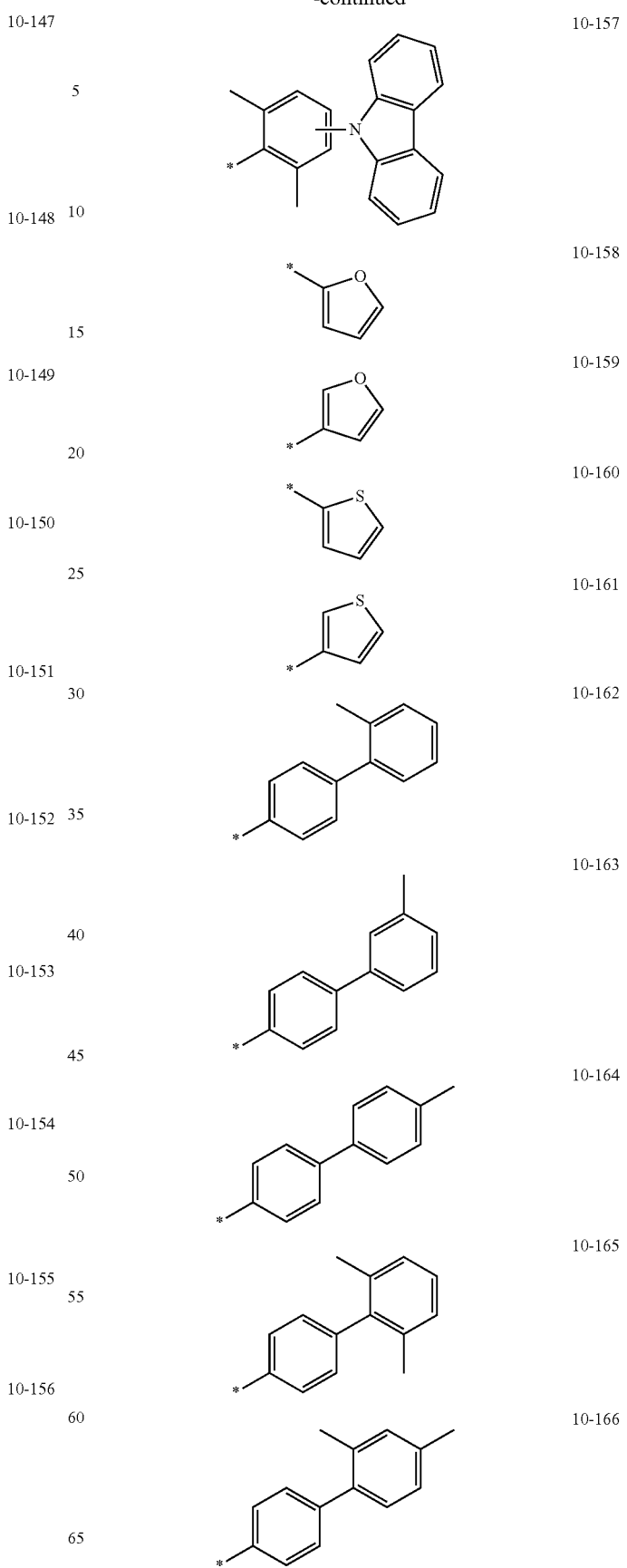

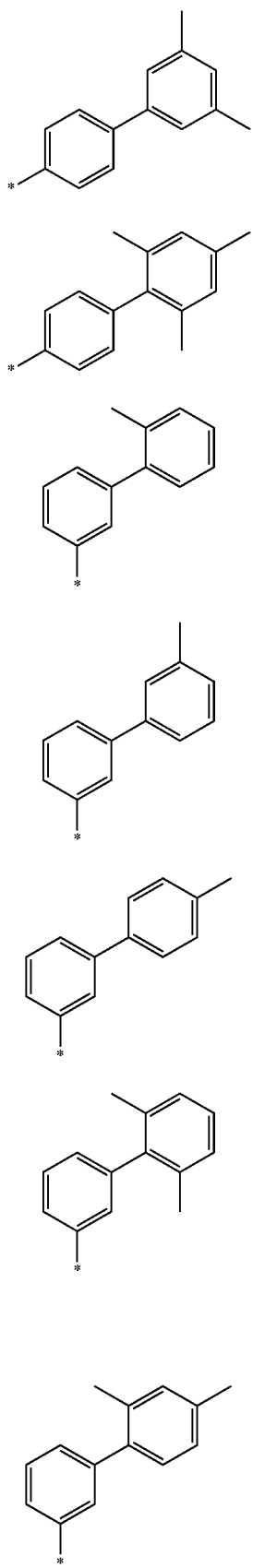
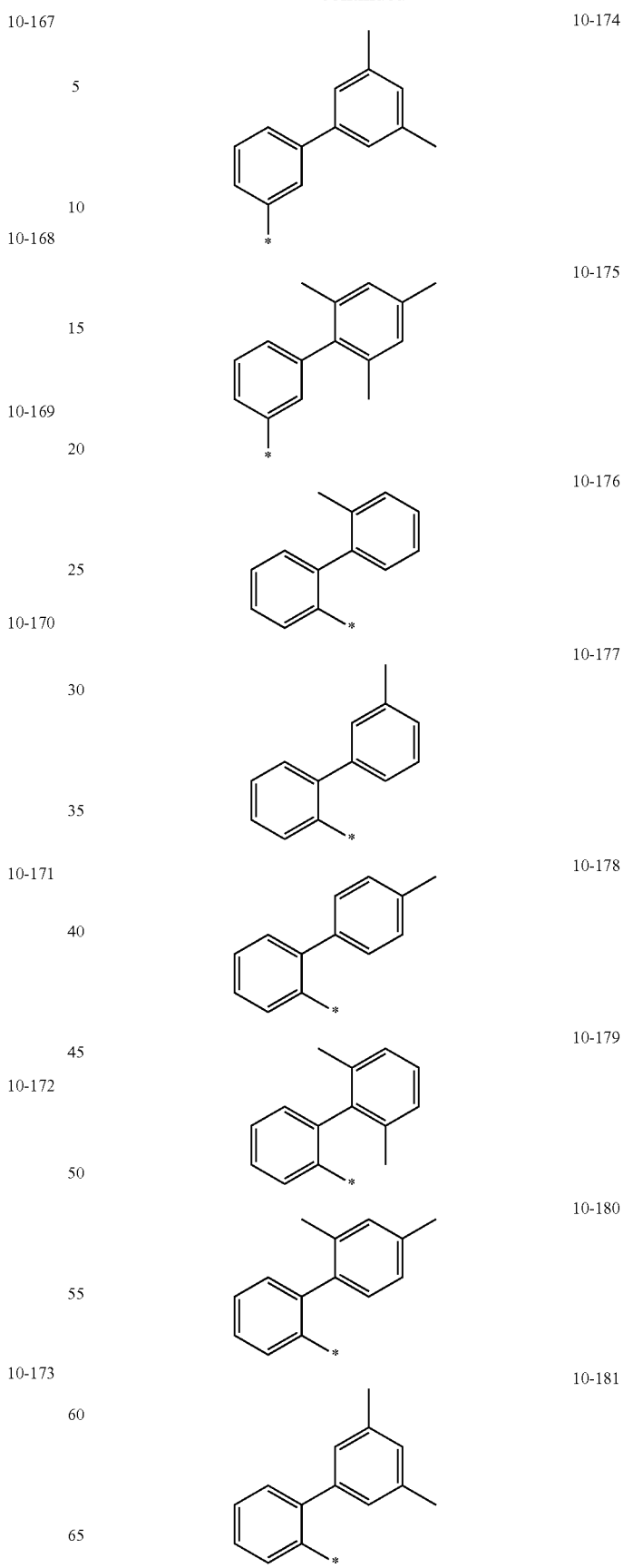

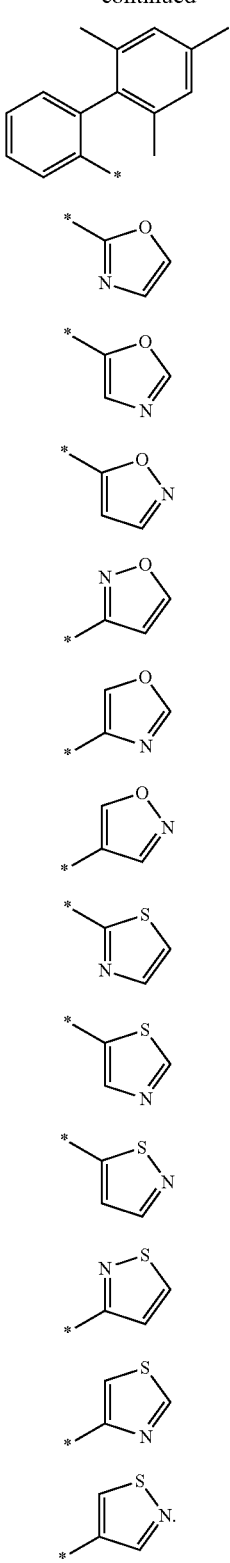

In Formulae 9-1 to 9-19 and 10-1 to 10-194, * indicates a binding site to an adjacent atom, "Ph" represents a phenyl group, and "TMS" represents a trimethylsilyl group.

In Formula 1, a1 to a4 respectively indicate the number of $R_1$ groups to $R_4$ groups. a1 to a4 may each independently be an integer from 0 to 20 (for example, an integer from 0 to 4). When a1 is 2 or greater, at least two $R_1$ groups may be identical to or different from each other, when a2 is 2 or greater, at least two $R_2$ groups may be identical to or different from each other, when a3 is 2 is or greater, at least two $R_3$ groups may be identical to or different from each other, and when a4 is 2 is or greater, at least two $R_4$ groups may be identical to or different from each other.

In Formula 1, i) two groups selected from a plurality of $R_1$ groups may optionally be linked to form a substituted or unsubstituted $C_5$-$C_{30}$ carbocyclic group or a substituted or unsubstituted $C_1$-$C_{30}$ heterocyclic group, ii) two groups selected from a plurality of $R_2$ groups may optionally be linked to form a substituted or unsubstituted $C_5$-$C_{30}$ carbocyclic group or a substituted or unsubstituted $C_1$-$C_{30}$ heterocyclic group, iii) two groups selected from a plurality of $R_3$ groups may optionally be linked to form a substituted or unsubstituted $C_5$-$C_{30}$ carbocyclic group or a substituted or unsubstituted $C_1$-$C_{30}$ heterocyclic group, iv) two groups selected from a plurality of $R_4$ groups may optionally be linked to form a substituted or unsubstituted $C_5$-$C_{30}$ carbocyclic group or a substituted or unsubstituted $C_1$-$C_{30}$ heterocyclic group, v) at least two of $R_1$ to $R_4$ may optionally be linked to form a substituted or unsubstituted $C_5$-$C_{30}$ carbocyclic group or a substituted or unsubstituted $C_1$-$C_{30}$ heterocyclic group, and vi) $R_{51}$ and $R_{52}$ may optionally be linked to form a substituted or unsubstituted $C_5$-$C_{30}$ carbocyclic group or a substituted or unsubstituted $C_1$-$C_{30}$ heterocyclic group.

In some embodiments, i) a substituted or unsubstituted $C_5$-$C_{30}$ carbocyclic group or a substituted or unsubstituted $C_1$-$C_{30}$ heterocyclic group formed by linking of two groups selected from a plurality of $R_1$ groups, ii) a substituted or unsubstituted $C_5$-$C_{30}$ carbocyclic group or a substituted or unsubstituted $C_1$-$C_{30}$ heterocyclic group formed by linking of two groups selected from a plurality of $R_2$ groups, iii) a substituted or unsubstituted $C_5$-$C_{30}$ carbocyclic group or a substituted or unsubstituted $C_1$-$C_{30}$ heterocyclic group formed by linking of two groups selected from a plurality of $R_3$ groups, iv) a substituted or unsubstituted $C_5$-$C_{30}$ carbocyclic group or a substituted or unsubstituted $C_1$-$C_{30}$ heterocyclic group formed by linking of two groups selected from a plurality of $R_4$ groups, v) a substituted or unsubstituted $C_5$-$C_{30}$ carbocyclic group or a substituted or unsubstituted $C_1$-$C_{30}$ heterocyclic group formed by linking of at least two of $R_1$ to $R_4$, and vi) a substituted or unsubstituted $C_5$-$C_{30}$ carbocyclic group or a substituted or unsubstituted $C_1$-$C_{30}$ heterocyclic group formed by linking of $R_{51}$ and $R_{52}$ may each independently be selected from:

a pentadiene group, a cyclohexane group, a cycloheptane group, an adamantane group, a bicyclo-heptane group, a bicyclo-octane group, a benzene group, a pyridine group, a pyrimidine group, a pyrazine group, a pyridazine group, a naphthalene group, an anthracene group, a tetracene group, a phenanthrene group, a dihydronaphthalene group, a phenalene group, a benzothiophene group, a benzofuran group, an indene group, an indole group, a benzosilole group, an azabenzothiophene group, an azabenzofuran group, an azaindene group, an azaindole group, and an azabenzosilole group; and a pentadiene group, a cyclohexane group, a cycloheptane group, an adamantane group, a bicyclo-heptane group, a bicyclo-octane group, a benzene group, a pyridine group, a pyrimidine group, a pyrazine group, a pyridazine group, a naphthalene group, an anthracene group, a tetracene group, a phenanthrene group, a dihydronaphthalene group, a phenalene group, a benzothiophene group, a benzofuran group, an indene group, an indole group, a benzosilole group, an azabenzothiophene group, an azabenzofuran group, an azaindene group, an azaindole group, and an azabenzosilole group, each substituted with at least one $R_{10a}$, but embodiments are not limited thereto.

$R_{10a}$ may be the same as $R_1$ as described herein.

In the present specification, "an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, and an azadibenzothiophene 5,5-dioxide group" each refer to a hetero ring having an identical backbone as "an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, and a dibenzothiophene 5,5-dioxide group", in which at least one ring-forming carbon atom is substituted with nitrogen, respectively.

In the present specification, unless defined otherwise, * indicates a binding site to an adjacent atom.

In some embodiments, a moiety represented by

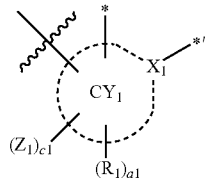

in Formula 1 may be selected from groups represented by Formulae CY1-1 to CY1-15:

CY1-1

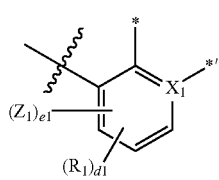

CY1-2

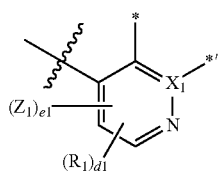

CY1-3

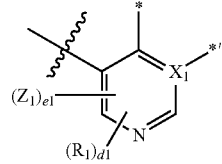

CY1-4

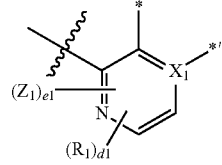

CY1-5

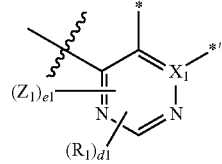

CY1-6

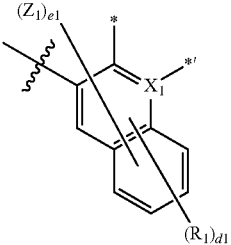

CY1-7

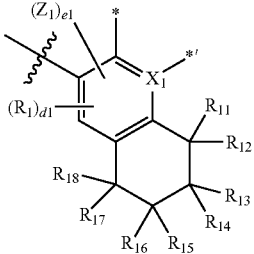

CY1-8

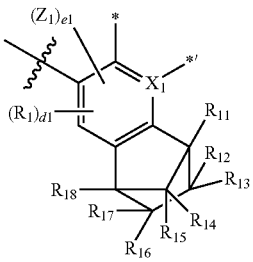

CY1-9

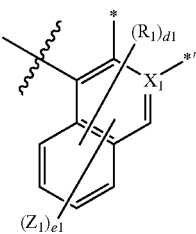

CY1-10
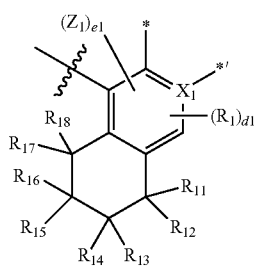

CY1-11
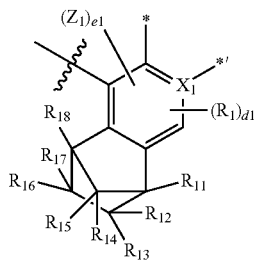

CY1-12
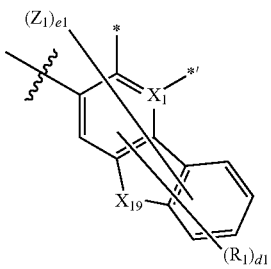

CY1-13
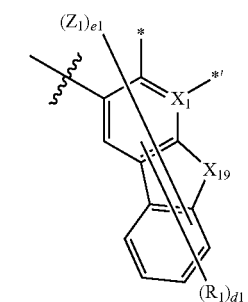

CY1-14
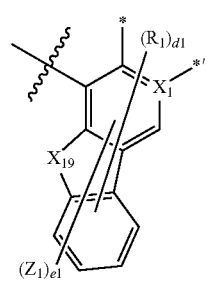

CY1-15
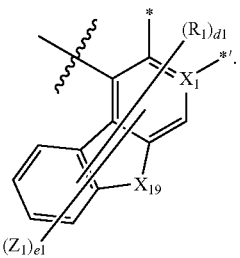

In Formulae CY1-1 to CY1-15, $X_{19}$ may be selected from $C(R_{18})(R_{19})$, $N(R_{18})$, O, S, and $Si(R_{18})(R_{19})$, $Z_1$ and $R_1$ may be the same as those described herein, $R_{11}$ to $R_{19}$ may each be the same as $R_1$ as described herein, d1 and e1 may each independently be an integer from 0 to 2,

*' indicates a binding site to M in Formula 1,

* indicates a binding site to Ti in Formula 1, and

indicates a binding site to $T_4$ in Formula 1.

In one or more embodiments, a group represented by

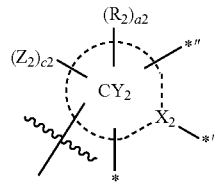

in Formula 1 may be selected from groups represented by Formulae CY2-1 to CY2-6:

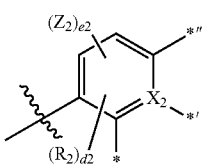
CY2-1

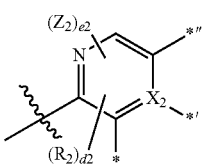
CY2-2

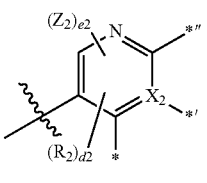
CY2-3

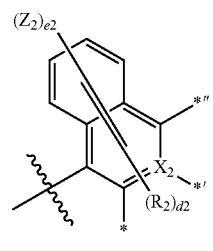
CY2-4

-continued

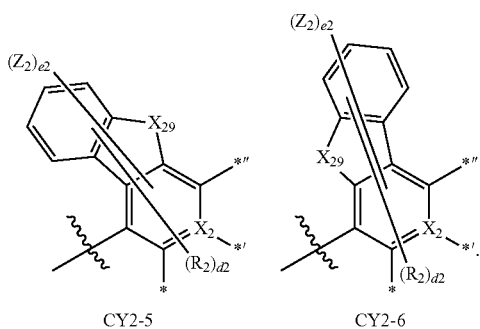

CY2-5   CY2-6

In Formulae CY2-1 to CY2-6, $Z_2$ and $R_2$ may be the same as those described herein, d2 and e2 may each independently be an integer from 0 to 2,

*' indicates a binding site to M in Formula 1,

* indicates a binding site to $T_1$ in Formula 1,

*" indicates a binding site to $T_2$ in Formula 1, and

indicates a binding site to $T_4$ in Formula 1.

In one or more embodiments, a group represented by

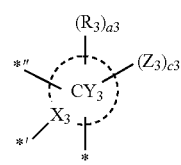

in Formula 1 may be selected from groups represented by Formulae CY3-1 to CY3-12:

CY3-1

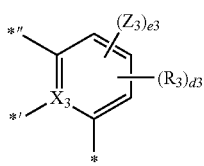

CY3-2

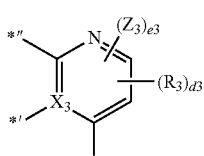

CY3-3

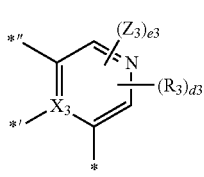

CY3-4

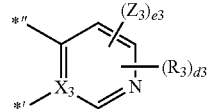

CY3-5

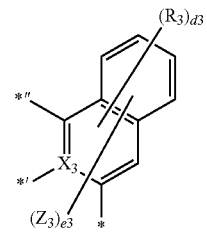

CY3-6

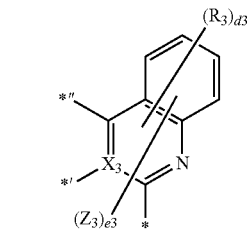

CY3-7

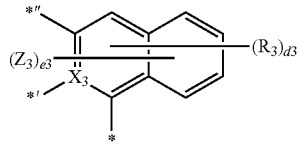

CY3-8

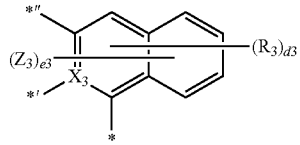

CY3-9

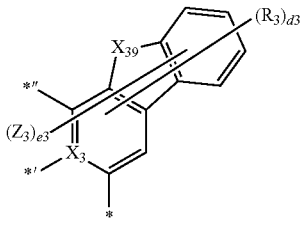

CY3-10

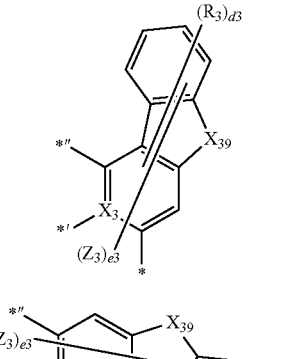

CY-11

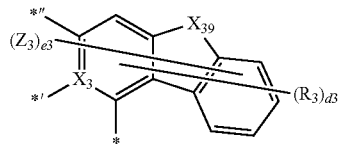

CY3-12

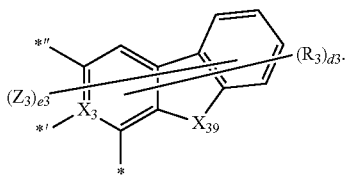

In Formulae CY3-1 to CY3-12, $X_{39}$ may be selected from $C(R_{38})(R_{39})$, $N(R_{38})$, O, S, and $Si(R_{38})(R_{39})$, $Z_3$ and $R_3$ may be the same as those described herein, $R_{38}$ and $R_{39}$ may each be the same as $R_3$ as described herein, d3 and e3 may each independently be an integer from 0 to 2,

*' indicates a binding site to M in Formula 1,

* indicates a binding site to $T_3$ in Formula 1, and

*" indicates a binding site to $T_2$ in Formula 1.

In one or more embodiments, a group represented by

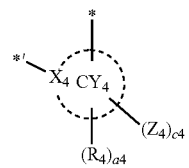

in Formula 1 may be selected from groups represented by Formulae CY4-1 to CY4-26:

CY4-1

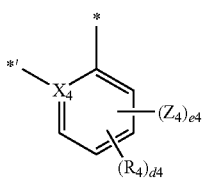

CY4-2

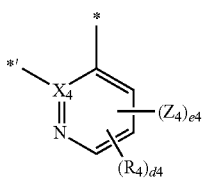

CY4-3

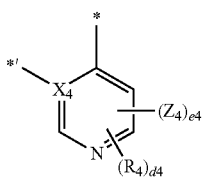

CY4-4

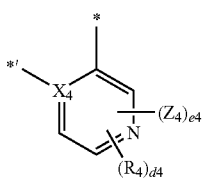

CY4-5

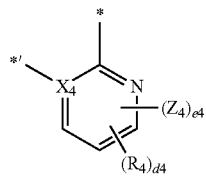

CY4-6

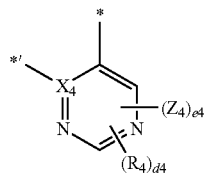

CY4-7

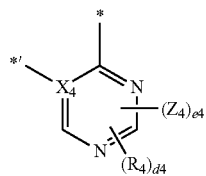

CY4-8

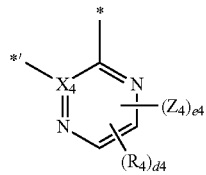

CY4-9

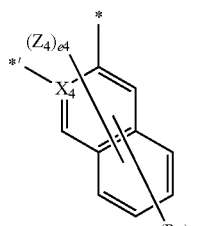

CY4-10

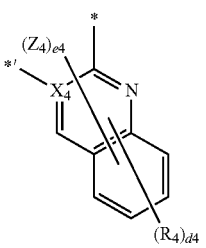

CY4-11

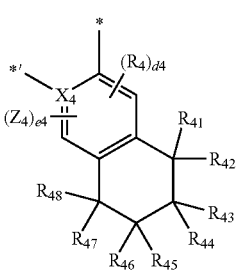

CY4-12
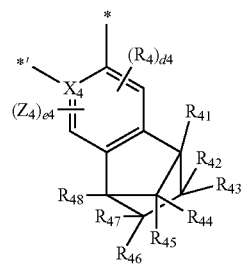
CY4-13
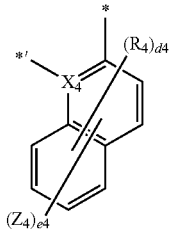
CY4-14
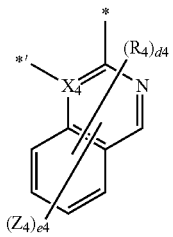
CY4-15
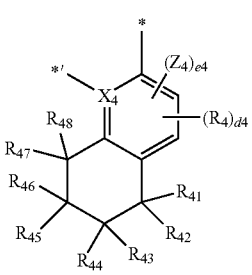
CY4-16
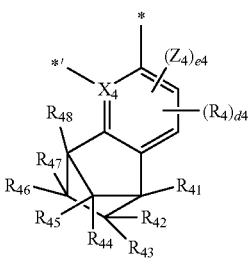
CY4-17
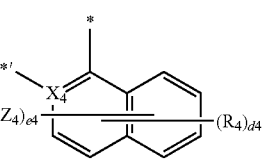
CY4-18
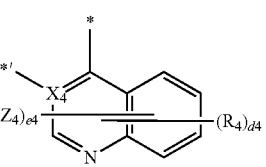
CY4-19
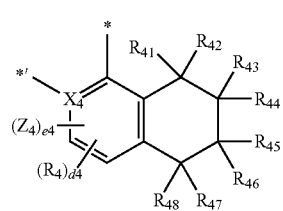
CY4-20
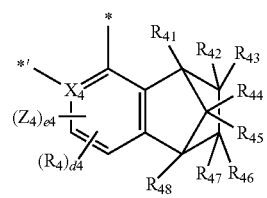
CY4-21
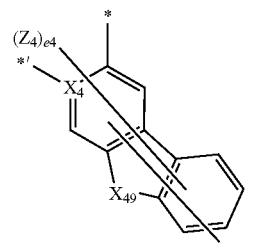
CY4-22
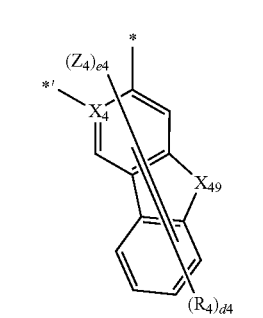
CY4-23
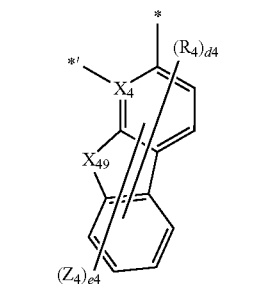
CY4-24
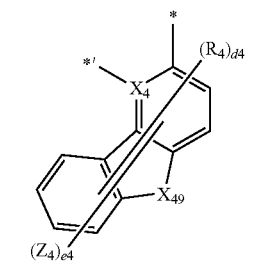

-continued

CY4-25

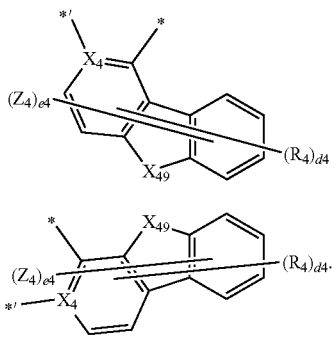

CY4-26

In Formulae CY4-1 to CY4-26, $X_{49}$ may be selected from $C(R_{48})(R_{49})$, $N(R_{48})$, O, S, and $Si(R_{48})(R_{49})$, $Z_4$ and $R_4$ may be the same as those described herein, $R_{41}$ to $R_{49}$ may each be the same as $R_4$ as described herein, d4 and e4 may each independently be an integer from 0 to 2,

*' indicates a binding site to M in Formula 1, and

* indicates a binding site to $T_3$ in Formula 1.

In one or more embodiments, in Formula 1, a group represented by

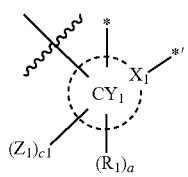

may be selected from groups represented by Formulae CY1-1 to CY1-15, a group represented by

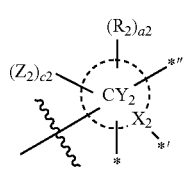

may be selected from groups represented by Formulae CY2-1 to CY2-6, a group represented by

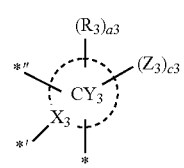

may be selected from groups represented by Formulae CY3-1 to CY3-12, a group represented by

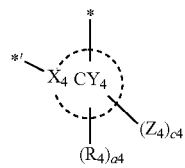

may be selected from groups represented by Formulae CY4-1 to CY4-26, and a sum of e1, e2, e3, and e4 may be 1, 2, or 3 (for example, e4 may be 1).

In one or more embodiments, a group represented by

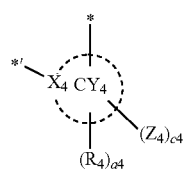

Formula 1 may be a group represented by Formula CY4(1):

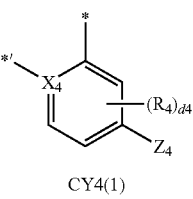

CY4(1)

wherein, in Formula CY4(1), $Z_4$ and $R_4$ may be the same as those described herein, d4 may be an integer from 0 to 2,

*' indicates a binding site to M in Formula 1, and

* indicates a binding site to $T_3$ in Formula 1.

In some embodiments, the organometallic compound represented by Formula 1 may be selected from Compounds 1 to 40, but embodiments are not limited thereto:

1

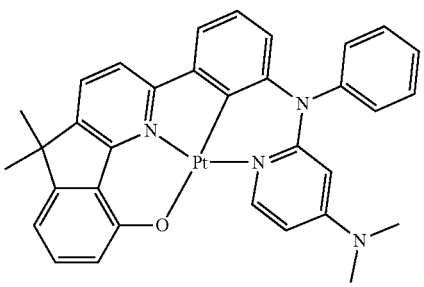

2
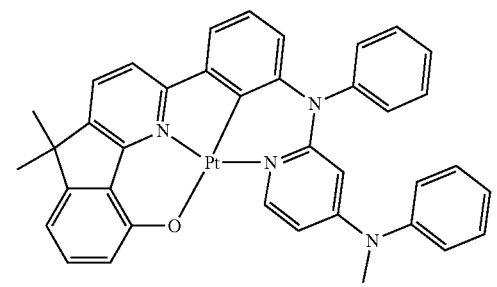
3
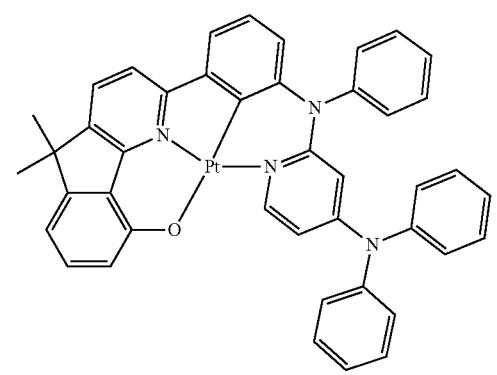
4
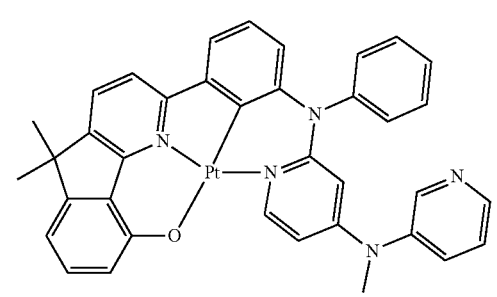
5
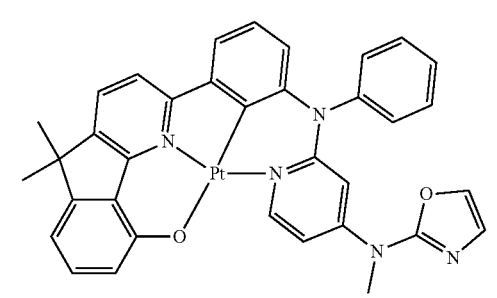
6
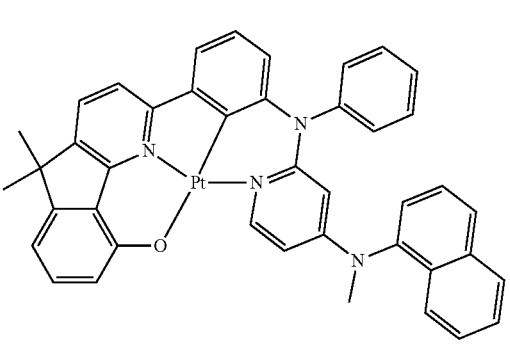
7
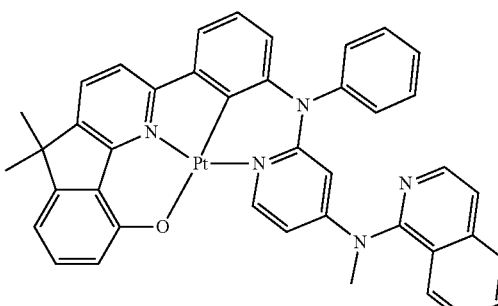
8
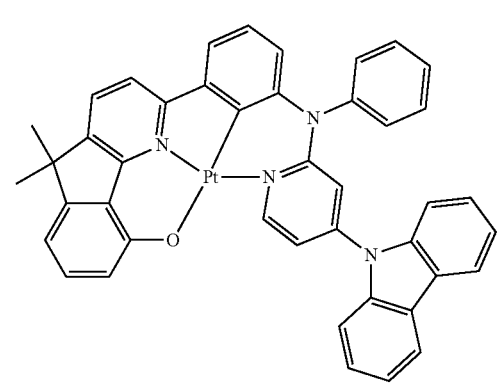
9
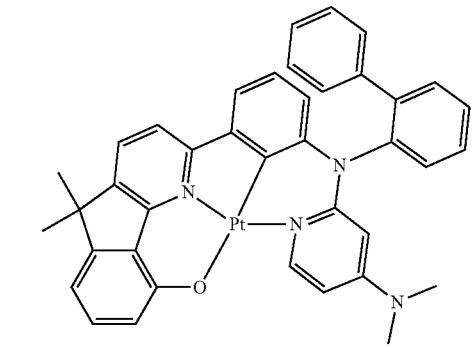
10
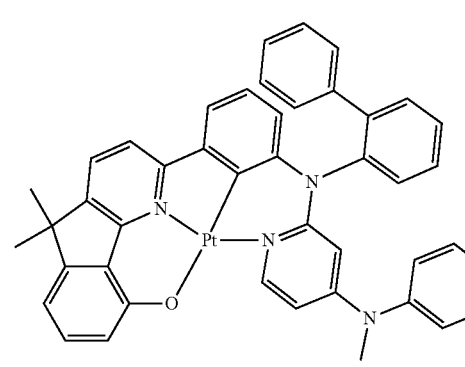

11
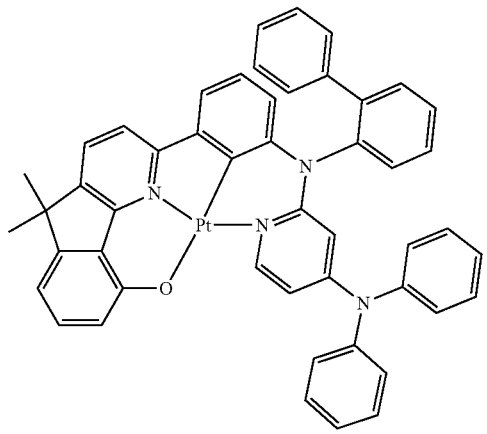
12
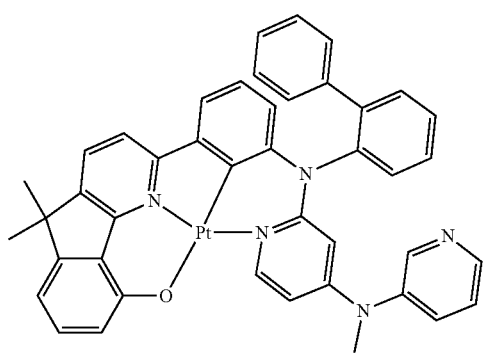
13
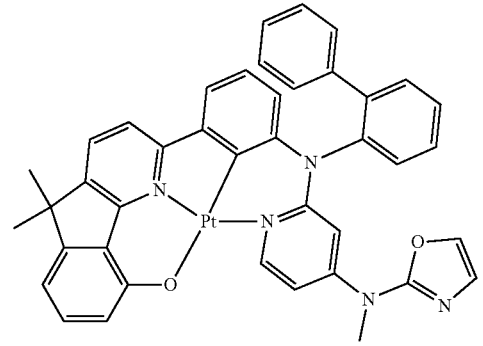
14
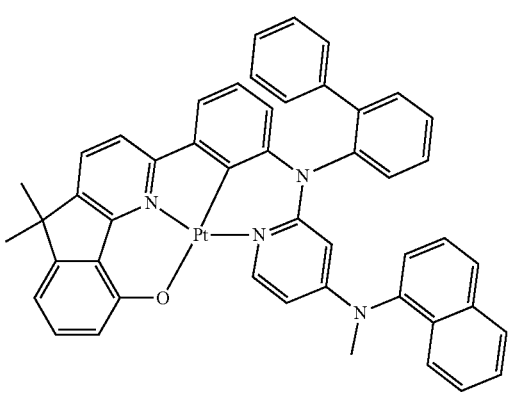
15
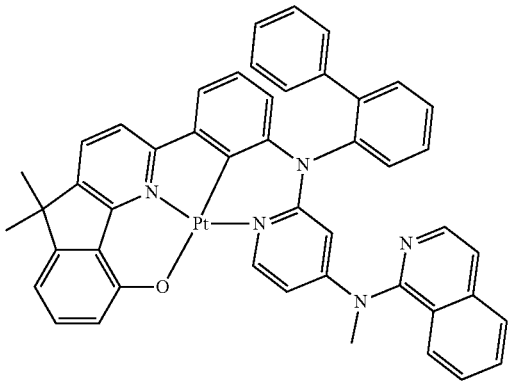
16
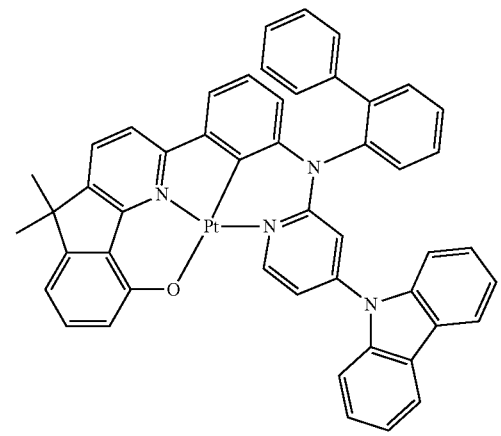
17
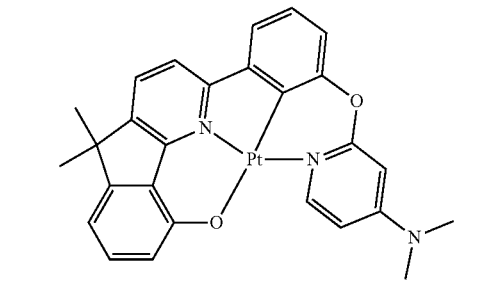
18
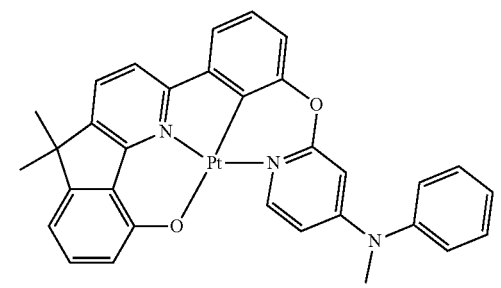

19
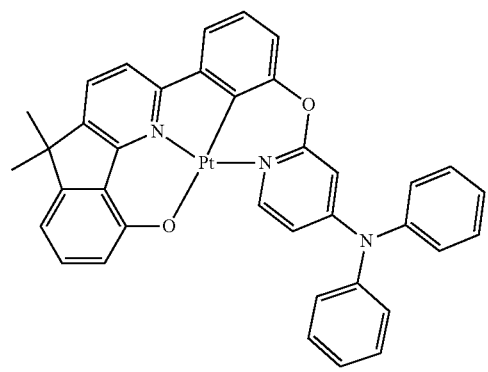
20
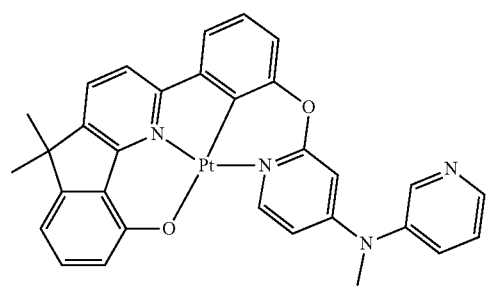
21
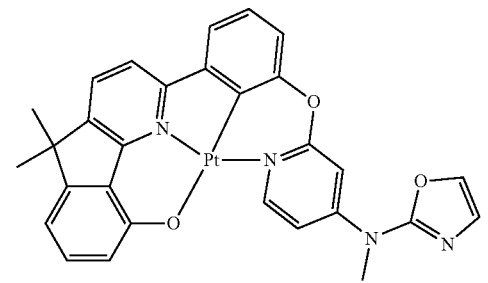
22
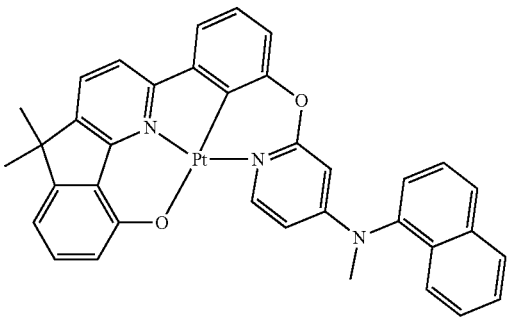
23
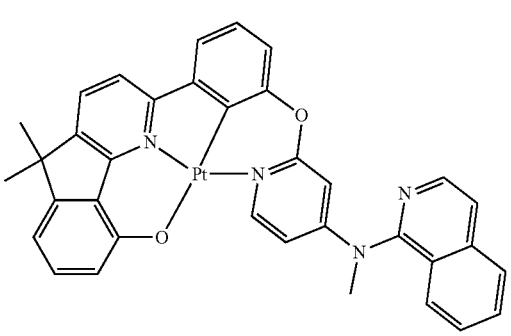
24
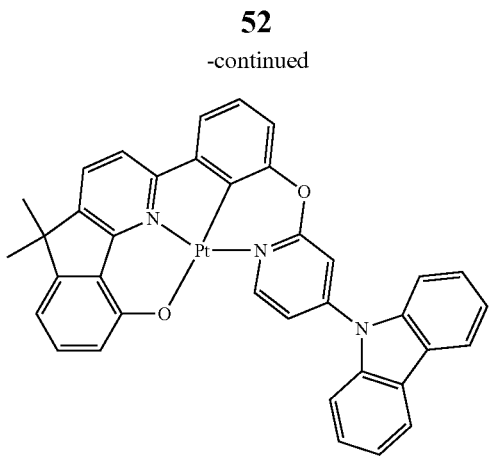
25
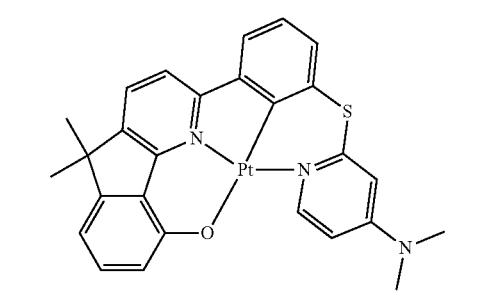
26
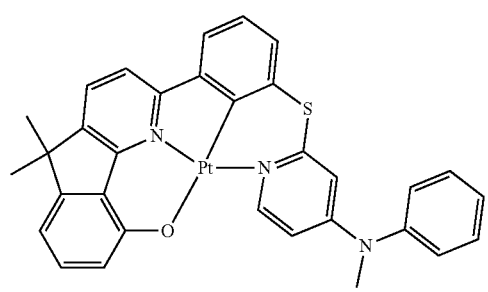
27
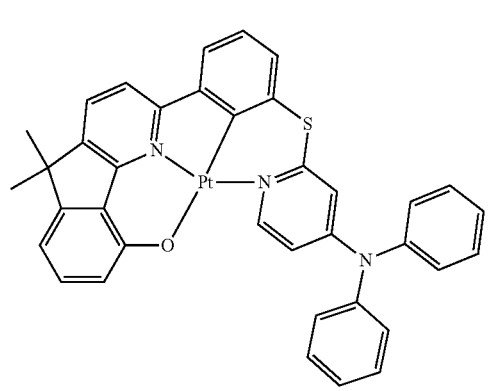
28
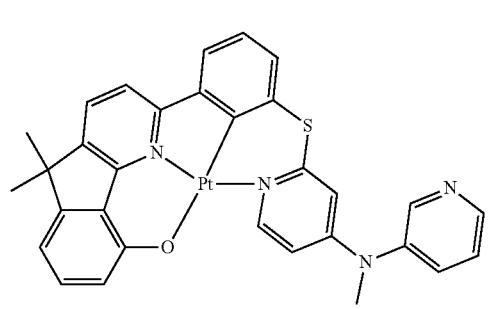

29
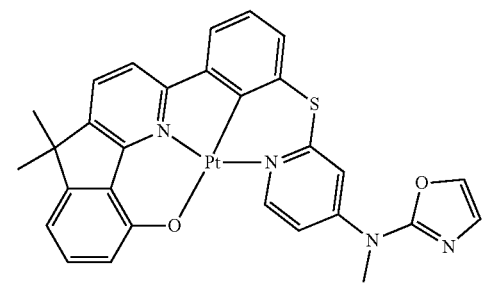
30
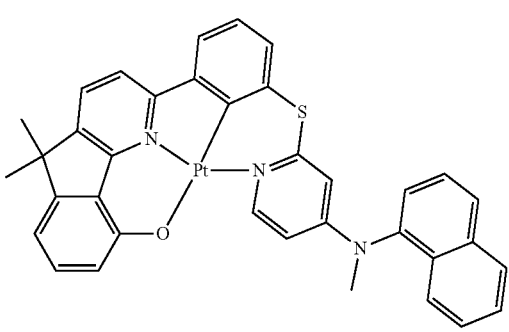
31
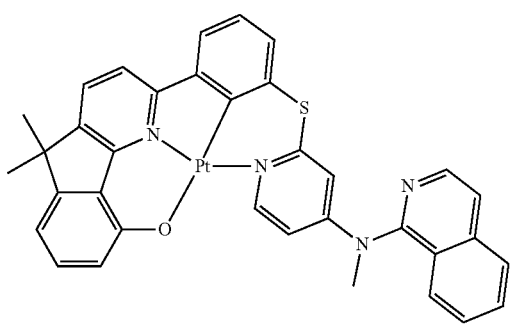
32
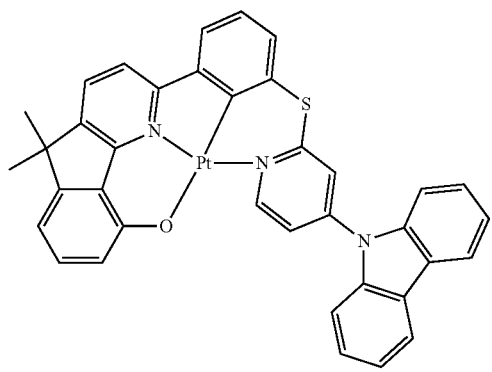
33
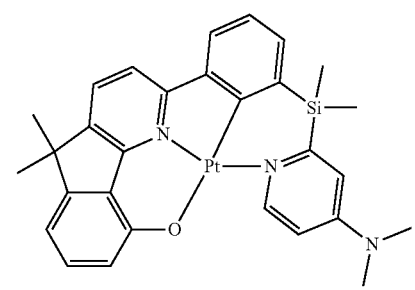
34
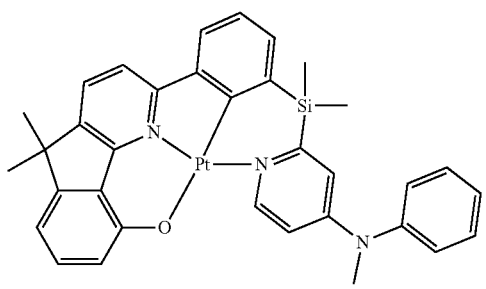
35
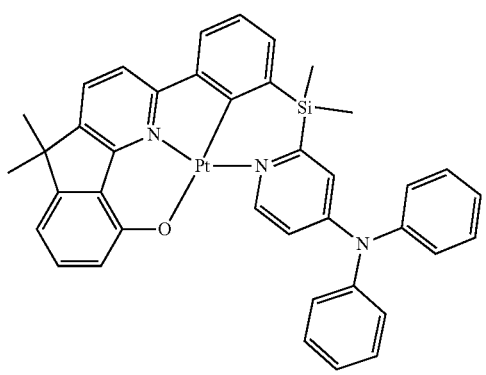
36
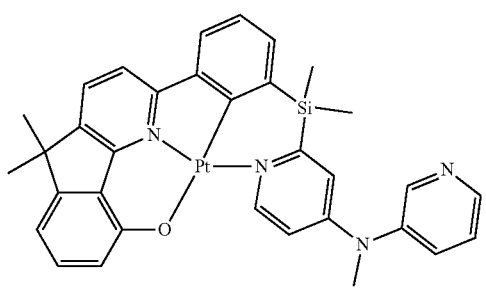
37
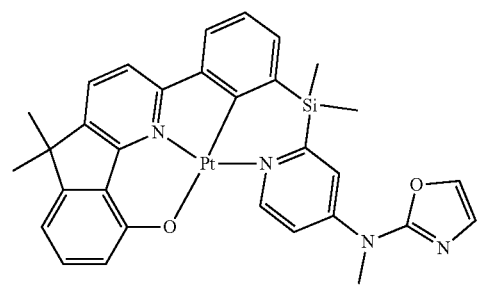
38
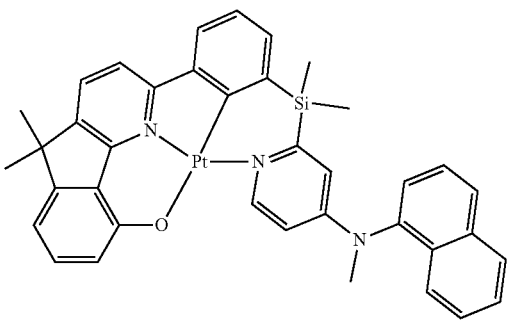

-continued

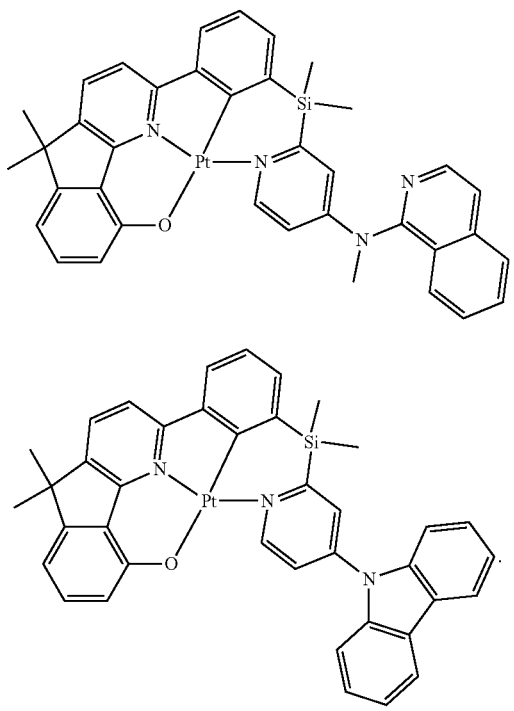

39

40

In Formula 1, $Z_1$ to $Z_4$ may each be a group represented by *—N(R$_{51}$)(R$_{52}$), and a sum of c1 to c4 may be 1 or greater. In other words, Formula 1 may include at least one group represented by *—N(R$_{51}$)(R$_{52}$). Thus, a radiative decay rate constant may increase, which may result in a decrease in decay time.

In addition, as ring $CY_1$ may be bound to $CY_2$ via $T_4$ in Formula 1, rigidity of a luminophore of Formula 1 may increase, which may facilitate control of vibronic progression of the luminophore. Accordingly, a full width at half maximum (FWHM) in an emission spectrum of the organometallic compound represented by Formula 1 may decrease.

Thus, an organic light-emitting device employing the organometallic compound represented by Formula 1 may have excellent efficiency and low roll-off.

For example, the highest occupied molecular orbital (HOMO), lowest unoccupied molecular orbital (LUMO), and maximum emission wavelength of Compounds 1, 3, and 9 were evaluated by using a Gaussian according to a density functional theory (DFT) method (structure optimization was performed at a degree of B3LYP, and 6-31G(d,p)). The results thereof are shown in Table 1.

TABLE 1

| Compound No. | HOMO (eV) | LUMO (eV) | Maximum emission wavelength (nm) |
|---|---|---|---|
| 1 | −5.22 | −1.43 | 526 |
| 3 | −5.23 | −1.45 | 520 |
| 9 | −5.20 | −1.41 | 526 |

Referring to the results of Table 1, the organometallic compound of Formula 1 was found to have suitable electrical characteristics for use as a dopant in an electronic device, e.g., an organic light-emitting device.

A method of synthesizing the organometallic compound represented by Formula 1 may be apparent to one of ordinary skill in the art by referring to Synthesis Examples provided herein.

The organometallic compound represented by Formula 1 may be suitable for use in an organic layer of an organic light-emitting device, e.g., as a dopant in an emission layer of the organic layer. Thus, according to another aspect of the present disclosure, there is provided an organic light-emitting device that may include:
a first electrode;
a second electrode; and
an organic layer disposed between the first electrode and the second electrode,
wherein the organic layer includes an emission layer and at least one organometallic compound represented by Formula 1.

Since the organic light-emitting device has an organic layer including the organometallic compound represented by Formula 1, the organic light-emitting device may have a low driving voltage, high luminescence efficiency, high power, high quantum luminescence efficiency, long lifespan, low roll-off, and excellent color purity.

The organometallic compound represented by Formula 1 may be used in a pair of electrodes of an organic light-emitting device. For example, the organometallic compound represented by Formula 1 may be included in the emission layer. In this embodiment, the organometallic compound may serve as a dopant and the emission layer may further include a host (that is, an amount of the organometallic compound represented by Formula 1 may be smaller than that of the host).

As used herein, "(for example, the organic layer) including at least one organometallic compound" means that "(the organic layer) including an organometallic compound of Formula 1, or at least two different organometallic compounds of Formula 1".

For example, Compound 1 may only be included in the organic layer as an organometallic compound. In this embodiment, Compound 1 may be included in the emission layer of the organic light-emitting device. In some embodiments, Compounds 1 and 2 may be included in the organic layer as organometallic compounds. In these embodiments, Compounds 1 and 2 may both be included in the same layer (for example, both Compounds 1 and 2 may be included in the emission layer).

The first electrode may be an anode, which is a hole injection electrode, and the second electrode may be a cathode, which is an electron injection electrode. In some embodiments, the first electrode may be a cathode, which is an electron injection electrode, and the second electrode may be an anode, which is a hole injection electrode.

For example, in the organic light-emitting device, the first electrode may be an anode, the second electrode may be a cathode, and the organic layer may further include a hole transport region disposed between the first electrode and the emission layer and an electron transport region disposed between the emission layer and the second electrode, wherein the hole transport region may include a hole injection layer, a hole transport layer, an electron blocking layer, or a combination thereof, and wherein the electron transport region may include a hole blocking layer, an electron transport layer, an electron injection layer, or a combination thereof.

The term "organic layer" as used herein refers to a single and/or a plurality of layers disposed between the first electrode and the second electrode in an organic light-emitting device. The "organic layer" may include not only organic compounds but also organometallic complexes including metals.

THE FIGURE illustrates a schematic cross-sectional view of an organic light-emitting device 10 according to an embodiment. Hereinafter, a structure of an organic light-emitting device according to one or more embodiments and a method of manufacturing the organic light-emitting device will be described with reference to the FIGURE. The organic light-emitting device 10 may include a first electrode 11, an organic layer 15, and a second electrode 19, which may be sequentially layered in this stated order.

A substrate may be additionally disposed under the first electrode 11 or on the second electrode 19. The substrate may be a conventional substrate used in organic light-emitting devices, e.g., a glass substrate or a transparent plastic substrate, each having excellent mechanical strength, thermal stability, transparency, surface smoothness, ease of handling, and water repellency.

The first electrode 11 may be formed by vacuum-depositing or sputtering, onto the substrate, a material for forming the first electrode 11. The first electrode 11 may be an anode. The material for forming the first electrode 11 may be selected from materials with a high work function for easy hole injection. The first electrode 11 may be a reflective electrode, a semi-transmissive electrode, or a transmissive electrode. The material for forming the first electrode 11 may be selected from indium tin oxide (ITO), indium zinc oxide (IZO), tin oxide ($SnO_2$), and zinc oxide (ZnO). In some embodiments, the material for forming the first electrode 11 may be a metal, such as magnesium (Mg), aluminum (Al), aluminum-lithium (Al—Li), calcium (Ca), magnesium-indium (Mg—In), or magnesium-silver (Mg—Ag).

The first electrode 11 may have a single-layered structure or a multi-layered structure including a plurality of layers. In some embodiments, the first electrode 11 may have a triple-layered structure of ITO/Ag/ITO, but embodiments are not limited thereto.

The organic layer 15 may be on the first electrode 11.

The organic layer 15 may include a hole transport region, an emission layer, and an electron transport region.

The hole transport region may be disposed between the first electrode 11 and the emission layer.

The hole transport region may include a hole injection layer, a hole transport layer, an electron blocking layer, a buffer layer, or a combination thereof.

The hole transport region may include a hole injection layer only or a hole transport layer only. In some embodiments, the hole transport region may include a hole injection layer and a hole transport layer which are sequentially stacked on the first electrode 11. In some embodiments, the hole transport region may include a hole injection layer, a hole transport layer, and an electron blocking layer, which are sequentially stacked on the first electrode 11.

When the hole transport region includes a hole injection layer, the hole injection layer may be formed on the first electrode 11 by using one or more suitable methods, such as vacuum deposition, spin coating, casting, and Langmuir-Blodgett (LB) deposition.

When a hole injection layer is formed by vacuum-deposition, for example, the vacuum deposition may be performed at a temperature in a range of about 100° C. to about 500° C., at a vacuum degree in a range of about $10^{-8}$ torr to about $10^{-3}$ torr, and at a rate in a range of about 0.01 Angstroms per second (Å/sec) to about 100 Å/sec, though the conditions may vary depending on a compound used as a hole injection material and a structure and thermal properties of a desired hole injection layer, but embodiments are not limited thereto.

When a hole injection layer is formed by spin coating, the spin coating may be performed at a rate in a range of about 2,000 revolutions per minute (rpm) to about 5,000 rpm and at a temperature in a range of about 80° C. to 200° C. to facilitate removal of a solvent after the spin coating, although the conditions may vary depending on a compound used as a hole injection material and a structure and thermal properties of a desired hole injection layer, but embodiments are not limited thereto.

The conditions for forming a hole transport layer and an electron blocking layer may be inferred from the conditions for forming the hole injection layer.

The hole transport region may include at least one selected from m-MTDATA, TDATA, 2-TNATA, NPB, β-NPB, TPD, spiro-TPD, spiro-NPB, methylated-NPB, TAPC, HMTPD, 4,4',4"-tris(N-carbazolyl)triphenylamine (TCTA), polyaniline/dodecylbenzene sulfonic acid (PANI/DBSA), poly(3,4-ethylenedioxythiophene)/poly(4-styrene sulfonate) (PEDOT/PSS), polyaniline/camphor sulfonic acid (PANI/CSA), (polyaniline)/poly(4-styrene sulfonate) (PANI/PSS), a compound represented by Formula 201, and a compound represented by Formula 202:

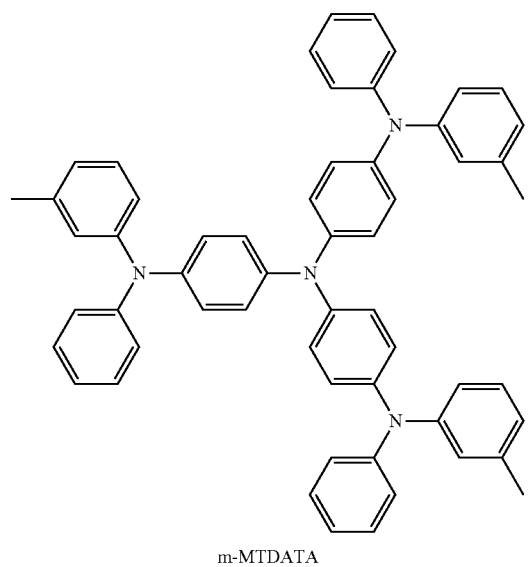

m-MTDATA

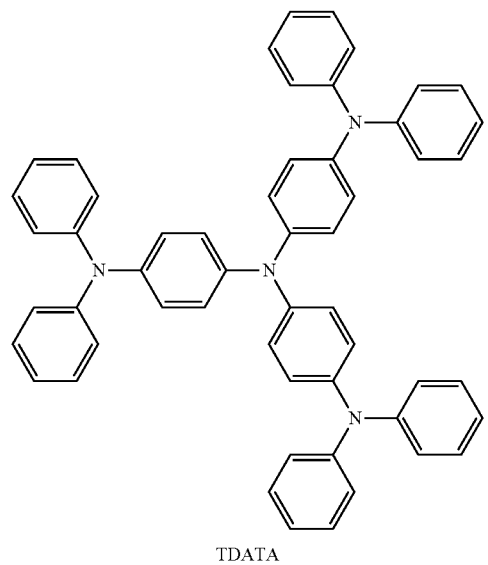

TDATA

-continued
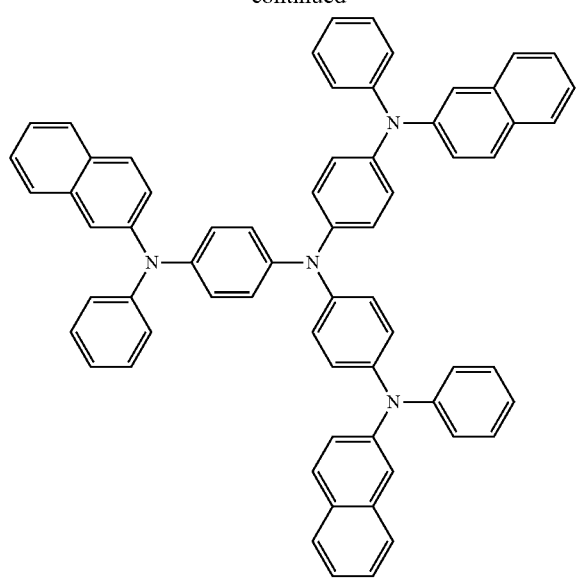
2-TNATA
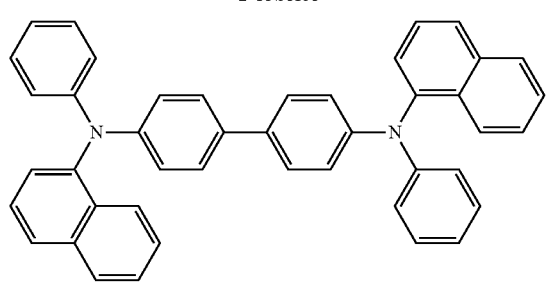
NPB
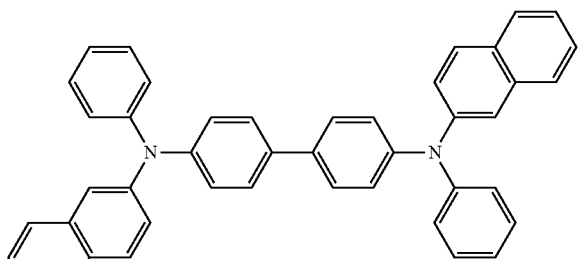
β-NPB
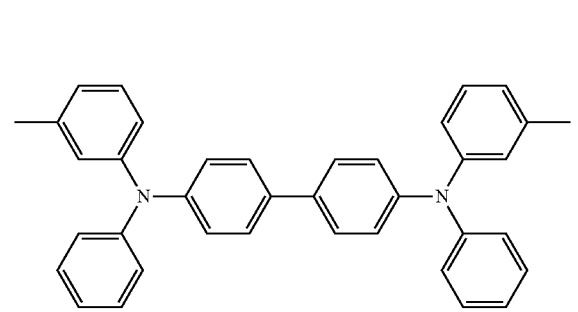
TPD
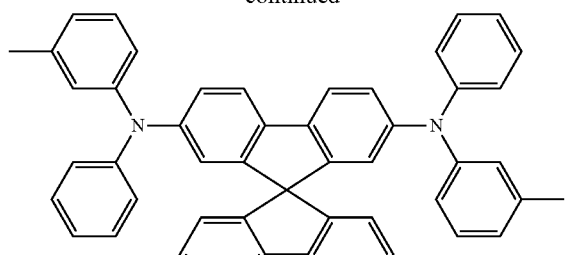
Spiro-TPD
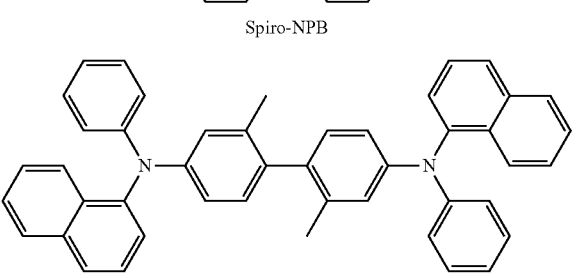
Spiro-NPB
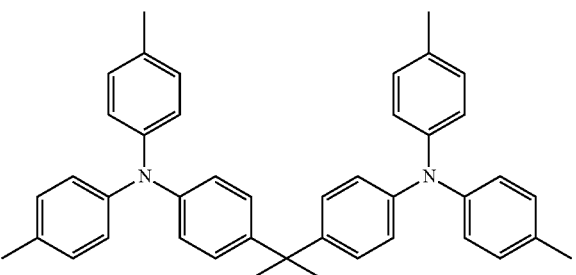
methylated NPB
TAPC
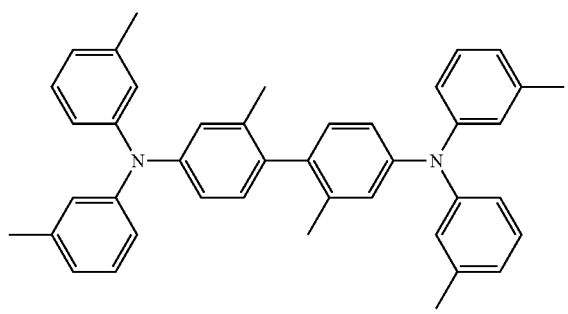
HMTPD Formula 201

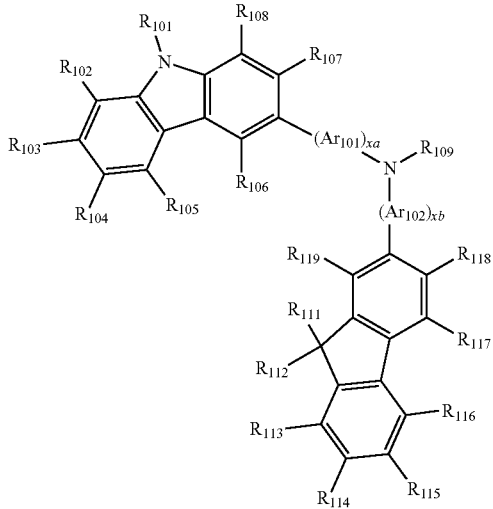

Formula 202

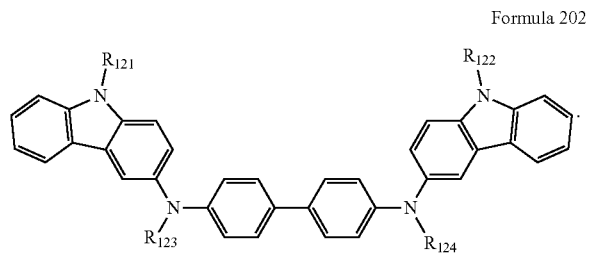

In Formula 201, $Ar_{101}$ and $Ar_{102}$ may each independently be selected from a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group; and a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

In Formula 201, xa and xb may each independently be an integer from 0 to 5. In some embodiments, xa and xb may each independently be an integer selected from 0, 1, and 2. In some embodiments, xa may be 1, and xb may be 0, but embodiments are not limited thereto.

In Formulae 201 and 202, $R_{101}$ to $R_{108}$, $R_{111}$ to $R_{119}$, and $R_{121}$ to $R_{124}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (e.g., a methyl group, an ethyl group, a propyl group, a butyl group, pentyl group, or a hexyl group), and a $C_1$-$C_{10}$ alkoxy group (e.g., a methoxy group, an ethoxy group, a propoxy group, a butoxy group, or a pentoxy group);

a $C_1$-$C_{10}$ alkyl group and a $C_1$-$C_{10}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a phenyl group, a naphthyl group, an anthracenyl group, a fluorenyl group, and a pyrenyl group; and a phenyl group, a naphthyl group, an anthracenyl group, a fluorenyl group, and a pyrenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, and a $C_1$-$C_{10}$ alkoxy group, but embodiments are not limited thereto.

In Formula 201, $R_{109}$ may be selected from a phenyl group, a naphthyl group, an anthracenyl group, and a pyridinyl group; and a phenyl group, a naphthyl group, an anthracenyl group, and a pyridinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, and a pyridinyl group.

In some embodiments, the compound represented by Formula 201 may be represented by Formula 201A, but embodiments are not limited thereto:

Formula 201A
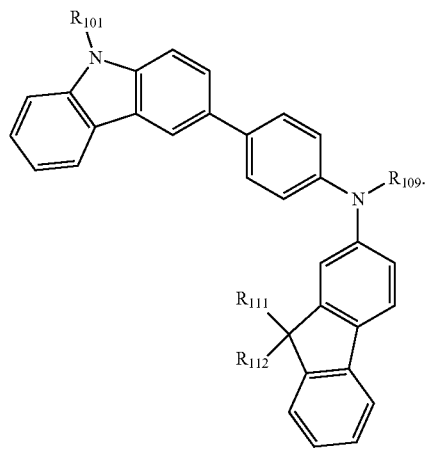
$R_{101}$, $R_{111}$, $R_{112}$, and $R_{109}$ in Formula 201A may be the same as those described above.
In some embodiments, the compounds represented by Formulae 201 and 202 may include Compounds HT1 to HT20, but embodiments are not limited thereto:
HT1
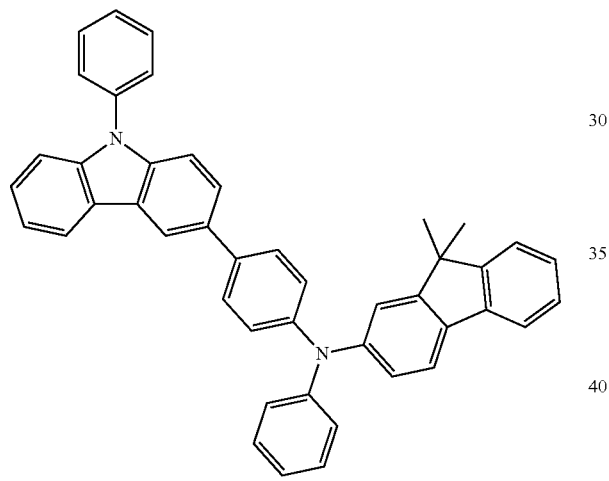
HT2
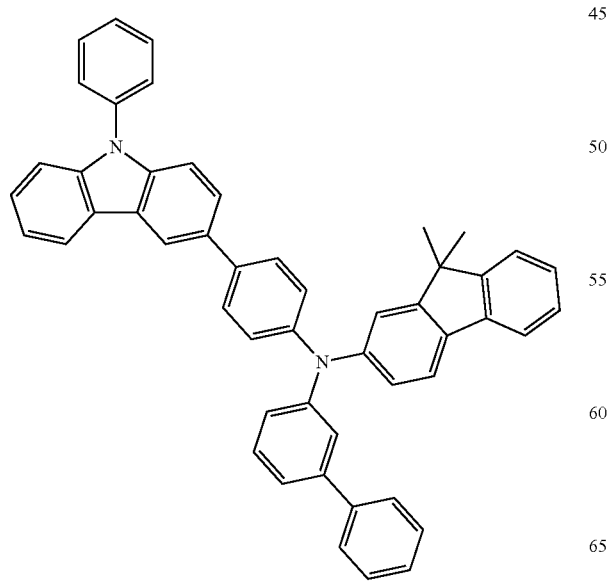
HT3
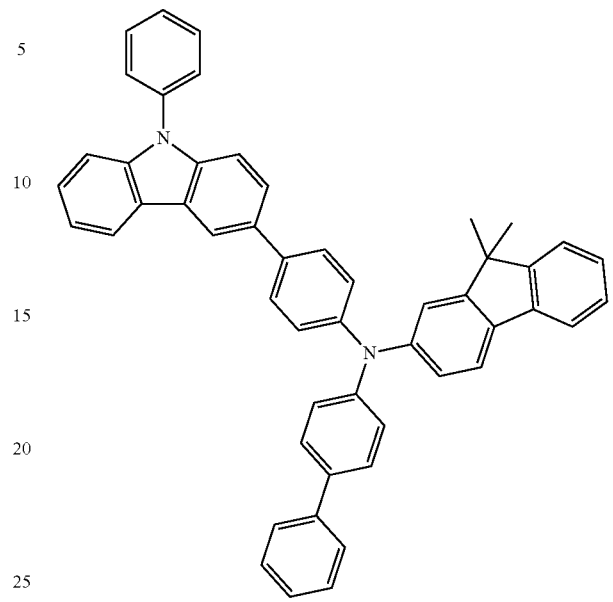
HT4
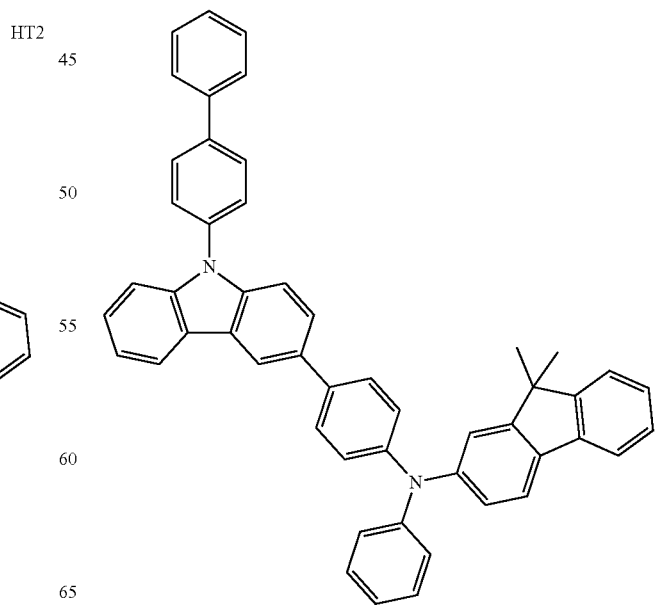

HT5
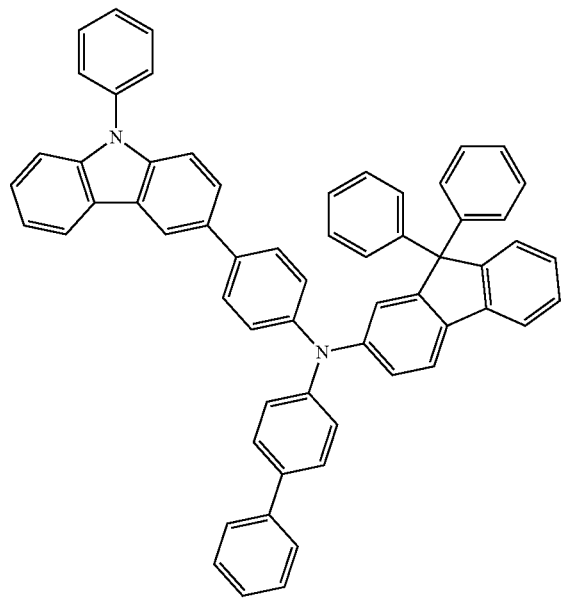
HT6
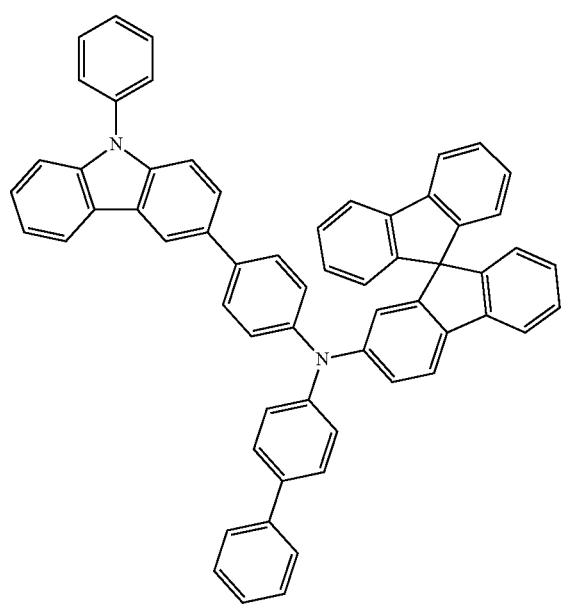
HT7
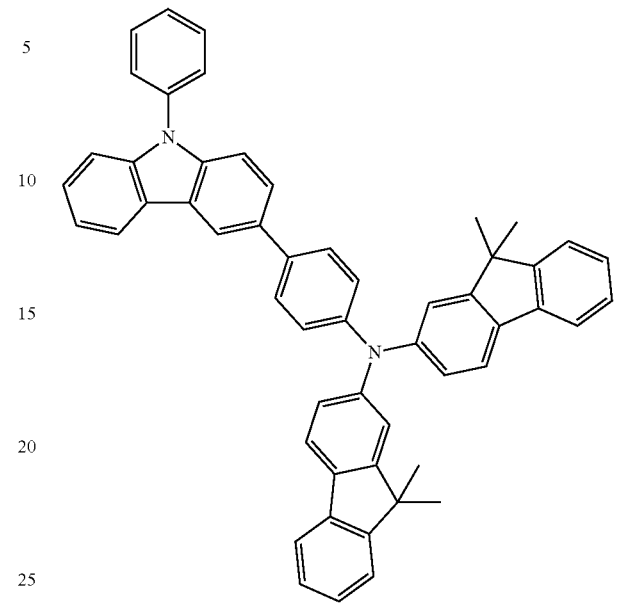
HT8
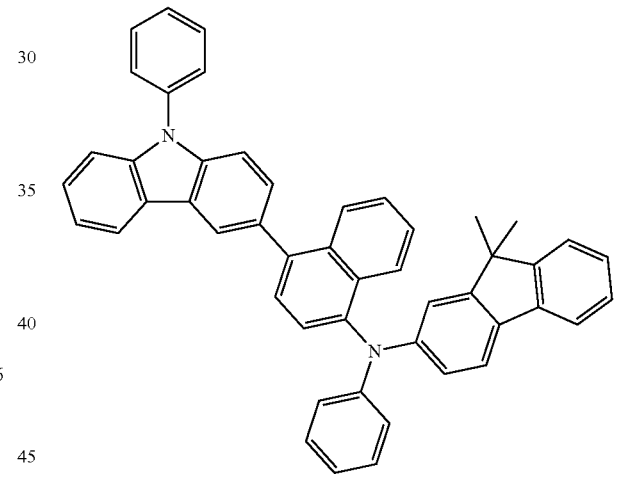
HT9

HT10
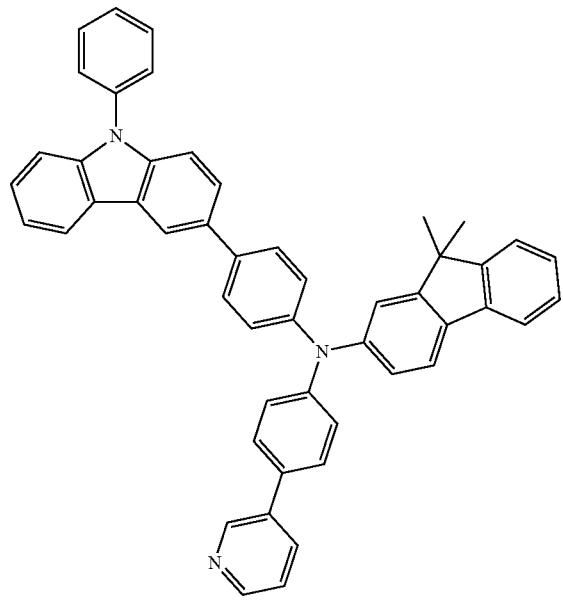
HT11
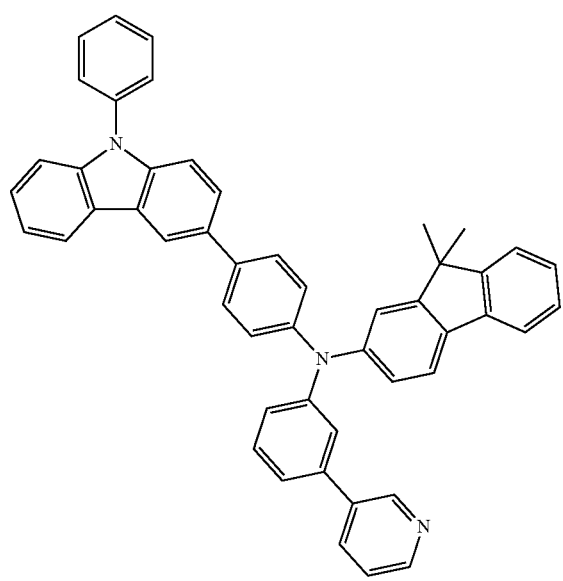
HT12
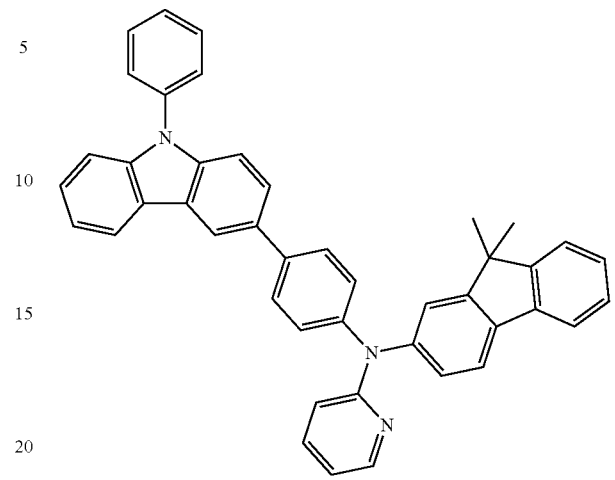
HT13
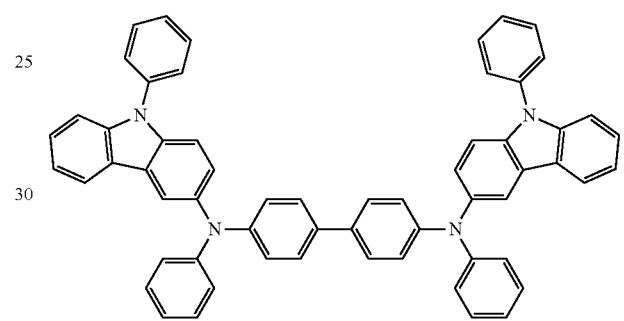
HT14
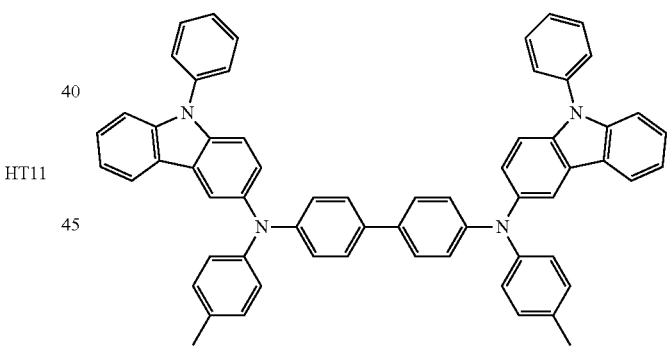
HT15
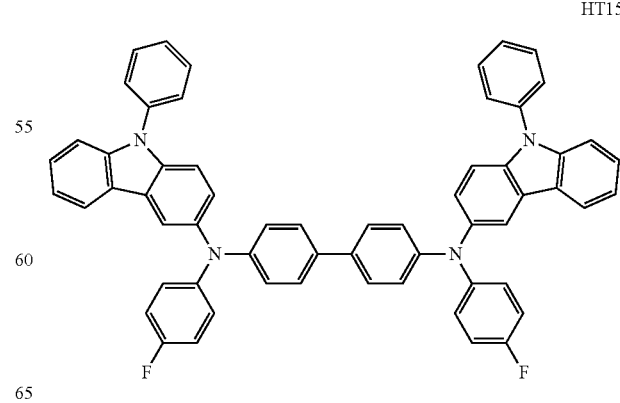

-continued

HT16

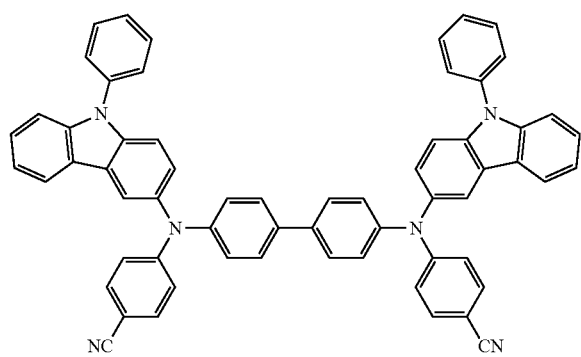

HT17

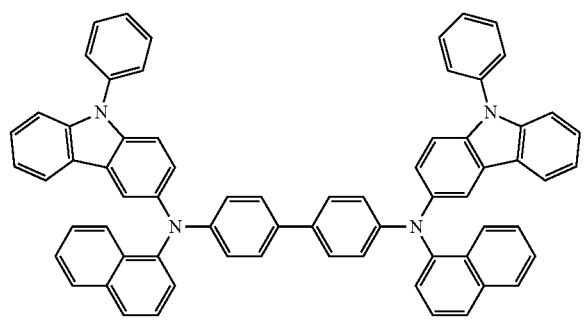

HT18

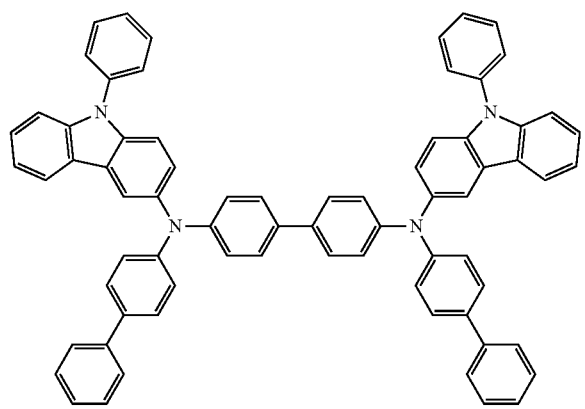

HT19

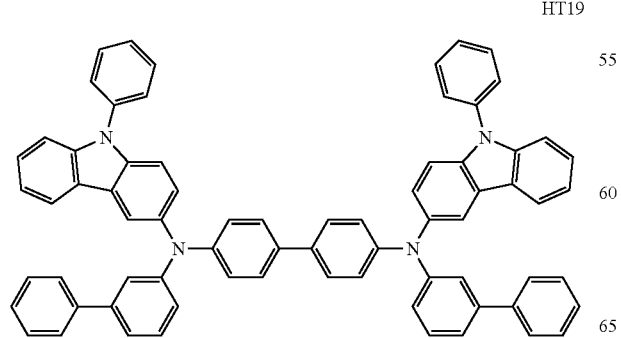

-continued

HT20

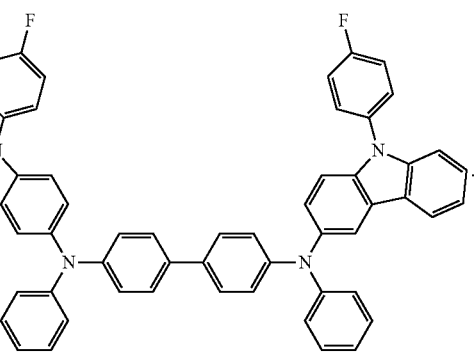

The thickness of the hole transport region may be in a range of about 100 Angstroms (Å) to about 10,000 Å, for example, about 100 Å to about 1,000 Å. When the hole transport region includes at least one selected from a hole injection layer and a hole transport layer, the thickness of the hole injection layer may be in a range of about 100 Å to about 10,000 Å, for example, about 100 Å to about 1,000 Å, the thickness of the hole transport layer may be in a range of about 50 Å to about 2,000 Å, for example, about 100 Å to about 1,500 Å. While not wishing to be bound by theory, it is understood that when the thicknesses of the hole transport region, the hole injection layer, and the hole transport layer are within any of these ranges, excellent hole transport characteristics may be obtained without a substantial increase in driving voltage.

The hole transport region may include a charge generating material as well as the aforementioned materials, to improve conductive properties of the hole transport region. The charge generating material may be substantially homogeneously or non-homogeneously dispersed in the hole transport region.

The charge generating material may include, for example, a p-dopant. The p-dopant may include one of a quinone derivative, a metal oxide, and a compound containing a cyano group, but embodiments are not limited thereto. For example, non-limiting examples of the p-dopant include a quinone derivative, such as tetracyanoquinodimethane (TCNQ) or 2,3,5,6-tetrafluoro-tetracyano-1,4-benzoquinonedimethane (F4-TCNQ); a metal oxide, such as a tungsten oxide or a molybdenum oxide; and a compound containing a cyano group, such as Compound HT-D1, but embodiments are not limited thereto:

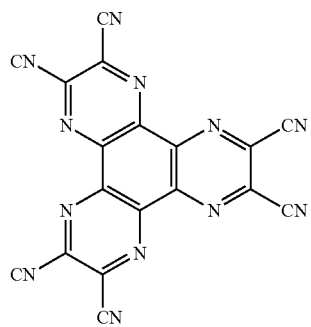

HT-D1

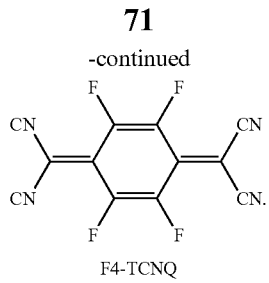

F4-TCNQ

The hole transport region may further include a buffer layer.

The buffer layer may compensate for an optical resonance distance depending on a wavelength of light emitted from the emission layer to improve the efficiency of an organic light-emitting device.

An emission layer may be formed on the hole transport region by using one or more suitable methods, such as vacuum deposition, spin coating, casting, or LB deposition. When the emission layer is formed by vacuum deposition or spin coating, vacuum deposition and coating conditions for forming the emission layer may be generally similar to the those conditions for forming a hole injection layer, though the conditions may vary depending on a compound that is used.

When the hole transport region includes an electron blocking layer, a material for forming the electron blocking layer may be selected from the materials for forming a hole transport region and host materials described herein, but embodiments are not limited thereto. In some embodiments, when the hole transport region includes an electron blocking layer, mCP described herein may be used for forming the electron blocking layer.

The emission layer may include a host and a dopant, and the dopant may include the organometallic compound represented by Formula 1.

The host may include at least one selected from TPBi, TBADN, ADN (also known as "DNA"), CBP, CDBP, TCP, mCP, and Compounds H50 and H51:

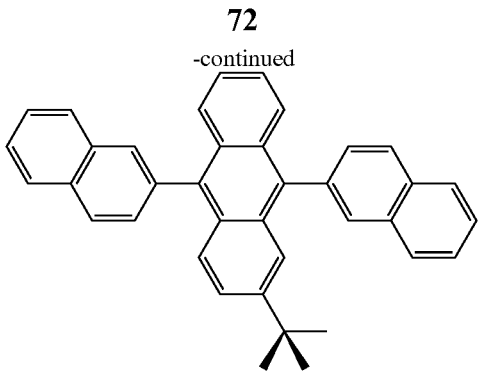

TBADN

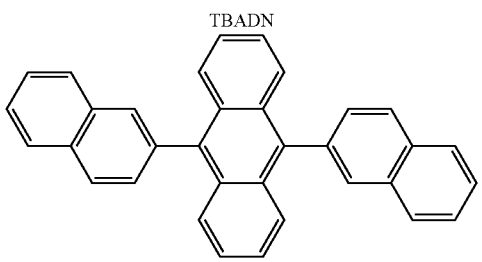

ADN

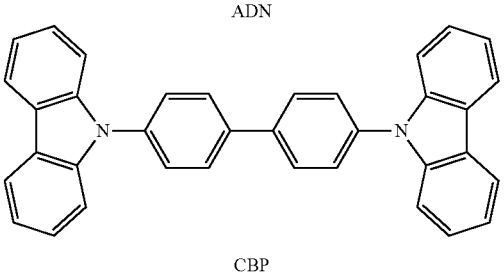

CBP

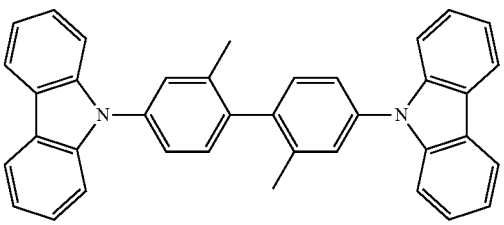

CDBP

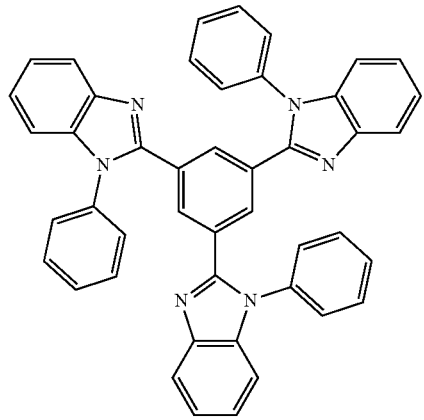

TPBi

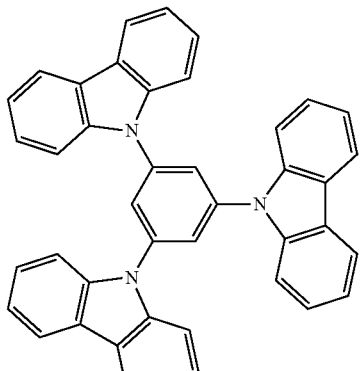

TCP

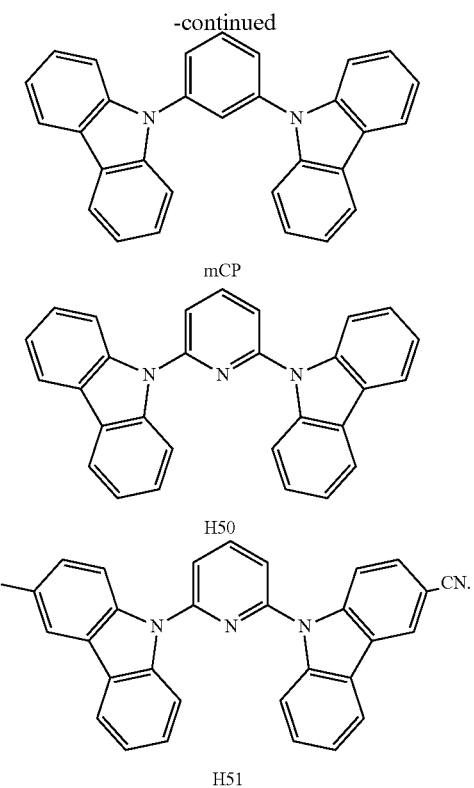

mCP

H50

H51

In some embodiments, the host may further include a compound represented by Formula 301:

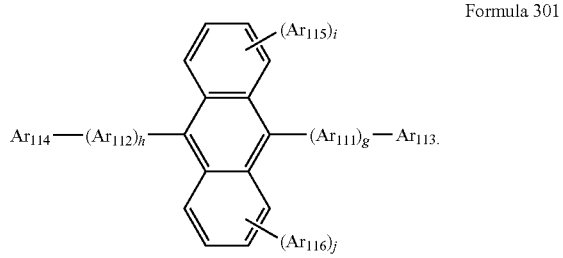

Formula 301

In Formula 301, $Ar_{111}$ and $Ar_{112}$ may each independently be selected from a phenylene group, a naphthylene group, a phenanthrenylene group, and a pyrenylene group; and a phenyl group, a phenylene group substituted with at least one selected from a naphthyl group and an anthracenyl group, a naphthylene group, a phenanthrenylene group, and a pyrenylene group.

In Formula 301, $Ar_{113}$ to $Ar_{116}$ may each independently be selected from a $C_1$-$C_{10}$ alkyl group, a phenyl group, a naphthyl group, a phenanthrenyl group, and a pyrenyl group; and a phenyl group, a phenyl group substituted with at least one selected from a naphthyl group and an anthracenyl group, a naphthyl group, a phenanthrenyl group, and a pyrenyl group.

In Formula 301, g, h, i, and j may each independently be an integer from 0 to 4. In some embodiments, g, h, i, and j may each independently be 0, 1, or 2.

In Formula 301, $Ar_{113}$ to $Ar_{116}$ may each independently be selected from a $C_1$-$C_{10}$ alkyl group substituted with at least one selected from a phenyl group, a naphthyl group, and an anthracenyl group;

a phenyl group, a naphthyl group, an anthracenyl group, a pyrenyl group, a phenanthrenyl group, and a fluorenyl group; and a phenyl group, a naphthyl group, an anthracenyl group, a pyrenyl group, a phenanthrenyl group, and a fluorenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a pyrenyl group, a phenanthrenyl group, and a fluorenyl group; and

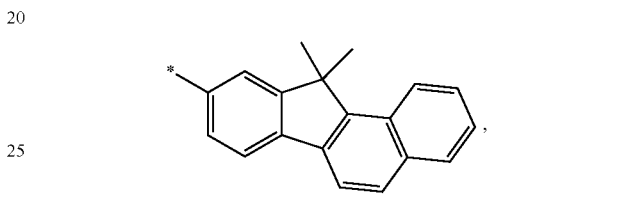

but embodiments are not limited thereto.

In some embodiments, the host may include a compound represented by Formula 302:

Formula 302

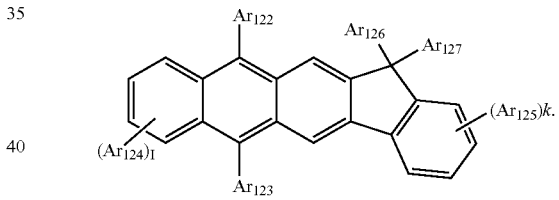

In Formula 302, $Ar_{122}$ to $Ar_{125}$ may each be the same as $Ar_{113}$ as described herein with reference to Formula 301.

In Formula 302, $Ar_{126}$ and $Ar_{127}$ may each independently be a $C_1$-$C_{10}$ alkyl group, e.g., a methyl group, an ethyl group, or a propyl group.

In Formula 302, k and l may each independently be an integer from 0 to 4. In some embodiments, k and l may each be 0, 1, or 2.

When the organic light-emitting device 10 is a full-color organic light-emitting device, the emission layer may be patterned into a red emission layer, a green emission layer, and a blue emission layer. In some embodiments, the emission layer may have a structure in which the red emission layer, the green emission layer, and/or the blue emission layer are layered to emit white light. In some embodiments, the structure of the emission layer may vary.

When the emission layer includes the host and the dopant, an amount of the dopant may be selected from a range of about 0.01 parts to about 15 parts by weight based on about 100 parts by weight of the host, but embodiments are not limited thereto.

The thickness of the emission layer may be in a range of about 100 Å to about 1,000 Å, and in some embodiments, about 200 Å to about 600 Å. While not wishing to be bound by theory, it is understood that when the thickness of the emission layer is within any of these ranges, improved luminous characteristics may be obtained without a substantial increase in driving voltage.

Next, an electron transport region may be formed on the emission layer.

The electron transport region may include a hole blocking layer, an electron transport layer, an electron injection layer, or a combination thereof.

In some embodiments, the electron transport region may have a hole blocking layer/an electron transport layer/an electron injection layer structure or an electron transport layer/an electron injection layer structure, but embodiments are not limited thereto. The electron transport layer may have a single-layered structure or a multi-layered structure including two or more different materials.

The conditions for forming a hole blocking layer, an electron transport layer, and an electron injection layer may be inferred based on the conditions for forming the hole injection layer.

When the electron transport region includes a hole blocking layer, the hole blocking layer may include, for example, at least one selected from BCP, Bphen, and BAlq, but embodiments are not limited thereto:

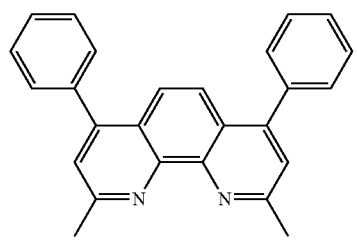

BCP

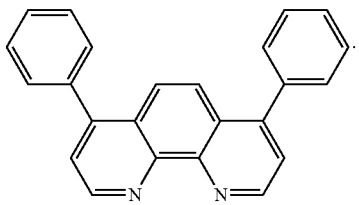

Bphen

The thickness of the hole blocking layer may be in a range of about 20 Å to about 1,000 Å, for example, about 30 Å to about 300 Å. While not wishing to be bound by theory, it is understood that when the thickness of the hole blocking layer is within these ranges, excellent hole blocking characteristics may be obtained without a substantial increase in driving voltage.

The electron transport layer may further include at least one selected from BCP, BPhen, Alq3, BAlq, TAZ, and NTAZ:

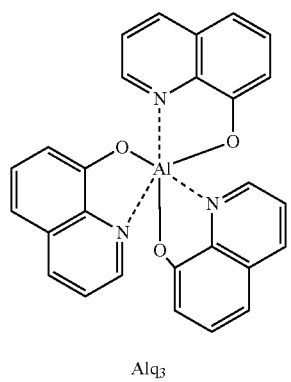

Alq3

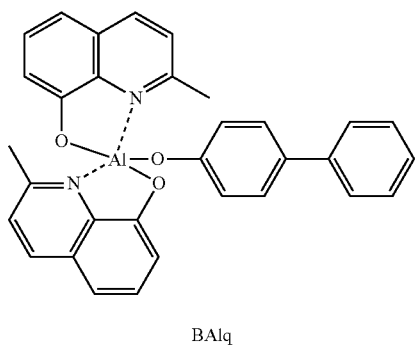

BAlq

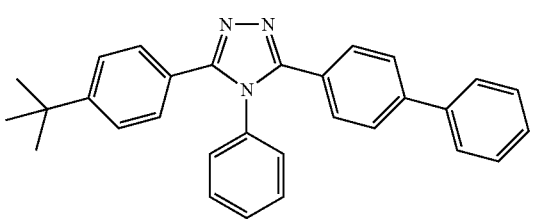

TAZ

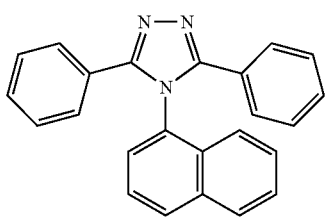

NTAZ

In some embodiments, the electron transport layer may include at least one selected from Compounds ET1 to ET25, but embodiments are not limited thereto:

ET1
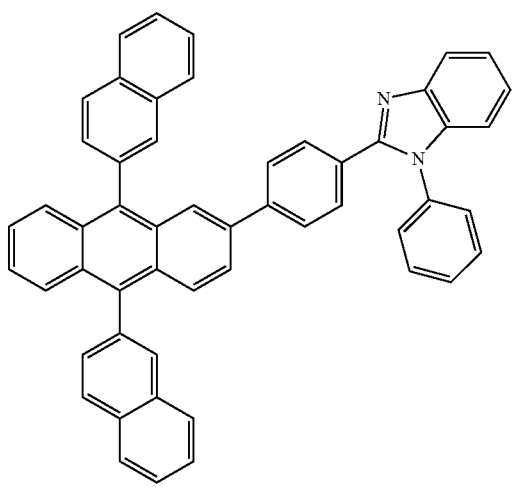
ET2
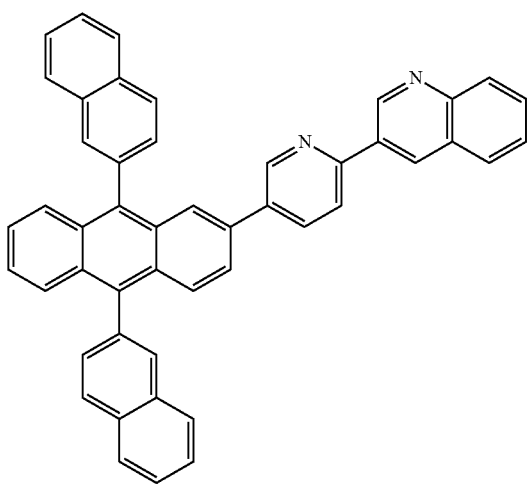
ET3
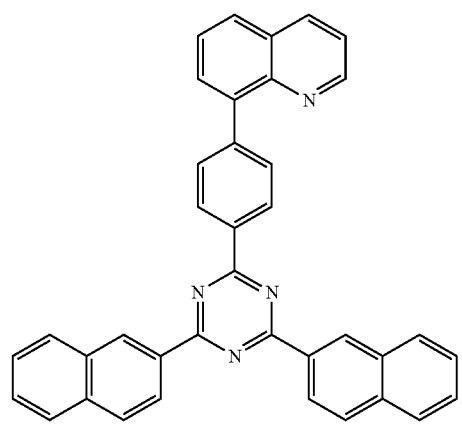
ET4
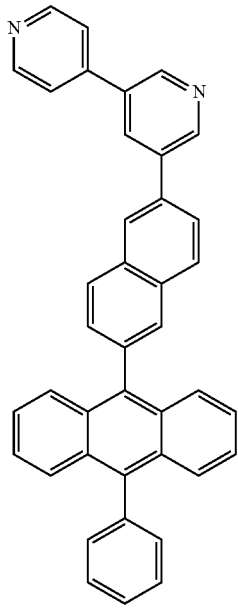
ET5
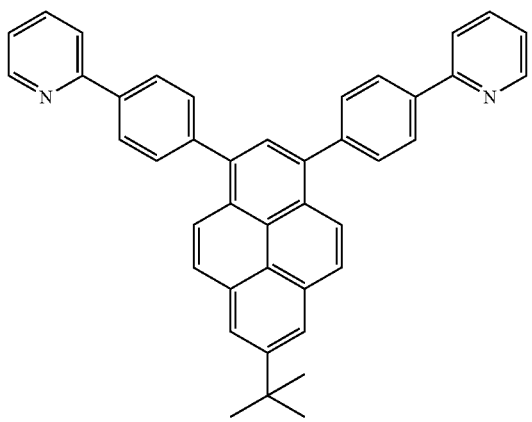
ET6
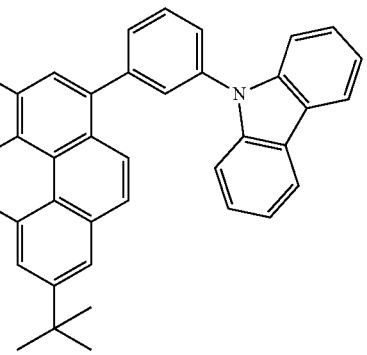

ET7
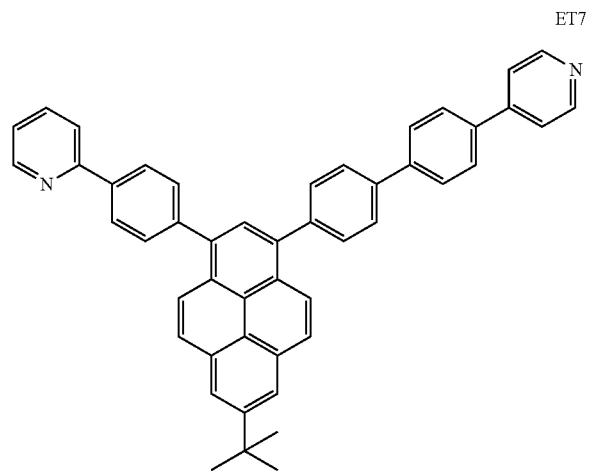
ET10
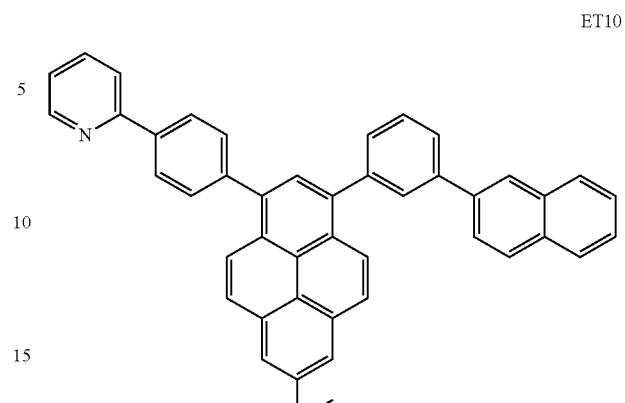
ET8
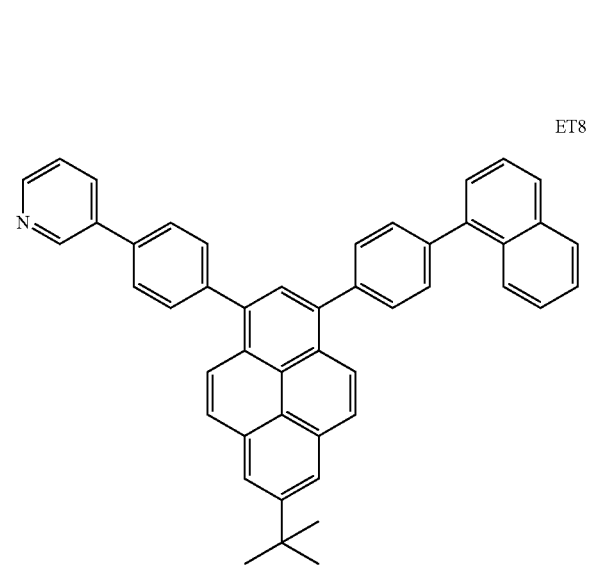
ET11
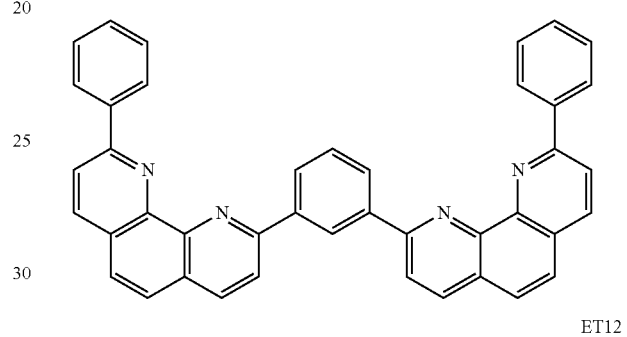
ET12
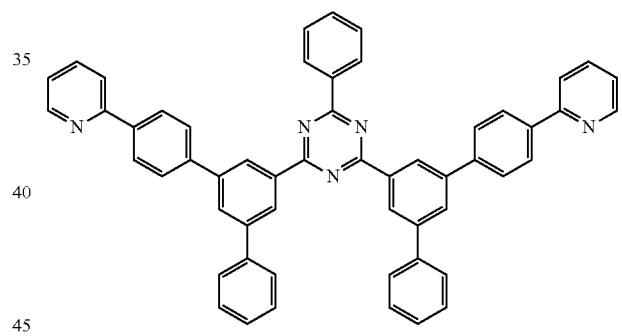
ET9
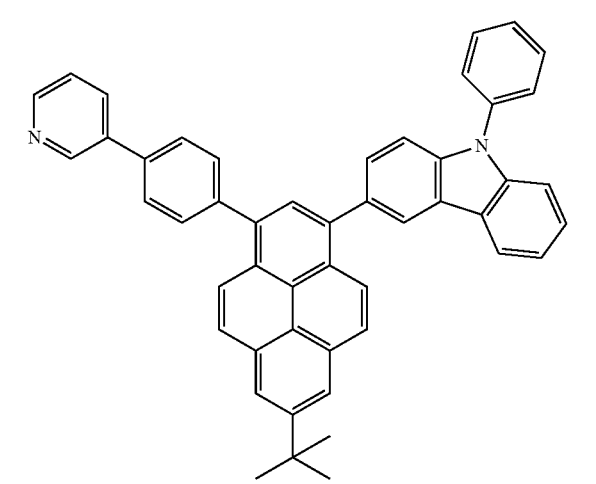
ET13
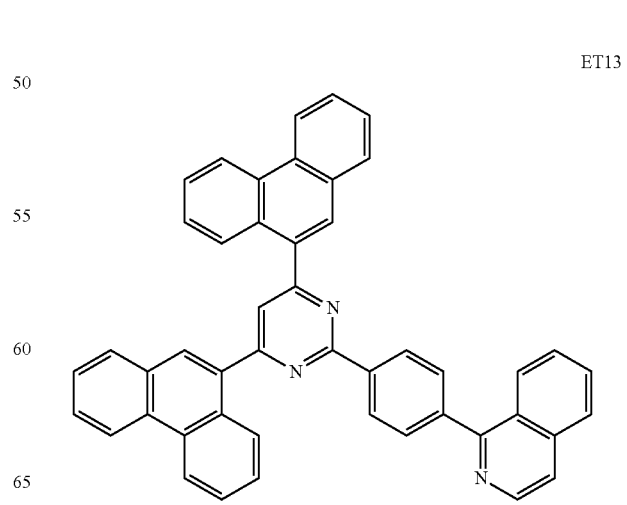

ET14
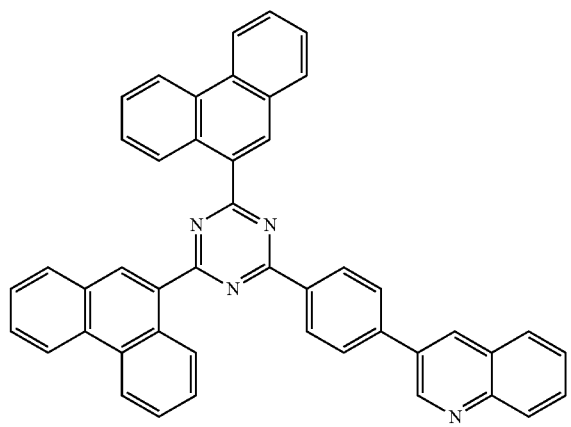
ET15
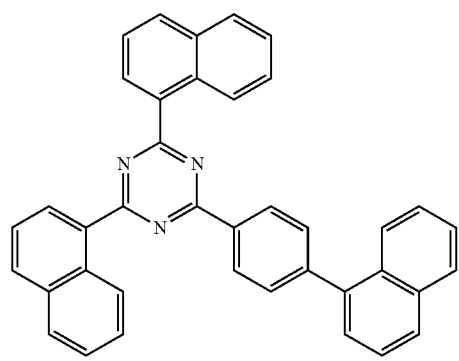
ET16
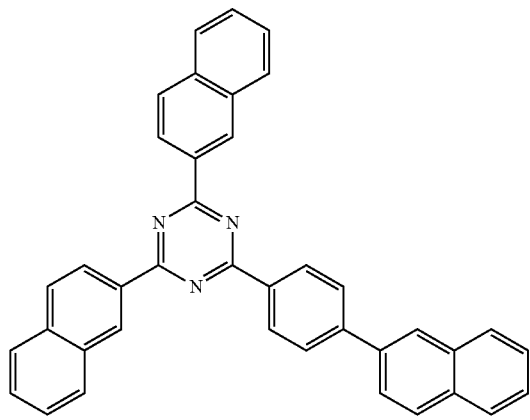
ET17
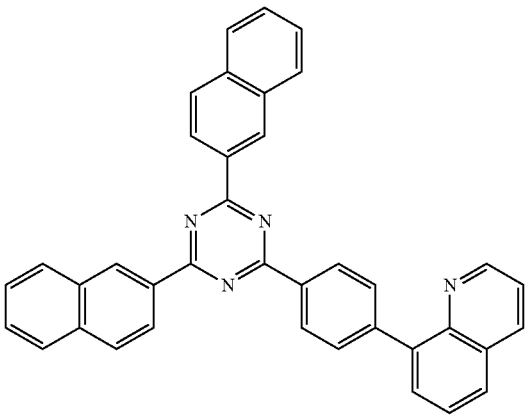
ET18
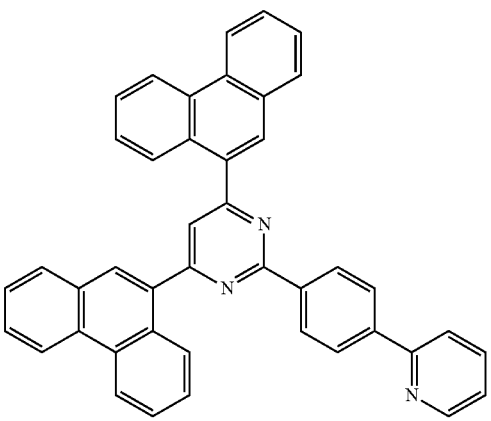
ET19
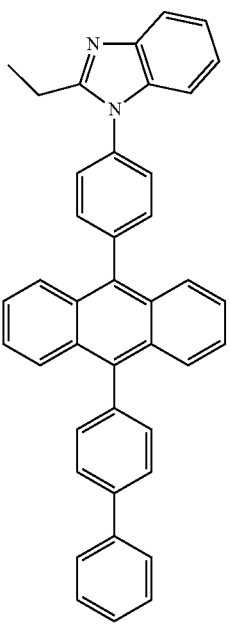

ET20
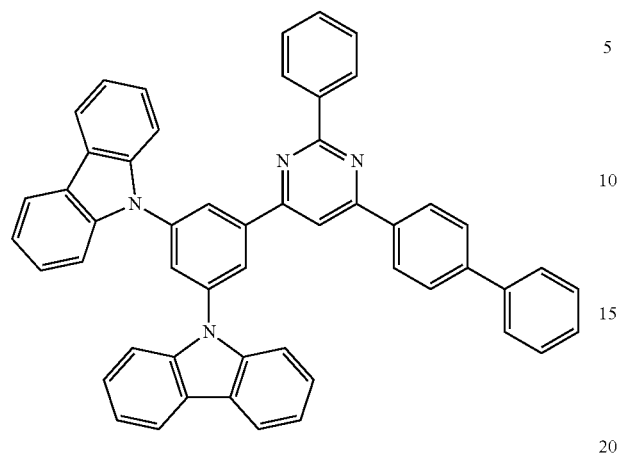
ET23
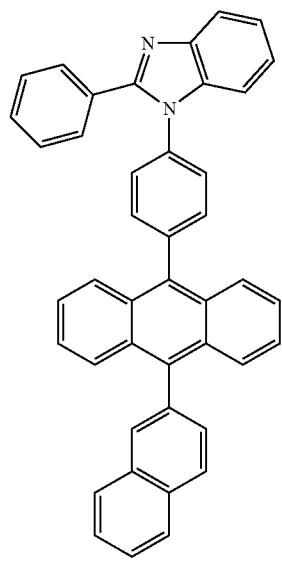
ET21
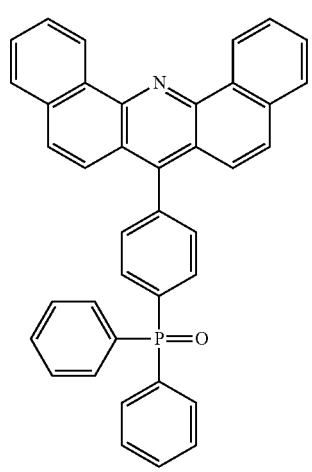
ET24
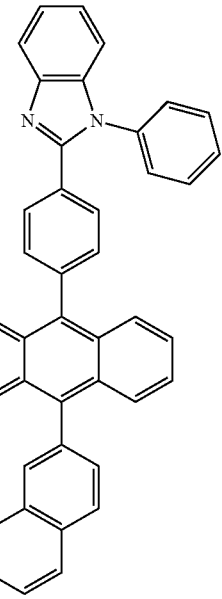
ET22
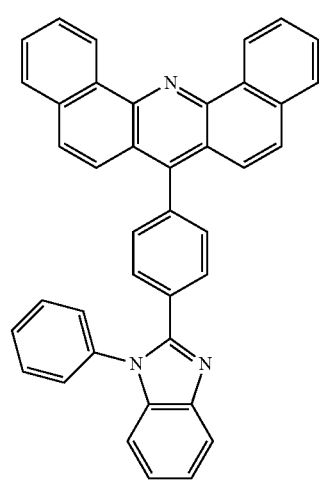
ET25
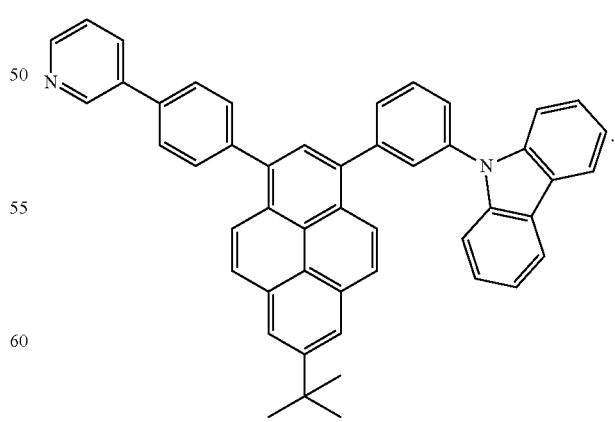
The thickness of the electron transport layer may be in a range of about 100 Å to about 1,000 Å, and in some embodiments, about 150 Å to about 500 Å. While not wishing to be bound by theory, it is understood that when the thickness of the electron transport layer is within any of these ranges, excellent electron transport characteristics may be obtained without a substantial increase in driving voltage.

The electron transport layer may further include a material containing metal, in addition to the materials described above.

The material containing metal may include a lithium (Li) complex. The Li complex may include, e.g., Compound ET-D1 (lithium quinolate, LiQ) or Compound ET-D2:

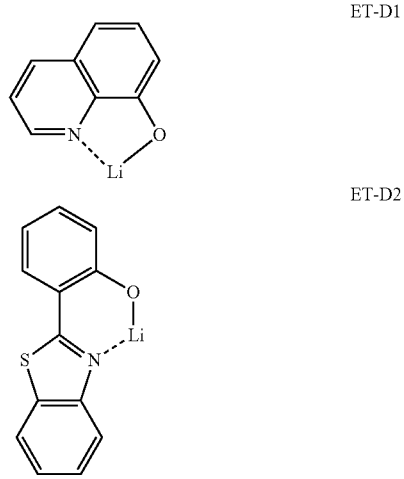

ET-D1

ET-D2

The electron transport region may include an electron injection layer that facilitates electron injection from the second electrode 19.

The electron injection layer may include at least one selected from LiF, NaCl, CsF, $Li_2O$, and BaO.

The thickness of the electron injection layer may be in a range of about 1 Å to about 100 Å, and in some embodiments, about 3 Å to about 90 Å. While not wishing to be bound by theory, it is understood that when the thickness of the electron injection layer is within any of these ranges, excellent electron injection characteristics may be obtained without a substantial increase in driving voltage.

The second electrode 19 may be formed on the organic layer 15. The second electrode 19 may be a cathode. A material for forming the second electrode 19 may be a material with a relatively low work function, such as a metal, an alloy, an electrically conductive compound, and a mixture thereof. Examples of the material for forming the second electrode 19 may include lithium (Li), magnesium (Mg), aluminum (Al), aluminum-lithium (Al—Li), calcium (Ca), magnesium-indium (Mg—In), and magnesium-silver (Mg—Ag). In some embodiments, ITO or IZO may be used to form a transmissive second electrode 19 to manufacture a top emission light-emitting device. In some embodiments, the material for forming the second electrode 19 may vary.

Hereinbefore the organic light-emitting device 10 has been described with reference to the FIGURE, but embodiments are not limited thereto.

According to an aspect of another embodiment, a diagnostic composition includes at least one organometallic compound represented by Formula 1.

Since the organometallic compound represented by Formula 1 provides high luminous efficiency, the diagnostic efficiency of the diagnostic composition that includes the organometallic compound represented by Formula 1 may be excellent.

The diagnostic composition may be applied in various ways, such as in a diagnostic kit, a diagnostic reagent, a biosensor, or a biomarker.

The term "$C_1$-$C_{60}$ alkyl group" as used herein refers to a linear or branched saturated aliphatic hydrocarbon monovalent group having 1 to 60 carbon atoms. Examples thereof include a methyl group, an ethyl group, a propyl group, an iso-butyl group, a sec-butyl group, a tert-butyl group, a pentyl group, an iso-amyl group, and a hexyl group. The term "$C_1$-$C_{60}$ alkylene group" as used herein refers to a divalent group having substantially the same structure as the $C_1$-$C_{60}$ alkyl group.

The term "$C_1$-$C_{60}$ alkoxy group" as used herein refers to a monovalent group represented by —$OA_{101}$ (wherein $A_{101}$ is a $C_1$-$C_{60}$ alkyl group). Examples thereof include a methoxy group, an ethoxy group, and an isopropyloxy group.

The term "$C_2$-$C_{60}$ alkenyl group" as used herein refers to a group formed by including at least one carbon-carbon double bond in the middle or at the terminus of the $C_2$-$C_{60}$ alkyl group. Examples thereof include an ethenyl group, a propenyl group, and a butenyl group. The term "$C_2$-$C_{60}$ alkenylene group" as used herein refers to a divalent group having substantially the same structure as the $C_2$-$C_{60}$ alkenyl group.

The term "$C_2$-$C_{60}$ alkynyl group" as used herein refers to a group formed by including at least one carbon-carbon triple bond in the middle or at the terminus of the $C_2$-$C_{60}$ alkyl group. Examples thereof include an ethenyl group and a propenyl group. The term "$C_2$-$C_{60}$ alkynylene group" as used herein refers to a divalent group having substantially the same structure as the $C_2$-$C_{60}$ alkynyl group.

The term "$C_3$-$C_{10}$ cycloalkyl group" as used herein refers to a monovalent monocyclic saturated hydrocarbon group including 3 to 10 carbon atoms. Examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having substantially the same structure as the $C_3$-$C_{10}$ cycloalkyl group.

The term "$C_1$-$C_{10}$ heterocycloalkyl group" as used herein refers to a monovalent monocyclic group including at least one heteroatom selected from N, O, P, Si, and S as a ring-forming atom and 1 to 10 carbon atoms. Examples thereof include a tetrahydrofuranyl group and a tetrahydrothiophenyl group. The term "$C_1$-$C_{10}$ heterocycloalkylene group" as used herein refers to a divalent group having substantially the same structure as the $C_1$-$C_{10}$ heterocycloalkyl group.

The term "$C_3$-$C_{10}$ cycloalkenyl group" as used herein refers to a monovalent monocyclic group including 3 to 10 carbon atoms and at least one carbon-carbon double bond in its ring, wherein the molecular structure as a whole is non-aromatic. Examples thereof include a cyclopentenyl group, a cyclohexenyl group, and a cycloheptenyl group. The term "$C_3$-$C_{10}$ cycloalkenylene group" as used herein refers to a divalent group having substantially the same structure as the $C_3$-$C_{10}$ cycloalkenyl group.

The term "$C_1$-$C_{10}$ heterocycloalkenyl group" as used herein refers to a monovalent monocyclic group including at least one heteroatom selected from N, O, P, Si, and S as a ring-forming atom, 1 to 10 carbon atoms, and at least one double bond in its ring. Examples of the $C_1$-$C_{10}$ heterocycloalkenyl group include a 2,3-dihydrofuranyl group and a 2,3-dihydrothiophenyl group. The term "$C_1$-$C_{10}$ heterocycloalkylene group" as used herein refers to a divalent group having substantially the same structure as the $C_1$-$C_{10}$ heterocycloalkyl group.

The term "$C_6$-$C_{60}$ aryl group" as used herein refers to a monovalent group having a carbocyclic aromatic system having 6 to 60 carbon atoms. The term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and a $C_6$-$C_{60}$ arylene group each include at least two rings, the at least two rings may be fused.

The term "$C_1$-$C_{60}$ heteroaryl group" as used herein refers to a monovalent group having a cyclic aromatic system having at least one heteroatom selected from N, O, P, Si, and S as a ring-forming atom and 1 to 60 carbon atoms. The term "$C_1$-$C_{60}$ heteroarylene group" as used herein refers to a divalent group having a cyclic aromatic system having at least one heteroatom selected from N, O, P, and S as a ring-forming atom and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include at least two rings, the at least two rings may be fused.

The term "$C_6$-$C_{60}$ aryloxy group" as used herein indicates —$OA_{102}$ (wherein $A_{102}$ is a $C_6$-$C_{60}$ aryl group). The term "$C_6$-$C_{60}$ arylthio group" as used herein indicates —$SA_{103}$ (wherein $A_{103}$ is a $C_6$-$C_{60}$ aryl group).

The term "monovalent non-aromatic condensed polycyclic group" as used herein refers to a monovalent group that has two or more condensed rings and only carbon atoms (e.g., the number of carbon atoms may be in a range of 8 to 60) as ring-forming atoms, wherein the molecular structure as a whole is non-aromatic. Examples of the monovalent non-aromatic condensed polycyclic group include a fluorenyl group. The term "divalent non-aromatic condensed polycyclic group" as used herein refers to a divalent group having substantially the same structure as the monovalent non-aromatic condensed polycyclic group.

The term "monovalent non-aromatic condensed heteropolycyclic group" as used herein refers to a monovalent group that has two or more condensed rings and a heteroatom selected from N, O, P, Si, and S and carbon atoms (e.g., the number of carbon atoms may be in a range of 1 to 60) as ring-forming atoms, wherein the molecular structure as a whole is non-aromatic. Examples of the monovalent non-aromatic condensed heteropolycyclic group include a carbazolyl group. The term "divalent non-aromatic condensed heteropolycyclic group" as used herein refers to a divalent group having substantially the same structure as the monovalent non-aromatic condensed heteropolycyclic group.

The term "$C_5$-$C_{30}$ carbocyclic group" as used herein refers to a saturated or unsaturated cyclic group including 5 to 30 carbon atoms only as ring-forming atoms. The $C_5$-$C_{30}$ carbocyclic group may be a monocyclic group or a polycyclic group.

The term "$C_1$-$C_{30}$ heterocyclic group" as used herein refers to saturated or unsaturated cyclic group including 1 to 30 carbon atoms and at least one heteroatom selected from N, O, P, Si, and S as ring-forming atoms. The $C_1$-$C_{30}$ heterocyclic group may be a monocyclic group or a polycyclic group.

At least one substituent of the substituted $C_5$-$C_{30}$ carbocyclic group, substituted $C_2$-$C_{30}$ heterocyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group and substituted monovalent non-aromatic condensed heteropolycyclic group may be selected from:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, and —$P(=O)(Q_{18})(Q_{19})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$B(Q_{26})(Q_{27})$, and —$P(=O)(Q_{28})(Q_{29})$; and —N($Q_{31}$)($Q_{32}$), —Si($Q_{33}$)($Q_{34}$)($Q_{35}$), —B($Q_{36}$)($Q_{37}$), and —P(=O)($Q_{38}$)($Q_{39}$), wherein $Q_1$ to $Q_9$, $Q_{11}$ to $Q_{19}$, $Q_{21}$ to $Q_{29}$, and $Q_{31}$ to $Q_{39}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from a $C_1$-$C_{60}$ alkyl group and a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

Hereinafter, a compound and an organic light-emitting device according to an embodiment will be described in detail with reference to Synthesis Examples and Examples, however, the present disclosure is not limited thereto. The wording "B was used instead of A" used in describing Synthesis Examples means that an amount of B used was identical to an amount of A used in terms of molar equivalents.

EXAMPLES

Synthesis Example 1: Synthesis of Compound 9

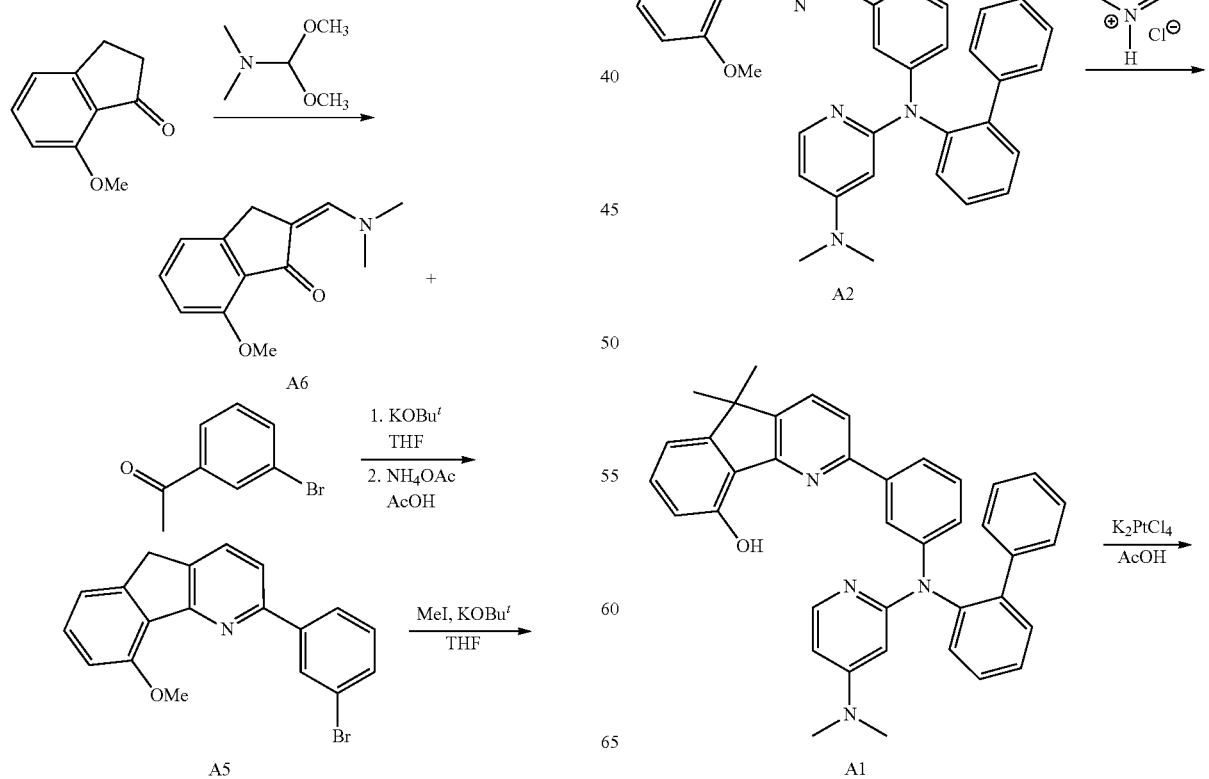

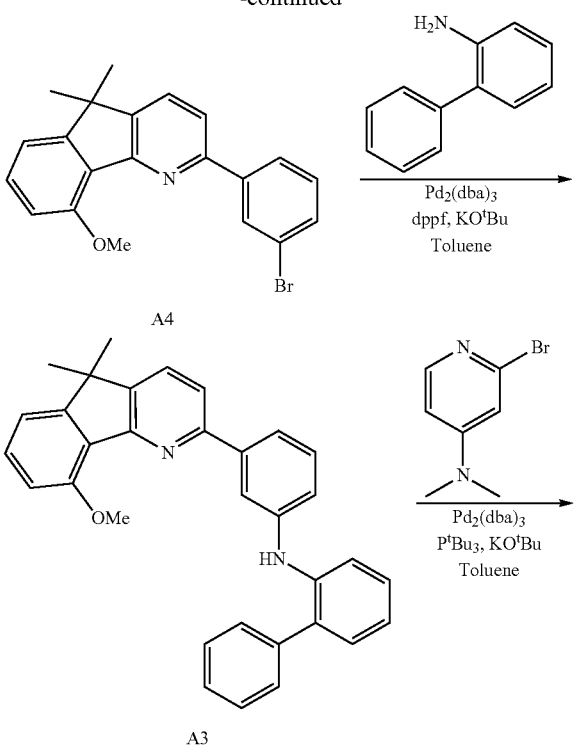

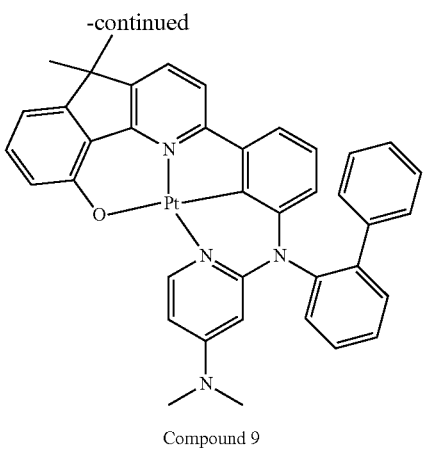

Compound 9

Synthesis of Intermediate A6

7-methoxy-1-indanone was mixed with excess dimethylformamide dimethyl acetal, and the mixture was refluxed for 12 hours. Then, dimethylformamide dimethyl acetal was removed therefrom, and hexane was added thereto, which facilitated recrystalization. A solid was formed and filtered, thereby obtaining bright yellow Intermediate A6 (yield: 90%).

$^1$H NMR (400 MHz, CDCl$_3$, 25° C.): δ=7.40 (s, 1H), 7.38 (t, J=7.8 Hz, 1H), 6.98 (d, J=7.4 Hz, 1H), 6.77 (d, J=8.2 Hz, 1H), 3.93 (s, 3H), 3.82 (s, 2H), 3.12 (s, 6H). EI-MS (+ve, m/z): 217 [M$^+$].

Synthesis of Intermediate A5

1.0 equivalent of 1-(3-bromophenyl)ethanone and 1.2 equivalents of potassium tert-butoxide were mixed and reacted with tetrahydrofuran for 2 hours at room temperature, thereby obtaining bright brown precipitate. Next, 1.0 equivalent of Intermediate A6 was mixed with tetrahydrofuran, which was then added thereto, thereby allowing reaction to occur for additional 12 hours at room temperature. Subsequently, the reaction mixture was added to a mixture of 15.0 grams (g) of ammonium acetate and 20 milliliters (mL) of acetic acid. Volatile components were removed therefrom by distillation for 2 hours. Then, the mixture was cooled to room temperature and dissolved in dichloromethane, followed by addition of a sodium hydrogen carbonate solution thereto. An organic layer was obtained therefrom, which was then separated and dried using magnesium sulfate. The resultant was distilled under reduced pressure to obtain oil. The oil was purified using column chromatography, thereby obtaining Intermediate A5 (yield: 78%).

$^1$H NMR (300 MHz, CDCl$_3$, 25° C.): δ=8.35-8.36 (m, 1H), 8.08 (d, J=7.8 Hz, 1H), 7.85 (d, J=7.9 Hz, 1H), 7.61 (d, J=7.9 Hz, 1H), 7.53 (d, J=7.9 Hz, 1H), 7.32-7.43 (m, 2H), 7.20 (t, J=7.3 Hz, 1H), 6.98 (t, J=8.2 Hz, 1H), 4.12 (s, 3H), 3.92 (s, 2H). EI-MS (+ve, m/z): 352 [M$^+$].

Synthesis of Intermediate A4

1.0 equivalent of Intermediate A5, 4.0 equivalents of methyliodine, and 2.5 equivalents of potassium tert-butoxide were added to tetrahydrofuran, and the mixture was allowed to react for 1 day at a temperature of 50° C. The resulting mixture was then cooled to room temperature, and a solvent was distilled under reduced pressure, thereby obtaining a mixture. The obtained mixture was poured into a separatory funnel with the addition of dichloromethane and water thereto. An organic layer was separated therefrom, which was then dried using magnesium sulfate. The resultant was distilled under reduced pressure to obtain a resulting mixture. The resulting mixture was purified using column chromatography, thereby obtaining Intermediate A4 (yield: 82%).

$^1$H NMR (400 MHz, CDCl$_3$, 25° C.): δ=8.32-8.33 (m, 1H), 8.06 (d, J=7.7 Hz, 1H), 7.74 (d, J=8.0 Hz, 1H), 7.60 (d, J=7.9 Hz, 1H), 7.52 (d, J=7.9 Hz, 1H), 7.32-7.44 (m, 2H), 7.11 (d, J=7.5 Hz, 1H), 6.95 (d, J=8.2 Hz, 1H), 4.11 (s, 3H), 1.51 (s, 6H). EI-MS (+ve, m/z): 380 [M$^+$].

Synthesis of Intermediate A3

1.0 equivalent of Intermediate A4, 1.0 equivalent of 2-phenylaniline, 5 mole percent (mol %) of Pd$_2$(dba)$_3$, 10 mol % of 1,1'-bis(diphenylphosphanyl) ferrocene (dppf), and 1.5 equivalents of potassium tert-butoxide were mixed with toluene and refluxed for 12 hours. Subsequently, the resultant was cooled to room temperature and distilled under reduced pressure to obtain a resulting mixture. The resulting mixture was purified using column chromatography, thereby obtaining Intermediate A3 (yield: 53%).

$^1$H NMR (300 MHz, CDCl$_3$, 25° C.) δ=7.93-7.87 (m, 1H), 7.71 (d, J=7.9 Hz, 1H), 7.62 (m, 2H), 7.55-7.40 (m, 5H), 7.40-7.32 (m, 3H), 7.30 (m, 2H), 7.11 (t, J=8.3 Hz, 2H), 7.05-6.96 (m, 1H), 6.92 (d, J=8.2 Hz, 1H), 4.03 (s, 3H), 1.50 (s, 6H). EI-MS: m/z 467.3 [M$^+$].

Synthesis of Intermediate A2

1.0 equivalent of Intermediate A3, 1.0 equivalent of 2-bromo-4-(dimethylamino)pyridine, 5 mol % of Pd$_2$(dba)$_3$, 15 mol % of tri-tert-butylphosphine, and 1.5 equivalents of potassium tert-butoxide were mixed with toluene and refluxed for 24 hours. Subsequently, the resultant was cooled to room temperature, and a solvent was distilled under reduced pressure to obtain a resulting mixture. The resulting mixture was purified using column chromatography, thereby obtaining Intermediate A2 (yield: 46%).

$^1$H NMR (300 MHz, CD$_2$Cl$_2$, 25° C.) δ=7.85 (d, J=6.5 Hz, 1H), 7.72 (dd, J=13.5 Hz, 7.5 Hz, 3H), 7.43 (dd, J=11.7 Hz, 4.4 Hz, 5H), 7.39-7.30 (m, 2H), 7.30-7.16 (m, 4H), 7.13 (t, J=6.7 Hz, 2H), 6.93 (d, J=8.2 Hz, 2H), 6.19-6.13 (m, 1H), 5.87 (d, J=2.0 Hz, 1H), 3.94 (s, 3H), 2.96-2.76 (m, 6H), 1.48 (s, 6H). EI-MS: m/z 587.4 [M$^+$].

Synthesis of Intermediate A1

0.20 g (0.34 mmol) of Intermediate A2 and 3.0 g (26.0 mmol) of pyridine hydrochloride were reacted at a temperature of 230° C. for 2 hours. Then, the mixture was cooled to room temperature, and ethyl acetate and water was added thereto. An organic layer was separated therefrom by using a separatory funnel, and the separated organic layer was distilled under reduced pressure to obtain a resulting mixture. The resulting mixture was purified using column chromatography, thereby obtaining Intermediate A1 (yield: 90%).

$^1$H NMR (300 MHz, CD$_2$Cl$_2$, 25° C.) δ=7.84 (d, J=6.1 Hz, 1H), 7.73 (d, J=7.9 Hz, 1H), 7.58-7.46 (m, 2H), 7.45-7.35 (m, 5H), 7.31 (m, 3H), 7.16 (m, 4H), 7.03 (d, J=7.5 Hz, 1H), 6.93 (d, J=8.1 Hz, 1H), 6.86 (d, J=8.1 Hz, 1H), 6.16

(dd, J=6.0 Hz, 2.2 Hz, 1H), 5.96 (d, J=2.1 Hz, 1H), 2.85 (s, 6H), 1.55 (s, 6H). EI-MS: m/z 573.4 [M+].

Synthesis of Compound 9

0.17 g (0.41 mmol) of $K_2PtCl_4$, 0.24 g (0.41 mmol) of Intermediate A1, and 5 mL of glacial acetic acid were mixed together, and refluxed for 12 hours. Subsequently, the resultant was cooled to room temperature and distilled under reduced pressure to obtain a resulting mixture. The resulting mixture was purified using column chromatography, thereby obtaining Compound 9 (yield: 20%).

$^1$H NMR (400 MHz, $CD_2Cl_2$, 25° C.) δ=9.65-9.63 (d, J=7.3 Hz, 1H), 7.88-7.86 (d, J=7.7 Hz, 1H), 7.69-7.59 (m, 3H), 7.55-7.53 (d, J=7.7 Hz, 1H), 7.49-7.34 (m, 3H), 7.19-7.08 (m, 5H), 6.98-6.93 (m, 2H), 6.71-6.69 (d, J=7.1 Hz, 1H), 6.24-6.13 (m, 2H), 5.45-5.44 (d, J=2.7 Hz, 1H), 2.76 (s, 6H), 1.54 (s, 6H). ESI-MS (MeOH): m/z 768.6 [M+].

Synthesis Example 2: Synthesis of Compound 1

Compound 1 was prepared in substantially the same manner as in Synthesis Example 1, except that aniline was used instead of 2-phenylaniline in synthesizing Intermediate A3 (yield: 22%).

$^1$H NMR (400 MHz, $CD_2Cl_2$, 25° C.) δ=9.66-9.64 (d, J=7.3 Hz, 1H), 7.86-7.84 (d, J=7.7 Hz, 1H), 7.68-7.61 (m, 3H), 7.55-7.53 (d, J=7.7 Hz, 1H), 7.49-7.34 (m, 3H), 7.17-7.10 (m, 2H), 6.95-6.93 (m, 1H), 6.71-6.69 (d, J=7.1 Hz, 1H), 6.24-6.13 (m, 2H), 5.45-5.44 (d, J=2.7 Hz, 1H), 2.75 (s, 6H), 1.54 (s, 6H). ESI-MS (MeOH): m/z 692.3 [M+].

Synthesis Example 3: Synthesis of Compound 3

Compound 3 was prepared in substantially the same manner as in Synthesis Example 1, except that aniline was used instead of 2-phenylaniline in synthesizing Intermediate A3, and 2-bromo-4-(diphenylamino)pyridine was used instead of 2-bromo-4-(dimethylamino)pyridine in synthesizing Intermediate A2 (yield: 25%).

$^1$H NMR (400 MHz, $CDCl_3$) δ 9.77 (d, J=7.2 Hz, 1H), 7.85 (d, J=7.8 Hz, 1H), 7.52 (d, J=7.6 Hz, 1H), 7.36-7.46 (m, 4H), 7.26-7.30 (m, 1H), 7.16 (d, J=7.3 Hz, 2H), 7.05-7.06 (m, 5H), 6.88-6.95 (m, 7H), 6.72 (d, J=7.1 Hz, 1H), 6.38 (dd, J=7.2 Hz, 2.6 Hz, 1H), 6.05 (d, J=8.2 Hz, 1H), 5.48 (d, J=2.6 Hz, 1H), 1.57 (s, 6H). ESI-MS: m/z 816.5 [M+].

Evaluation Example 1: Measurement of Decay Time

A quartz substrate was prepared by washing with chloroform and pure water, and then, the materials that are listed in Table 2 were vacuum co-deposited under a vacuum degree of about $10^{-7}$ torr to prepare Films 1, 2, 3, and A each having a thickness of about 50 nanometers (nm).

TABLE 2

| Film | Compounds used in the preparation of the film (each ratio described herein indicates the weight ratio) |
|---|---|
| Film 1 | CBP:Compound 1 = 9:1 |
| Film 2 | CBP:Compound 3 = 9:1 |
| Film 3 | CBP:Compound 9 = 9:1 |
| Film A | CBP:Compound A = 9:1 |

Each of photoluminescence (PL) spectra of the prepared Films 1, 2, and A was evaluated at room temperature by using a time-resolved photoluminescence (TRPL) measurement system, FluoTime 300 (available from PicoQuant), and a pumping source, PLS340 (available from PicoQuant, excitation wavelength=340 nm, spectral width=20 nanometers, nm). Then, a wavelength of the main peak in each PL spectrum was determined, and upon photon pulses (pulse width=500 picoseconds, ps) applied to the film by PLS340, the number of photons emitted at the wavelength of the main peak for each film was repeatedly measured over time by time-correlated single photon counting (TCSPC), thereby obtaining TRPL curves available for the sufficient fitting. Based on the results obtained therefrom, two or more exponential decay functions were set forth for the fitting, thereby obtaining $T_{decay}$(Ex), i.e., a decay time, for Films 1, 2, 3, and A. The results thereof are shown in Table 3. The functions used for the fitting are as described in Equation 1, and a decay time $T_{decay}$ having the largest value among values for each of the exponential decay functions used for the fitting was taken as $T_{decay}$(Ex), i.e., a decay time. Here, during the same measurement time as the measurement time for obtaining TRPL curves, the same measurement was repeated once more in a dark state (i.e., a state where a pumping signal incident on each of the films was blocked), thereby obtaining a baseline or a background signal curve available as a baseline for the fitting.

$$f(t) = \sum_{i=1}^{n} A_i \exp(-t/T_{decay,i}) \quad \text{Equation 1}$$

TABLE 3

| Film | Decay time microseconds (μs) |
|---|---|
| Film 1 (Compound 1) | 7.3 |
| Film 2 (Compound 3) | 7.0 |
| Film 3 (Compound 9) | 7.6 |
| Film A (Compound A) | 13.0 |

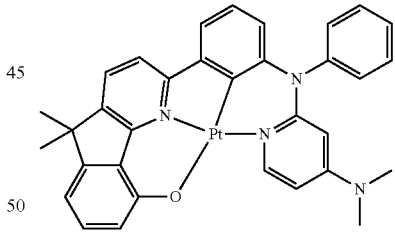

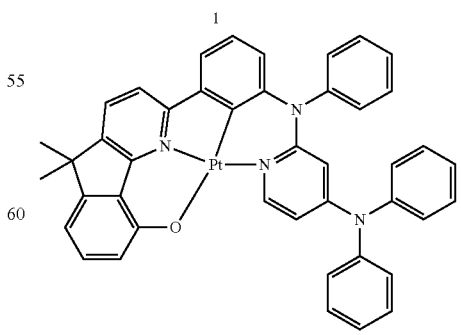

1

3

TABLE 3-continued

| Film | Decay time microseconds (μs) |
|---|---|
| 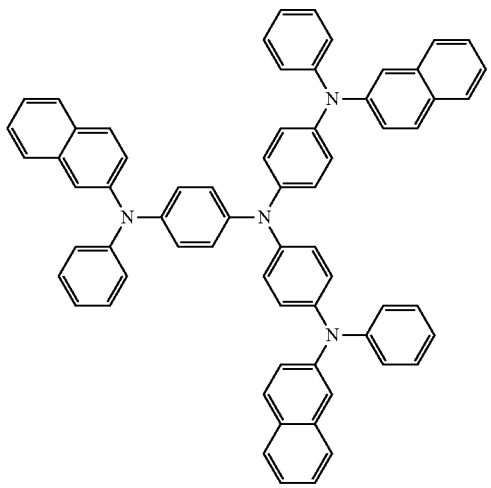 8 | |
| A | |

As shown in Table 3, Compounds 1, 3, and 9 were found to have short decay times, as compared with Compound A.

Example 1

A glass substrate, on which an anode having an ITO/Ag/ITO (70 Å/1,000 Å/70 Å) structure was deposited, was cut to a size of 50 millimeters (mm)×50 mm×0.5 mm, sonicated in isopropyl alcohol and water for 5 minutes each, and cleaned by exposure to ultraviolet rays and ozone for 30 minutes. Subsequently, the glass substrate was mounted on a vacuum-deposition device.

2-TNATA was deposited on the anode to form a hole injection layer having a thickness of 600 Å. 4,4'-bis[N-(1-naphthyl)-N-phenylamino]biphenyl (hereinafter, referred as "NPB") was deposited on the hole injection layer to form a hole transport layer having a thickness of 1,350 Å.

CBP (as a host) and Compound 1 (as a dopant) were co-deposited on the hole transport layer at a weight ratio of 90:10 to form an emission layer having a thickness of 400 Å. BCP was deposited on the emission layer to form a hole blocking layer having a thickness of 50 Å. Subsequently, $Alq_3$ was deposited on the hole blocking layer to form an electron transport layer having a thickness of 350 Å. LiF was deposited on the electron transport layer to form an electron injection layer having a thickness of 10 Å. MgAg was deposited on the electron injection layer at a weight ratio of 90:10 to form a cathode having a thickness of 120 Å, thereby completing the manufacture of an organic light-emitting device (which emits red light). The organic light-emitting device thus have a structure of ITO/Ag/ITO/2-TNATA (600 Å)/NPB (1,350 Å)/CBP+Compound 1(10 wt %) (400 Å)/BCP (50 Å)/$Alq_3$ (350 Å)/LiF (10 Å)/MgAg (120 Å):

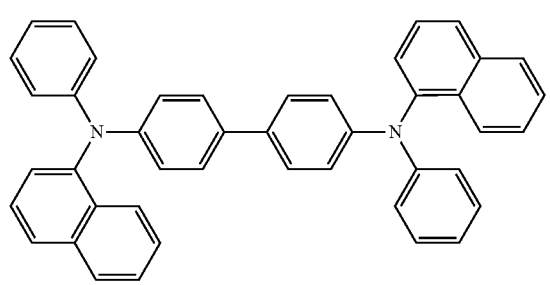

2-TNATA

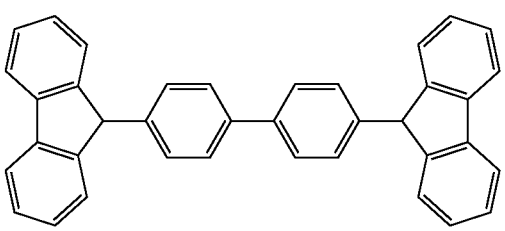

NPB

CBP

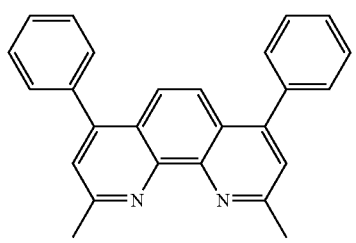

BCP

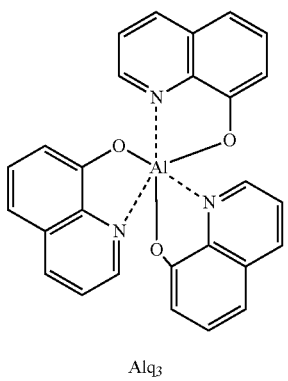

Alq₃

Examples 2 and 3 and Comparative Examples A and B

Organic light-emitting devices were manufactured in substantially the same manner as in Example 1, except that the compounds listed in Table 4 were used instead of Compound 1 as a dopant in the formation of an emission layer.

Evaluation Example 2: Evaluation of Characteristics of Organic Light-Emitting Device The driving voltage, luminescence efficiency, roll-off, FWHM, and lifespan ($T_{95}$) of the organic light-emitting devices manufactured in Examples 1 to 3 and Comparative Examples A and B were evaluated. The results thereof are shown in Table 4. A Keithley 2400 current voltmeter and a luminance meter (Minolta Cs-1000A) were used in the evaluation. The lifespan ($T_{95}$) refers to time required for the initial luminance of 6,000 nit of the organic light-emitting device to reduce by 95%. The roll-off was calculated by the following Equation 20:

$$\text{Roll-off} = \{1 - (\text{efficiency (at 9,000 nit)/maximum luminous efficiency})\} \times 100\% \quad \text{Equation 20}$$

TABLE 4

| | Dopant | Driving voltage (V) | Luminescence efficiency (cd/A) | Roll-off (%) | FWHM (nm) | Lifespan ($T_{95}$) (hr) |
|---|---|---|---|---|---|---|
| Example 1 | Compound 1 | 2.3 | 73.3 | 2.7 | 76 | 65 |
| Example 2 | Compound 3 | 2.3 | 78.9 | 2.6 | 71 | 85 |
| Example 3 | Compound 9 | 2.3 | 71.6 | 2.7 | 75 | 55 |
| Comparative Example A | Compound A | 2.2 | 38.0 | 38.5 | 80 | 30 |
| Comparative Example B | Compound B | 2.5 | 67.7 | 8.4 | 82 | 50 |

TABLE 4-continued

| | Dopant | Driving voltage (V) | Luminescence efficiency (cd/A) | Roll-off (%) | FWHM (nm) | Lifespan ($T_{95}$) (hr) |
|---|---|---|---|---|---|---|

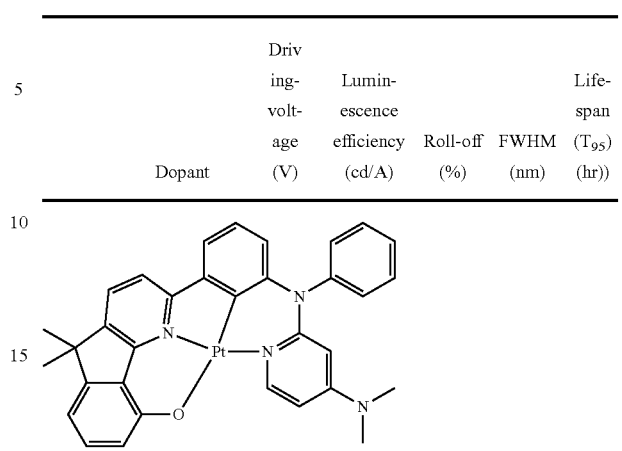

1

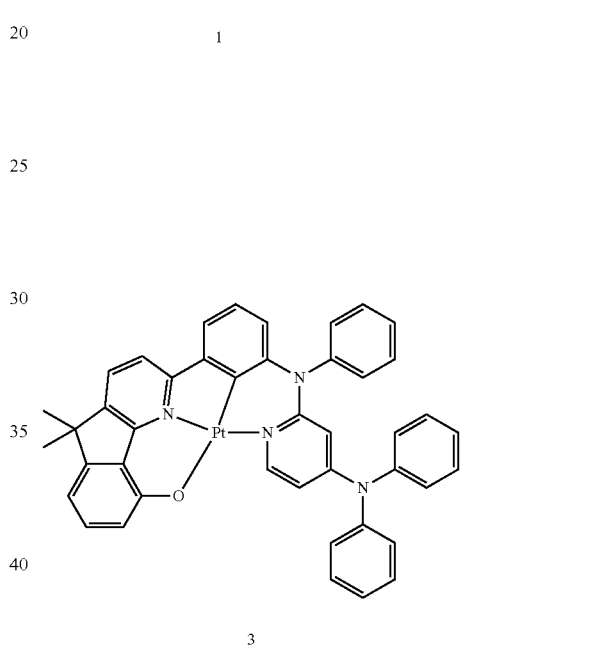

3

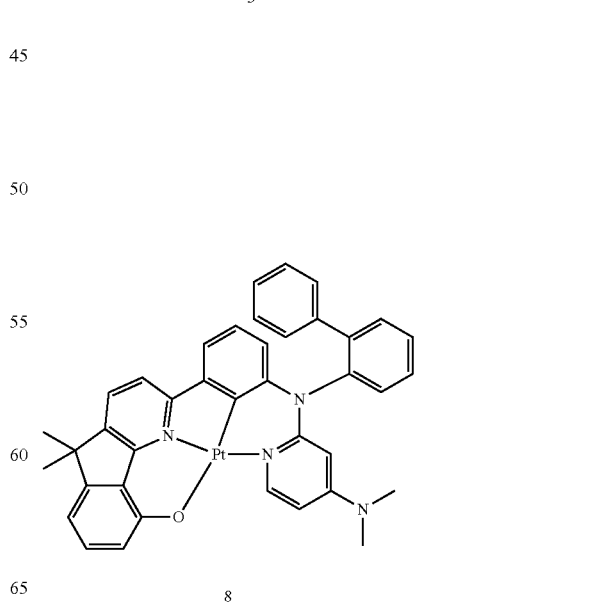

8

TABLE 4-continued

| Dopant | Driving-voltage (V) | Luminescence efficiency (cd/A) | Roll-off (%) | FWHM (nm) | Lifespan ($T_{95}$) (hr) |
|---|---|---|---|---|---|

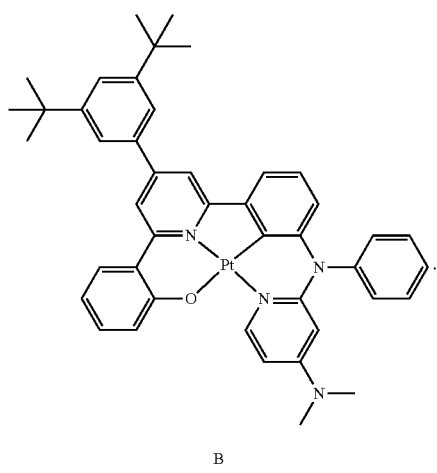

A

B

Referring to the results of Table 4, the organic light-emitting device of Examples 1 to 3 were found to have higher luminescence efficiency, lower roll-off, shorter FWHM, and longer lifespan characteristics than those of the organic light-emitting device of Comparative Examples A and B.

As apparent from the foregoing description, since the organometallic compound may include a short FWHM and a short decay time, an organic light-emitting device including the organometallic compound may have improved roll-off. Further, a diagnostic composition that includes the organometallic compound may have high diagnostic efficiency, because the organometallic compound is excellent in phosphorescent emission characteristics.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the FIGURES, it will be understood by those of ordinary skill in the art that various changes in form and details may be made therein without departing from the spirit and scope of the present disclosure as defined by the following claims.

What is claimed is:

1. An organometallic compound represented by Formula 1:

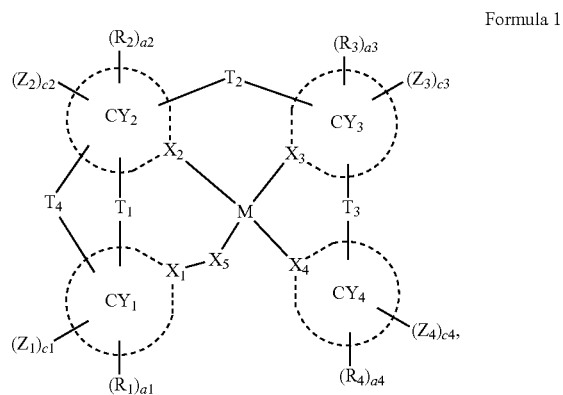

Formula 1 wherein, in Formula 1,

M is selected from beryllium (Be), magnesium (Mg), aluminum (Al), calcium (Ca), titanium (Ti), manganese (Mn), cobalt (Co), copper (Cu), zinc (Zn), gallium (Ga), germanium (Ge), zirconium (Zr), ruthenium (Ru), rhodium (Rh), palladium (Pd), silver, (Ag), rhenium (Re), platinum (Pt), and gold (Au), $X_1$ is carbon (C), $X_2$ to $X_4$ are each independently selected from C and nitrogen (N), $X_5$ is selected from O, S, B(R'), N(R'), P(R'), C(R')(R"), Si(R')(R"), Ge(R')(R"), and C(=O), two selected from a bond between $X_2$ and M, a bond between $X_3$ and M, and a bond between $X_4$ and M are each a coordinate bond, while the rest is a covalent bond, a bond between $X_5$ and M is a covalent bond, rings $CY_1$ to $CY_4$ are each independently selected from a $C_5$-$C_{30}$ carbocyclic group and a $C_1$-$C_{30}$ heterocyclic group, $T_1$ is selected from a single bond, a double bond, *—N[($L_{61}$)$_{a61}$-($R_{61}$)]—*', *—B($R_{61}$)—*', *—P($R_{61}$)—*', *—C($R_{61}$)($R_{62}$)—*', *—Si($R_{61}$)($R_{62}$)—*', *—Ge($R_{61}$)($R_{62}$)—*', *—S—*', *—Se—*', *—O—*', *—C(=O)—*', *—S(=O)—*', *—S(=O)$_2$—*', *—C($R_{61}$)=*', *=C($R_{61}$)—*', *—C($R_{61}$)=C($R_{62}$)—*', *—C(=S)—*', and *—C≡C—*', $T_2$ is selected from a single bond, a double bond, *—N[($L_{63}$)$_{a63}$-($R_{63}$)]—*', *—B($R_{63}$)—*', *—P($R_{63}$)—*', *—C($R_{63}$)($R_{64}$)—*', *—Si($R_{63}$)($R_{64}$)—*', *—Ge($R_{63}$)($R_{64}$)—*', *—S—*', *—Se—*', *—O—*', *—C(=O)—*', *—S(=O)—*', *—S(=O)$_2$—*', *—C($R_{63}$)=*', *=C($R_{63}$)—*', *—C($R_{63}$)=C($R_{64}$)—*', *—C(=S)—*', and *—C≡C—*', $T_3$ is selected from a single bond, a double bond, *—N[($L_{65}$)$_{a65}$-($R_{65}$)]—*', *—B($R_{65}$)—*', *—P($R_{65}$)—*', *—C($R_{65}$)($R_{66}$)—*', *—Si($R_{65}$)($R_{66}$)—*', *—Ge($R_{65}$)($R_{66}$)—*', *—S—*', *—Se—*', *—O—*', *—C(=O)—*', *—S(=O)—*', *—S(=O)$_2$—*', *—C($R_{65}$)=*', *=C($R_{65}$)—*', *—C($R_{65}$)=C($R_{66}$)—*', *—C(=S)—*', and *—C≡C—*', $T_4$ is selected from *—N[($L_{67}$)$_{a67}$-($R_{67}$)]—*', *—B($R_{67}$)—*', *—P($R_{67}$)—*', *—C($R_{67}$)($R_{68}$)—*', *—Si($R_{67}$)($R_{68}$)—*', *—Ge($R_{67}$)($R_{68}$)—*', *—S—*', *—Se—*', *—O—*', *—C(=O)—*', *—S(=O)—

*', *—S(=O)$_2$—*', *—C(R$_{67}$)=*', *=C(R$_{67}$)—*', *—C(R$_{67}$)=C(R$_{68}$)—*', *—C(=S)—*', and *—C≡C—*', L$_{61}$, L$_{63}$, L$_{65}$, and L$_{67}$ are each independently selected from a single bond, a substituted or unsubstituted C$_5$-C$_{30}$ carbocyclic group, and a substituted or unsubstituted C$_1$-C$_{30}$ heterocyclic group, a61, a63, a65, and a67 are each independently an integer from 1 to 3; when a61 is 2 or greater, at least two L$_{61}$ groups are identical to or different from each other, when a63 is 2 or greater, at least two L$_{63}$ groups are identical to or different from each other, when a65 is 2 or greater, at least two L$_{65}$ groups are identical to or different from each other, when a67 is 2 or greater, at least two L$_{67}$ groups are identical to or different from each other, R$_{61}$ and R$_{62}$, R$_{63}$ and R$_{64}$, R$_{65}$ and R$_{66}$, and R$_{67}$ and R$_{68}$ are optionally linked via a first linking group to form a substituted or unsubstituted C$_5$-C$_{30}$ carbocyclic group or a substituted or unsubstituted C$_1$-C$_{30}$ heterocyclic group, Z$_1$ to Z$_4$ are each a group represented by *—N(R$_{51}$)(R$_{52}$), c1 to c4 are each independently an integer from 0 to 5, provided that a sum of c1 to c4 is 1 or greater, R$_1$ to R$_4$, R$_{51}$ to R$_{52}$, R$_{61}$ to R$_{68}$, R', and R" are each independently selected from hydrogen, deuterium, —F, —Cl, —Br, —I, —SF$_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted C$_1$-C$_{60}$ alkyl group, a substituted or unsubstituted C$_2$-C$_{60}$ alkenyl group, a substituted or unsubstituted C$_2$-C$_{60}$ alkynyl group, a substituted or unsubstituted C$_1$-C$_{60}$ alkoxy group, a substituted or unsubstituted C$_3$-C$_{10}$ cycloalkyl group, a substituted or unsubstituted C$_1$-C$_{10}$ heterocycloalkyl group, a substituted or unsubstituted C$_3$-C$_{10}$ cycloalkenyl group, a substituted or unsubstituted C$_1$-C$_{10}$ heterocycloalkenyl group, a substituted or unsubstituted C$_6$-C$_{60}$ aryl group, a substituted or unsubstituted C$_7$-C$_{60}$ alkylaryl group, a substituted or unsubstituted C$_6$-C$_{60}$ aryloxy group, a substituted or unsubstituted C$_6$-C$_{60}$ arylthio group, a substituted or unsubstituted C$_1$-C$_{60}$ heteroaryl group, a substituted or unsubstituted C$_2$-C$_{60}$ alkyl-heteroaryl group, a substituted or unsubstituted monovalent non-aromatic condensed polycyclic group, a substituted or unsubstituted monovalent non-aromatic condensed heteropolycyclic group, —N(Q$_1$)(Q$_2$), —Si(Q$_3$)(Q$_4$)(Q$_5$), —B(Q$_6$)(Q$_7$), and —P(=O)(Q$_8$)(Q$_9$), a1 to a4 are each independently an integer from 0 to 20, two groups selected from a plurality of R$_1$ groups are optionally linked to form a substituted or unsubstituted C$_5$-C$_{30}$ carbocyclic group or a substituted or unsubstituted C$_1$-C$_{30}$ heterocyclic group, two groups selected from a plurality of R$_2$ groups are optionally linked to form a substituted or unsubstituted C$_5$-C$_{30}$ carbocyclic group or a substituted or unsubstituted C$_1$-C$_{30}$ heterocyclic group, two groups selected from a plurality of R$_3$ groups are optionally linked to form a substituted or unsubstituted C$_5$-C$_{30}$ carbocyclic group or a substituted or unsubstituted C$_1$-C$_{30}$ heterocyclic group, two groups selected from a plurality of R$_4$ groups are optionally bound to form a substituted or unsubstituted C$_5$-C$_{30}$ carbocyclic group or a substituted or unsubstituted C$_1$-C$_{30}$ heterocyclic group, at least two of R$_1$ to R$_4$ are optionally linked to form a substituted or unsubstituted C$_5$-C$_{30}$ carbocyclic group or a substituted or unsubstituted C$_1$-C$_{30}$ heterocyclic group, R$_{51}$ and R$_{52}$ are optionally linked to form a substituted or unsubstituted C$_5$-C$_{30}$ carbocyclic group or a substituted or unsubstituted C$_1$-C$_{30}$ heterocyclic group,

* and *' each indicate a binding site to an adjacent atom, and at least one substituent of the substituted C$_5$-C$_{30}$ carbocyclic group, substituted C$_1$-C$_{30}$ heterocyclic group, substituted C$_1$-C$_{60}$ alkyl group, substituted C$_2$-C$_{60}$ alkenyl group, substituted C$_2$-C$_{60}$ alkynyl group, substituted C$_1$-C$_{60}$ alkoxy group, substituted C$_3$-C$_{10}$ cycloalkyl group, substituted C$_1$-C$_{10}$ heterocycloalkyl group, substituted C$_3$-C$_{10}$ cycloalkenyl group, substituted C$_1$-C$_{10}$ heterocycloalkenyl group, substituted C$_6$-C$_{60}$ aryl group, substituted C$_6$-C$_{60}$ aryloxy group, substituted C$_6$-C$_{60}$ arylthio group, substituted C$_1$-C$_{60}$ heteroaryl group, substituted monovalent non-aromatic condensed polycyclic group, and substituted monovalent non-aromatic condensed heteropolycyclic group is selected from:

deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a C$_1$-C$_{60}$ alkyl group, a C$_2$-C$_{60}$ alkenyl group, a C$_2$-C$_{60}$ alkynyl group, and a C$_1$-C$_{60}$ alkoxy group;

a C$_1$-C$_{60}$ alkyl group, a C$_2$-C$_{60}$ alkenyl group, a C$_2$-C$_{60}$ alkynyl group, and a C$_1$-C$_{60}$ alkoxy group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a C$_7$-C$_{60}$ alkylaryl group, a C$_6$-C$_{60}$ aryloxy group, a C$_6$-C$_{60}$ arylthio group, a C$_1$-C$_{60}$ heteroaryl group, a C$_2$-C$_{60}$ alkyl-heteroaryl group, a monovalent non-aromatic condensed polycyclic group, a monovalent non-aromatic condensed heteropolycyclic group, —N(Q$_{11}$)(Q$_{12}$), —Si(Q$_{13}$)(Q$_{14}$)(Q$_{15}$), —B(Q$_{16}$)(Q$_{17}$), and —P(=O)(Q$_{18}$)(Q$_{19}$);

a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a C$_7$-C$_{60}$ alkylaryl group, a C$_6$-C$_{60}$ aryloxy group, a C$_6$-C$_{60}$ arylthio group, a C$_1$-C$_{60}$ heteroaryl group, a monovalent non-aromatic condensed polycyclic group, and a monovalent non-aromatic condensed heteropolycyclic group;

a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a C$_7$-C$_{60}$ alkylaryl group, a C$_6$-C$_{60}$ aryloxy group, a C$_6$-C$_{60}$ arylthio group, a C$_1$-C$_{60}$ heteroaryl group, a C$_2$-C$_{60}$ alkyl-heteroaryl group, a monovalent non-aromatic condensed polycyclic group, and a monovalent non-aromatic condensed heteropolycyclic group, each substituted with at least one selected from deuterium, —F, —Cl, —Br, —I, —CD$_3$, —CD$_2$H, —CDH$_2$, —CF$_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkyl-heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$B(Q_{26})(Q_{27})$, and —$P(=O)(Q_{28})(Q_{29})$, and
—$N(Q_{31})(Q_{32})$, —$Si(Q_{33})(Q_{34})(Q_{35})$, —$B(Q_{36})(Q_{37})$, and —$P(=O)(Q_{38})(Q_{39})$,
wherein $Q_1$ to $Q_9$, $Q_{11}$ to $Q_{19}$, $Q_{21}$ to $Q_{29}$, and $Q_{31}$ to $Q_{39}$ are each independently selected from hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one of a $C_1$-$C_{60}$ alkyl group and a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl-heteroaryl group, a monovalent non-aromatic condensed polycyclic group, and a monovalent non-aromatic condensed heteropolycyclic group.

2. The organometallic compound of claim 1, wherein M is selected from Pt, Pd, and Au.

3. The organometallic compound of claim 1, wherein $X_2$ and $X_4$ are each N, $X_3$ is C, and $X_5$ is selected from O and S.

4. The organometallic compound of claim 1, wherein rings $CY_1$ to $CY_4$ are each independently selected from a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluoren-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, and a 5,6,7,8-tetrahydroquinoline group.

5. The organometallic compound of claim 1, wherein $T_1$ and $T_2$ are each a single bond, and $T_3$ is selected from *—$N[(L_{65})_{a65}$-$(R_{65})]$—*', *—$C(R_{65})(R_{66})$—*', *—$Si(R_{65})(R_{66})$—*', *—S—*', and *—O—*'.

6. The organometallic compound of claim 1, wherein $T_4$ is selected from *—$C(R_{67})(R_{68})$—*', *—$Si(R_{67})(R_{68})$—*', and *—$Ge(R_{67})(R_{68})$—*'.

7. The organometallic compound of claim 1, wherein
c1=1, c2=0, c3=0, and c4=0;
c1=0, c2=1, c3=0, and c4=0;
c1=0, c2=0, c3=1, and c4=0;
c1=0, c2=0, c3=0, and c4=1; or
c1=0, c2=2, c3=0, and c4=0.

8. The organometallic compound of claim 1, wherein $R_1$ to $R_4$, $R_{51}$, $R_{52}$, $R_{61}$ to $R_{68}$, R', and R" are each independently selected from
hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, and a $C_1$-$C_{20}$ alkoxy group;
a $C_1$-$C_{20}$ alkyl group and a $C_1$-$C_{20}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, and a pyrimidinyl group;
a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and —N($Q_1$)($Q_2$), —Si($Q_3$)($Q_4$)($Q_5$), —B($Q_6$)($Q_7$), and —P(=O)($Q_8$)($Q_9$), wherein $Q_1$ to $Q_9$ are each independently selected from —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a $C_1$-$C_{10}$ alkyl group, and a phenyl group.

9. The organometallic compound of claim 1, wherein $R_1$ to $R_4$, $R_{51}$, $R_{52}$, $R_{61}$ to $R_{68}$, R', and R" are each independently selected from hydrogen, deuterium, —F, a cyano group, a nitro group, —$SF_5$, —$CH_3$, —$CD_3$, —$CD_2H$, —$CDH_2$, —$CF_3$, —$CF_2H$, —$CFH_2$, groups represented by Formulae 9-1 to 9-19, and groups represented by Formulae 10-1 to 10-194:

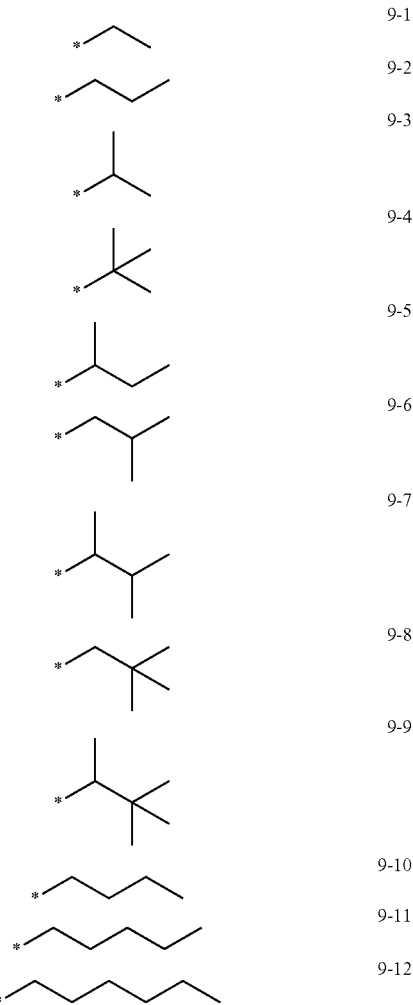

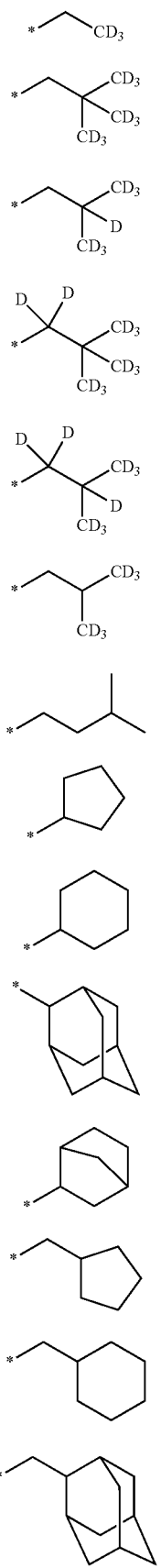
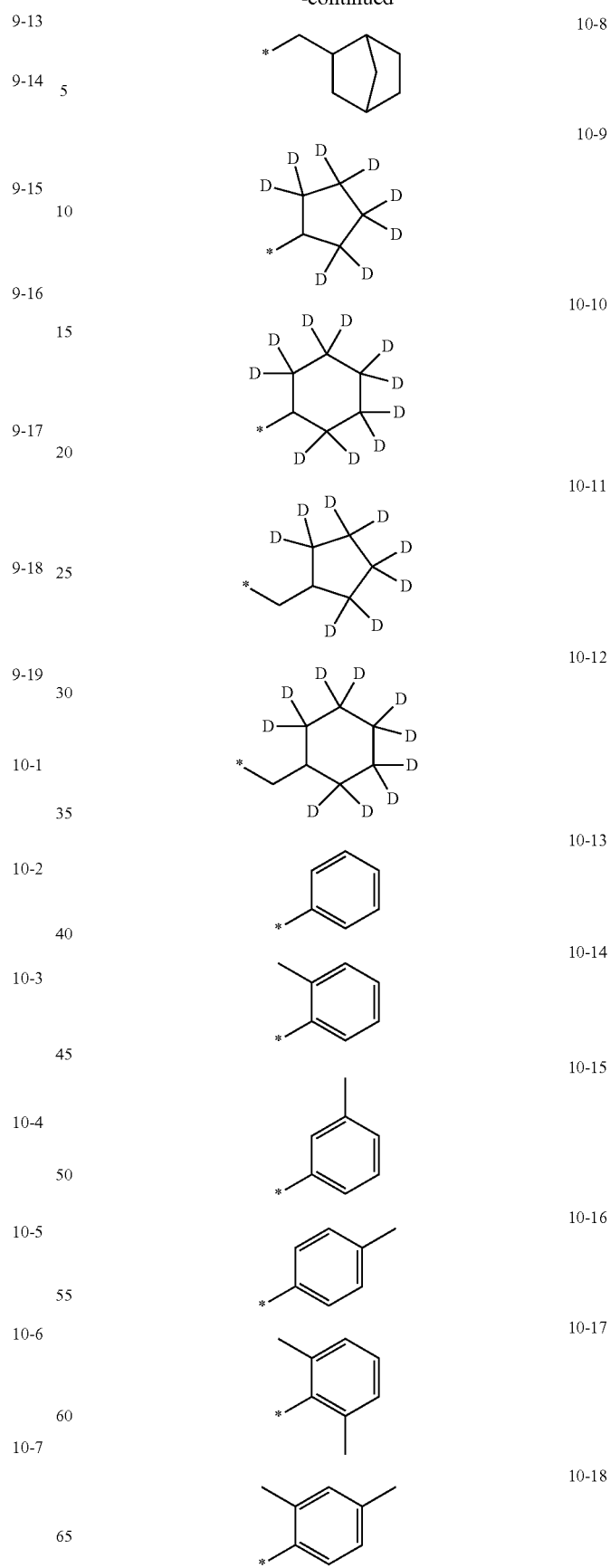

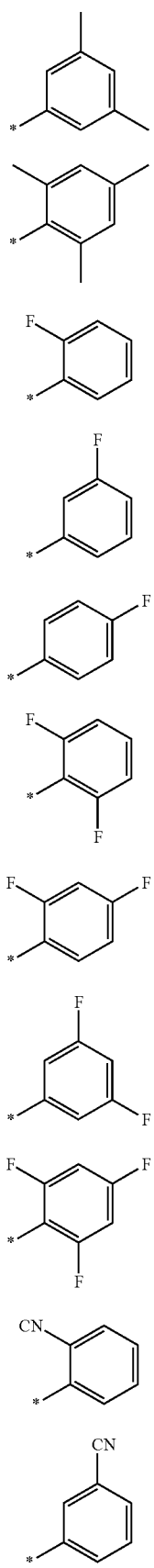
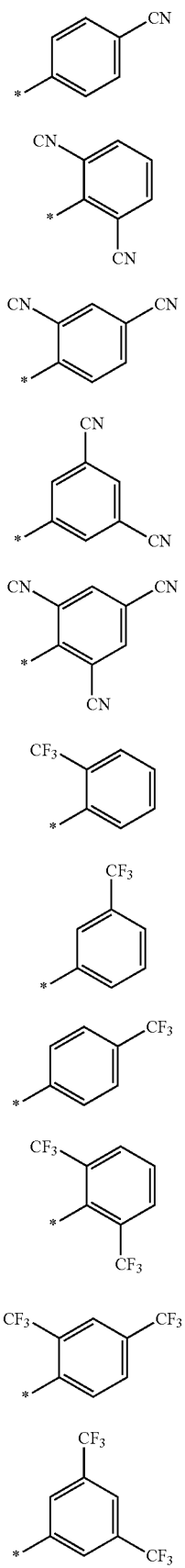

| | |
|---|---|
| 10-41 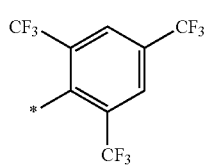 | 10-52 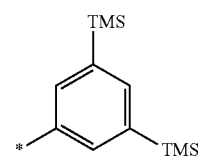 |
| 10-42 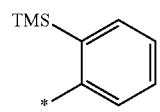 | 10-53 |
| 10-43 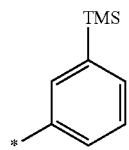 | 10-54 |
| 10-44 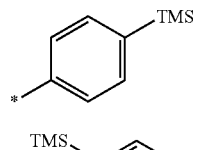 | 10-55 |
| 10-45 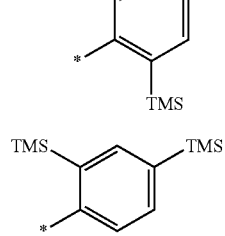 | 10-56 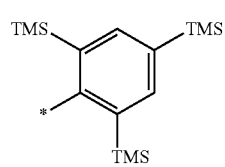 |
| 10-46 | 10-57 |
| 10-47 | 10-58 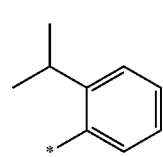 |
| 10-48 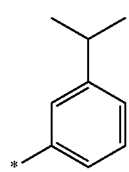 | 10-59 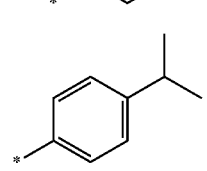 |
| 10-49 | |
| 10-50 | |
| 10-51 | |

10-60 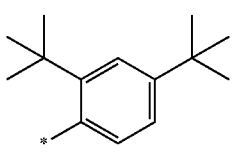
10-61 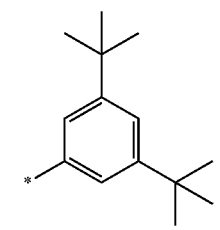
10-62 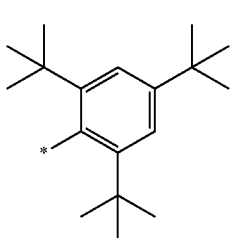
10-63 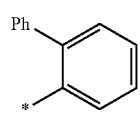
10-64 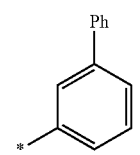
10-65 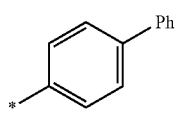
10-66 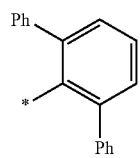
10-67 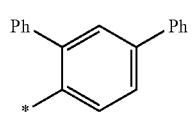
10-68 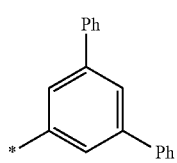
10-69 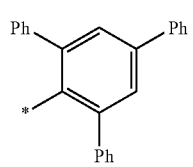
10-70 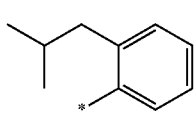
10-71 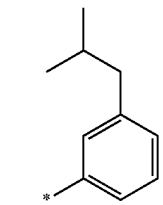
10-72 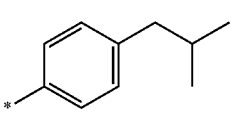
10-73 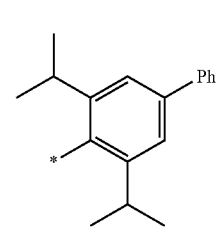
10-74 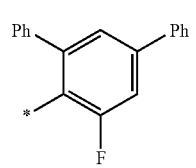
10-75 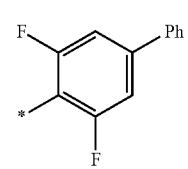
10-76 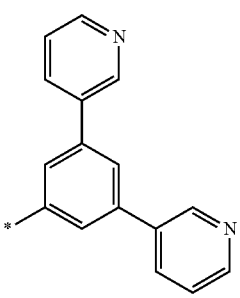
10-77 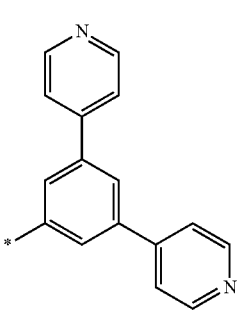

| | |
|---|---|
| 10-78 | 10-85 |
| 10-79 | 10-86 |
| 10-80 | 10-87 |
| 10-81 | 10-88 |
| 10-82 | 10-89 |
| 10-83 | 10-90 |
| 10-84 | 10-91 |
| | 10-92 |
| | 10-93 |
| | 10-94 |
| | 10-95 |
| | 10-96 |
| | 10-97 |

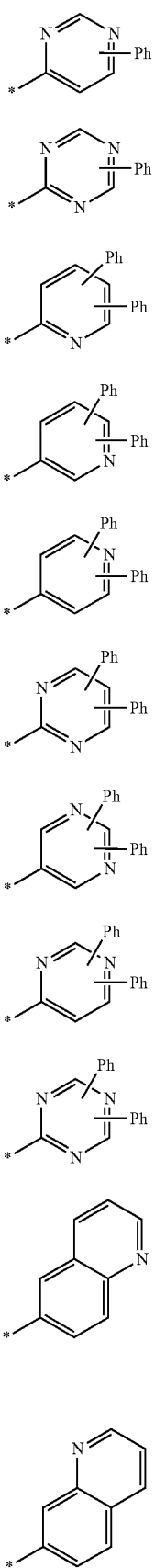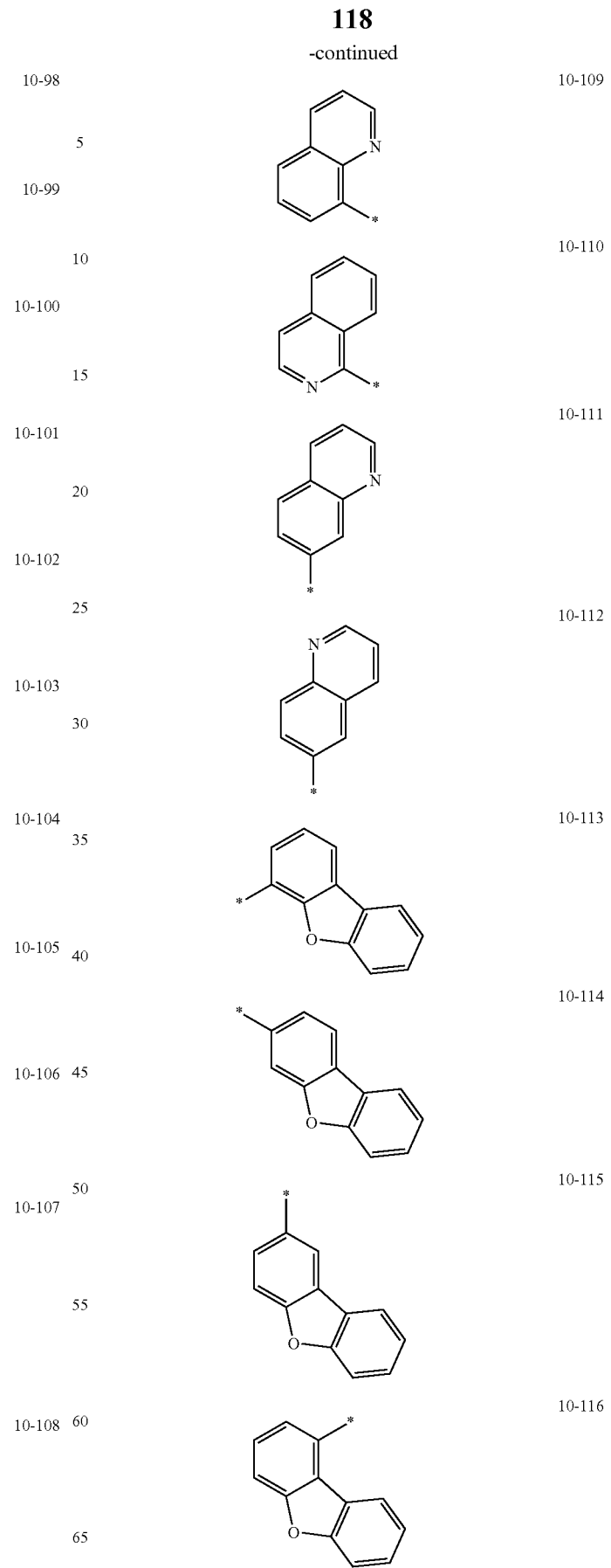

| | |
|---|---|
| 10-117 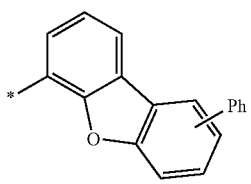 | 10-125 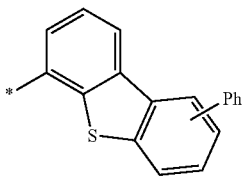 |
| 10-118 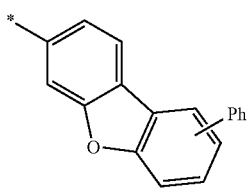 | 10-126 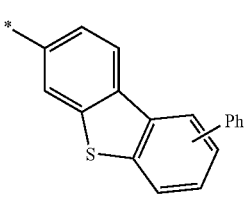 |
| 10-119 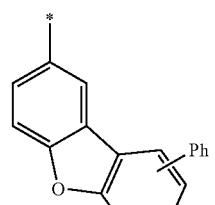 | 10-127 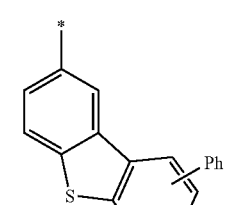 |
| 10-120 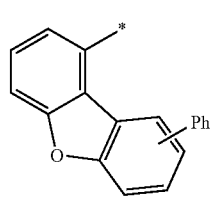 | 10-128 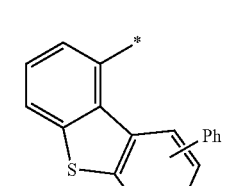 |
| 10-121 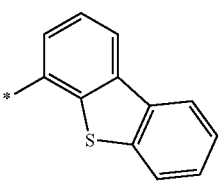 | 10-129 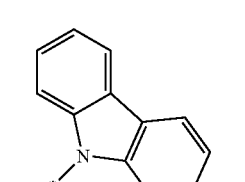 |
| 10-122 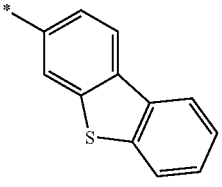 | 10-130 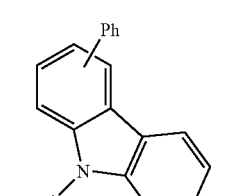 |
| 10-123 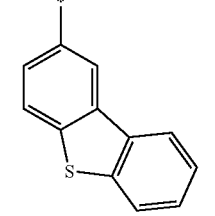 | 10-131 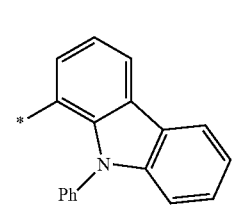 |
| 10-124 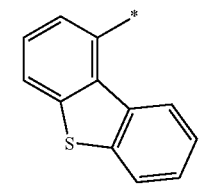 | 10-132 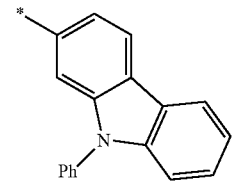 |

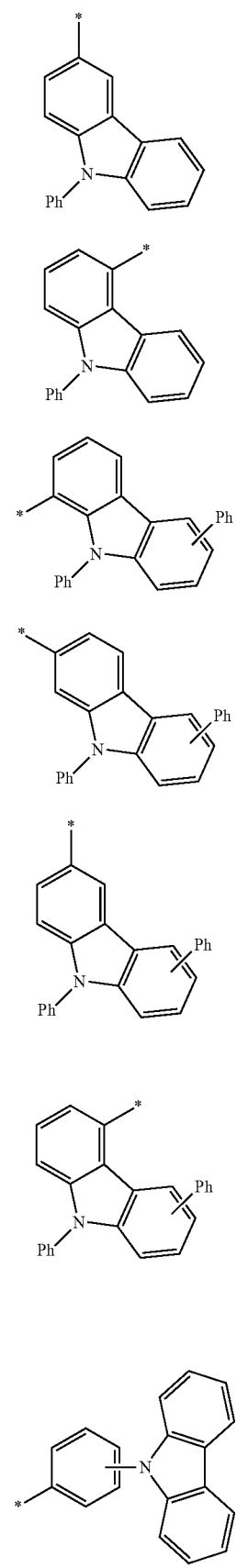
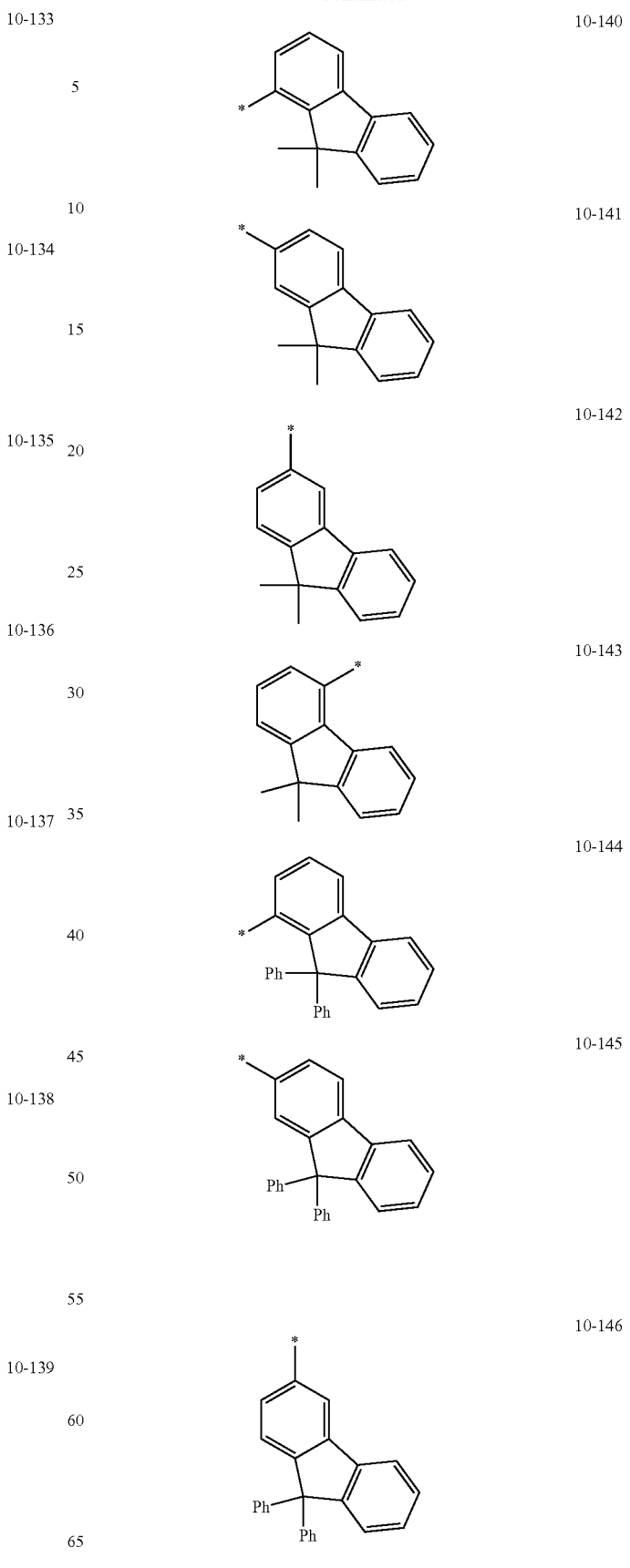

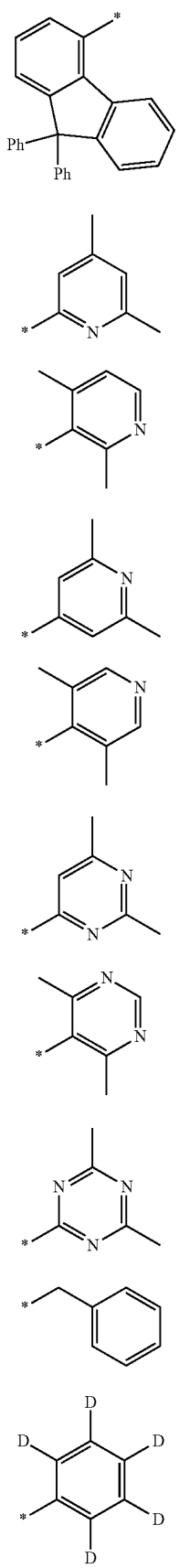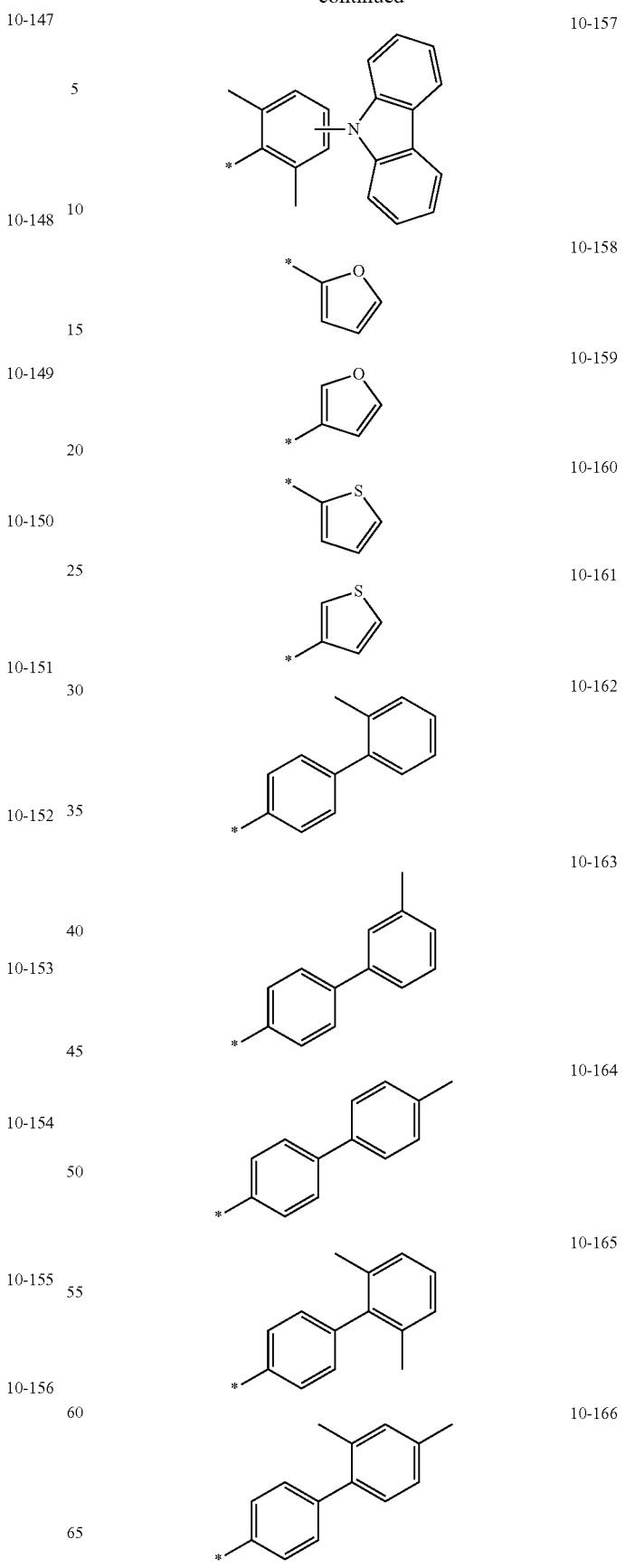

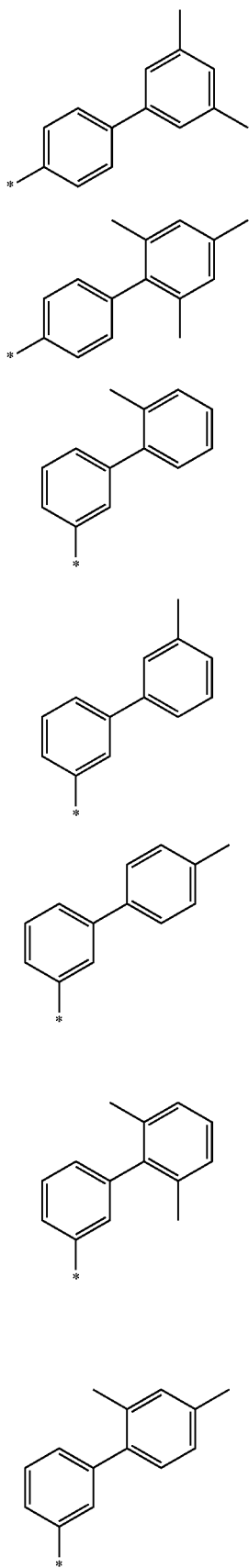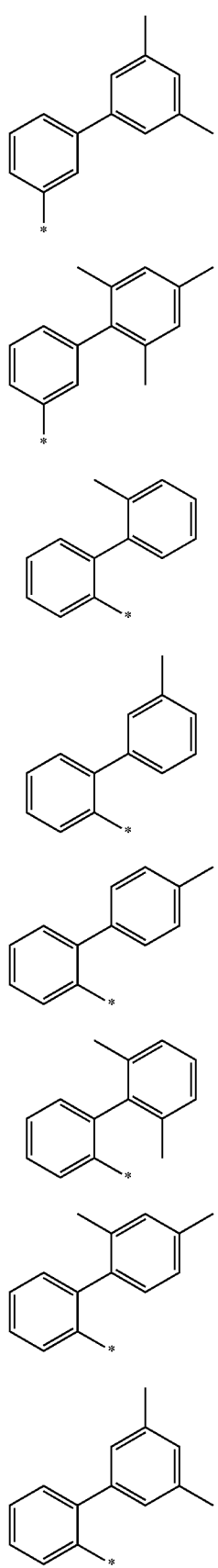

-continued
10-182 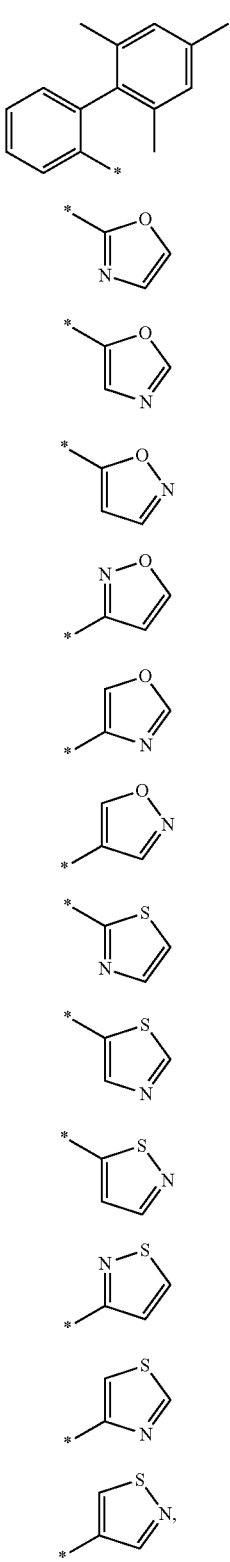
10-183
10-184
10-185
10-186
10-187
10-188
10-189
10-190
10-191
10-192
10-193
10-194
wherein, in Formulae 9-1 to 9-19 and 10-1 to 10-194, * indicates a binding site to an adjacent atom, "Ph" represents a phenyl group, and "TMS" represents a trimethylsilyl group.
10. The organometallic compound of claim 1, wherein a moiety represented by
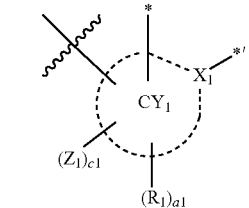
in Formula 1 is represented by any one selected from Formulae CY1-1 to CY1-15:
CY1-1
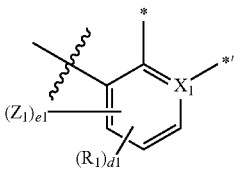
CY1-2
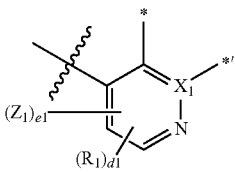
CY1-3
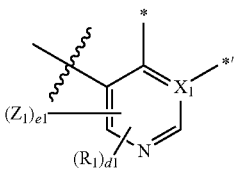
CY1-4
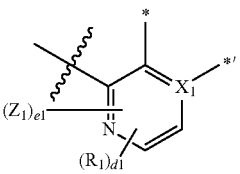
CY1-5
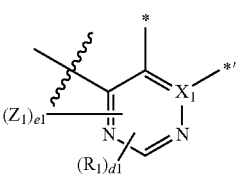
CY1-6
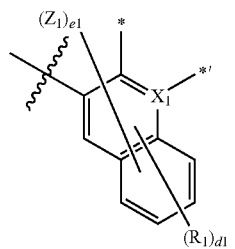

CY1-7

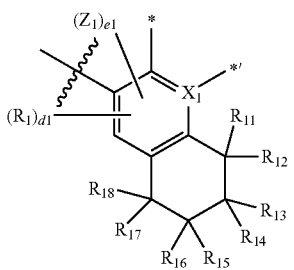

CY1-8

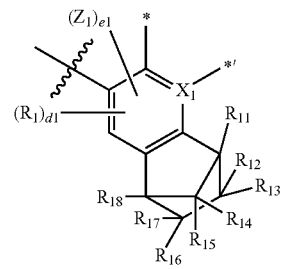

CY1-9

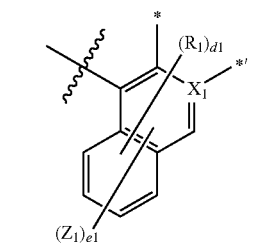

CY1-10

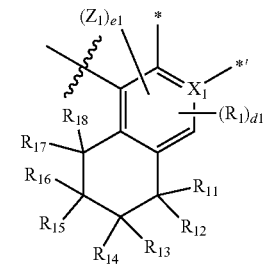

CY1-11

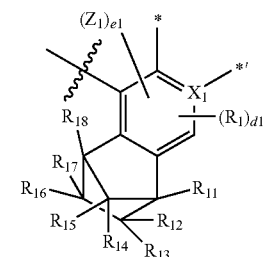

CY1-12

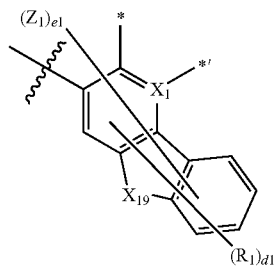

CY1-13

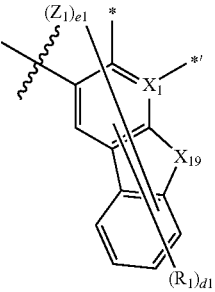

CY1-14

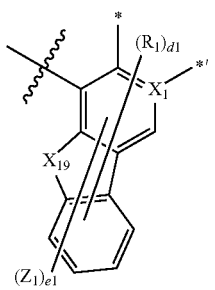

CY1-15

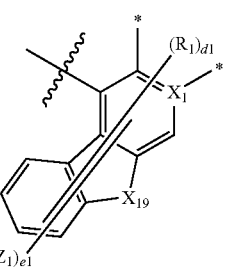

wherein, in Formulae CY1-1 to CY1-15, $X_{19}$ is selected from $C(R_{18})(R_{19})$, $N(R_{18})$, O, S, and $Si(R_{18})(R_{19})$, $Z_1$ and $R_1$ are the same as those defined in claim 1, $R_{11}$ to $R_{19}$ are each the same as $R_1$ as defined in claim 1, d1 and e1 are each independently an integer from 0 to 2,

*' indicates a binding site to M in Formula 1,

* indicates a binding site to $T_1$ in Formula 1 and

indicates a binding site to $T_4$ in Formula 1.

11. The organometallic compound of claim 1, wherein a group represented by

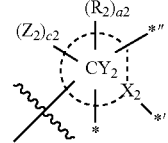

in Formula 1 is selected from groups represented by Formulae CY2-1 to CY2-6:

CY2-1 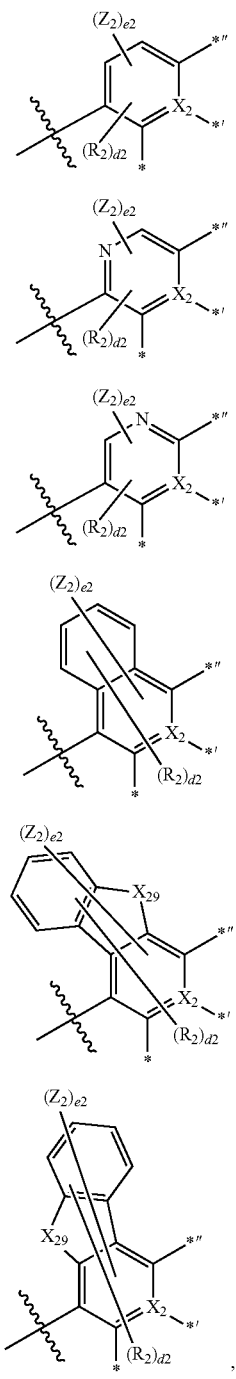

CY2-2

CY2-3

CY2-4

CY2-5

CY2-6 wherein, in Formulae CY2-1 to CY2-6,
Z₂ and R₂ are the same as those defined in claim 1,
d2 and e2 are each independently an integer from 0 to 2,
*′ indicates a binding site to M in Formula 1,
* indicates a binding site to T₁ in Formula 1,
*″ indicates a binding site to T₂ in Formula 1, and indicates a binding site to T₄ in Formula 1.

12. The organometallic compound of claim 1, wherein a group represented by

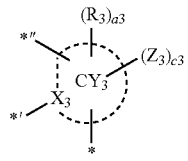

in Formula 1 is selected from groups represented by Formulae CY3-1 to CY3-12:

CY3-1 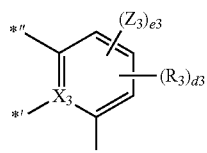

CY3-2

CY3-3 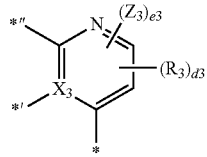

CY3-4

CY3-5 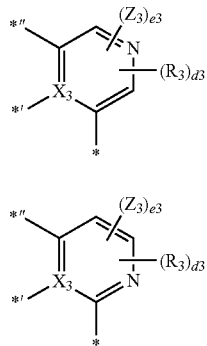

CY3-6 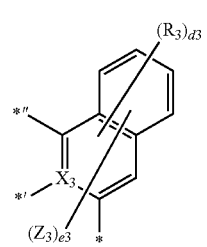

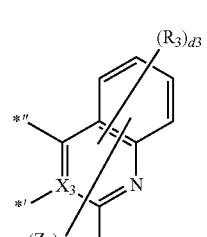

CY3-7

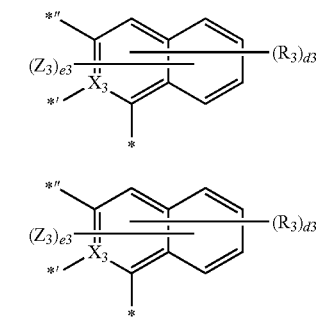

CY3-8

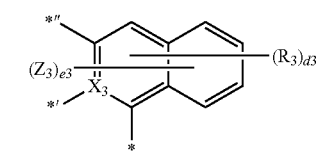

CY3-9

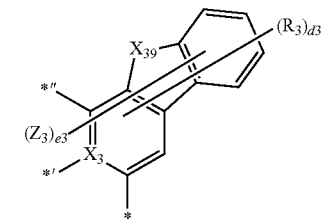

CY3-10

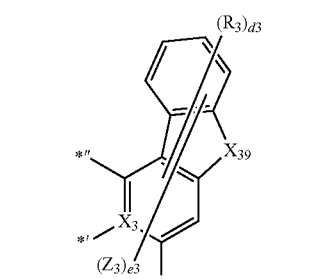

CY-11

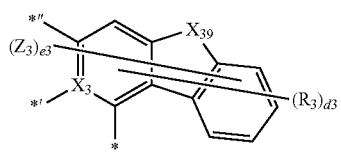

CY3-12

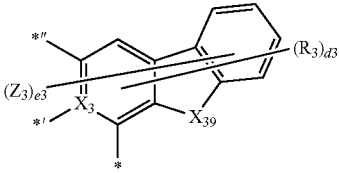

wherein, in Formulae CY3-1 to CY$_3$-12,

X$_{39}$ is selected from C(R$_{38}$)(R$_{39}$), N(R$_{38}$), O, S, and Si(R$_{38}$)(R$_{39}$), Z$_3$ and R$_3$ are the same as those defined in claim 1, R$_{38}$ and R$_{39}$ are each the same as R$_3$ as defined in claim 1, d3 and e3 are each independently an integer from 0 to 2,

*' indicates a binding site to M in Formula 1,

* indicates a binding site to T$_3$ in Formula 1, and

*'' indicates a binding site to T$_2$ in Formula 1.

13. The organometallic compound of claim 1, wherein a group represented by

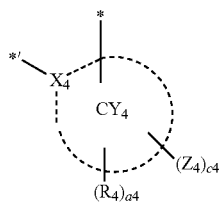

in Formula 1 is selected from groups represented by Formulae CY4-1 to CY4-26:

CY4-1

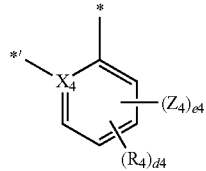

CY4-2

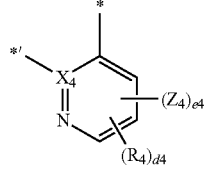

CY4-3

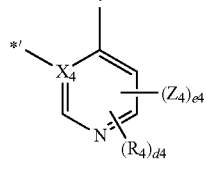

CY4-4

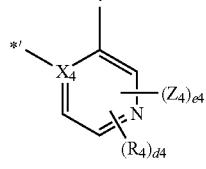

CY4-5

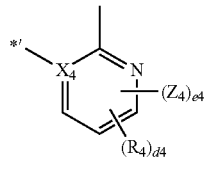

CY4-6

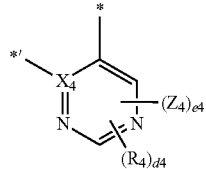

CY4-7 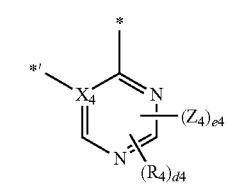
CY4-8 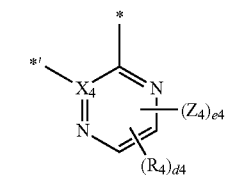
CY4-9 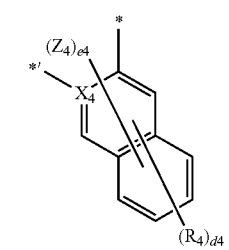
CY4-10 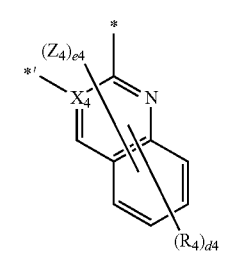
CY4-11 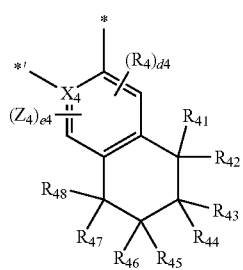
CY4-12 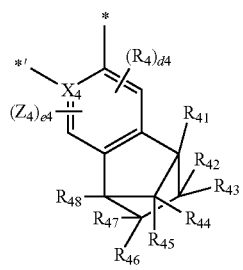
CY4-13 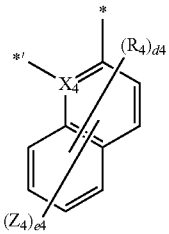
CY4-14 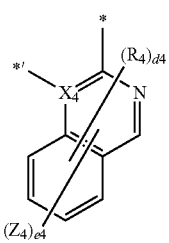
CY4-15 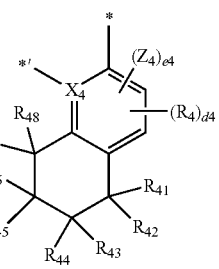
CY4-16 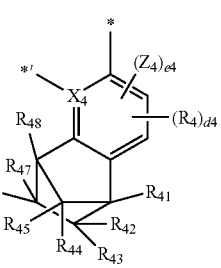
CY4-17 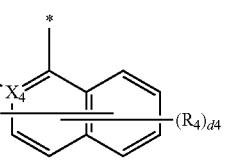
CY4-18 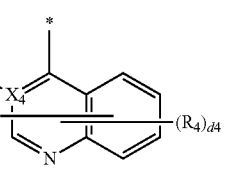
CY4-19 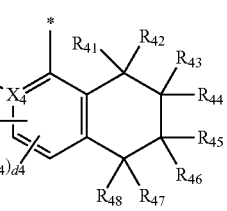

CY4-20 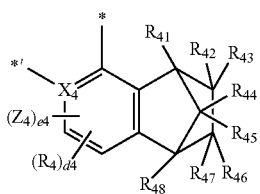

CY4-21 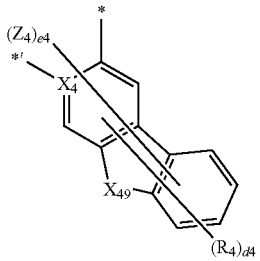

CY4-22 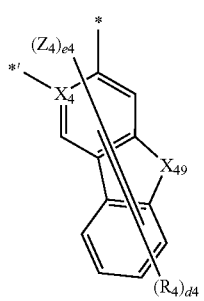

CY4-23 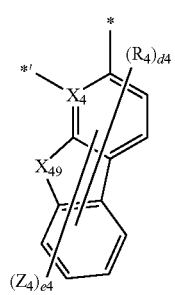

CY4-24 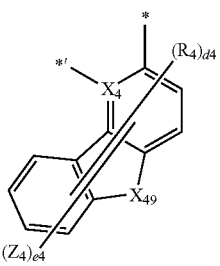

CY4-25 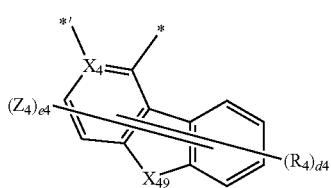

CY4-26 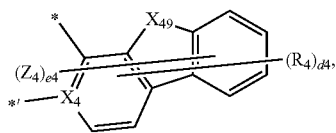

wherein, in Formulae CY4-1 to CY4-26, $X_{49}$ is selected from $C(R_{48})(R_{49})$, $N(R_{48})$, O, S, and $Si(R_{48})(R_{49})$, $Z_4$ and $R_4$ are the same as those defined in claim 1, $R_{41}$ to $R_{49}$ are each the same as $R_4$ as defined in claim 1, d4 and e4 are each independently an integer from 0 to 2,

*' indicates a binding site to M in Formula 1, and

* indicates a binding site to $T_3$ in Formula 1.

14. The organometallic compound of claim 1, wherein a group represented by

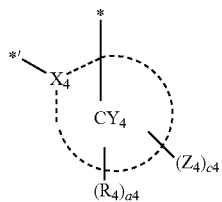

in Formula 1 is represented by Formula CY4(1):

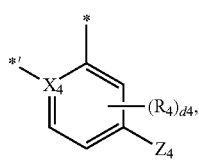

CY4(1)

wherein, in Formula CY4(1), $Z_4$ and $R_4$ are the same as those defined in claim 1, d4 is an integer from 0 to 2,

*' indicates a binding site to M in Formula 1, and

* indicates a binding site to $T_3$ in Formula 1.

15. The organometallic compound of claim 1, selected from Compounds 1 to 40:

1

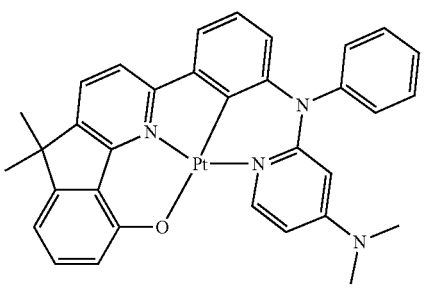

2
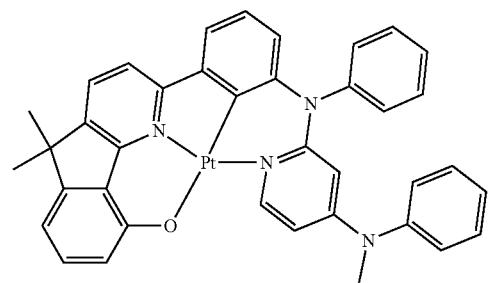
3
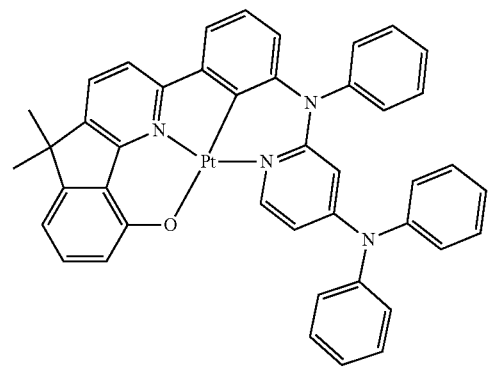
4
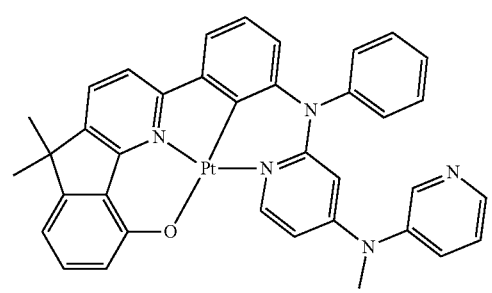
5
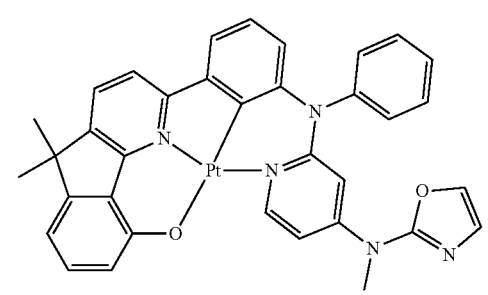
6
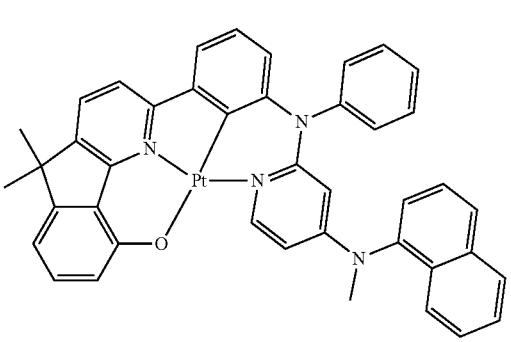
7
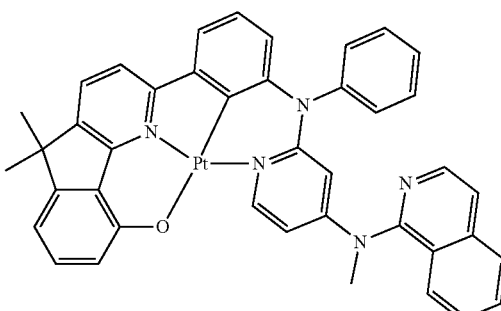
8
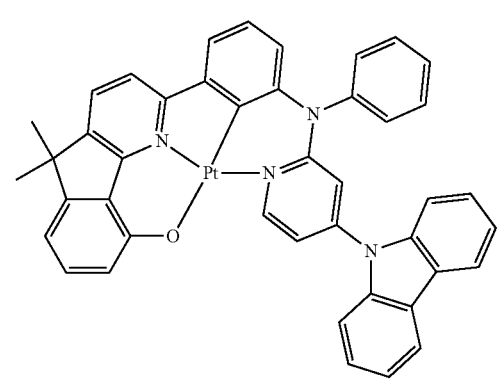
9
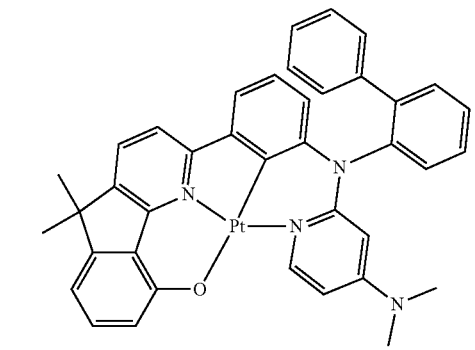
10
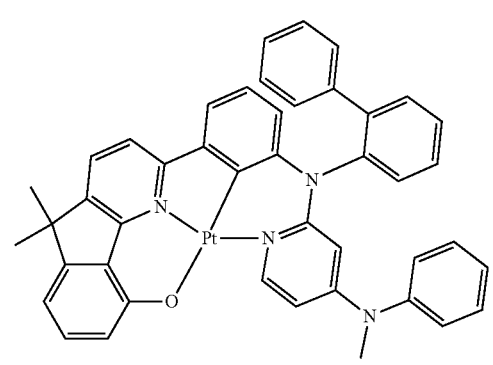

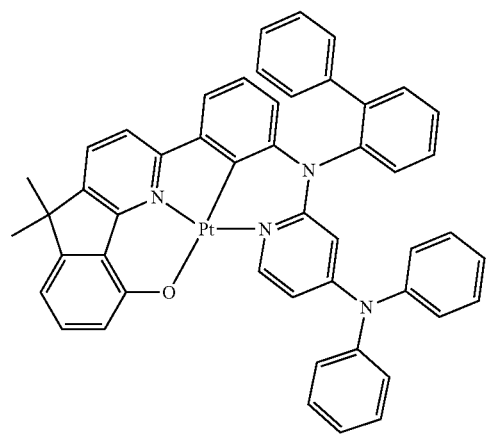
11
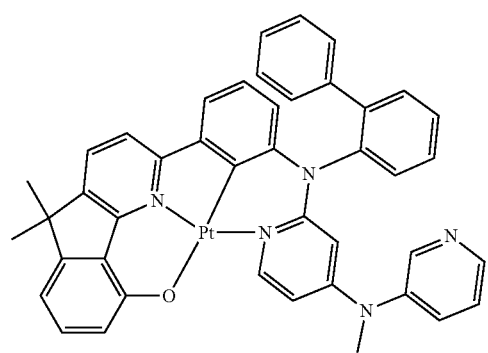
12
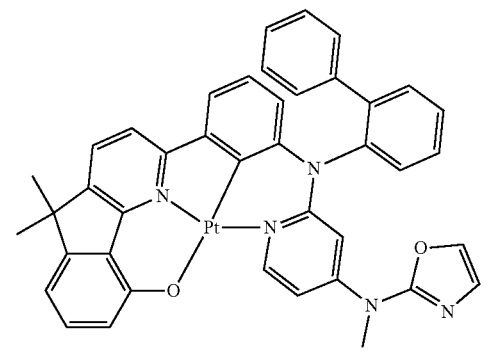
13
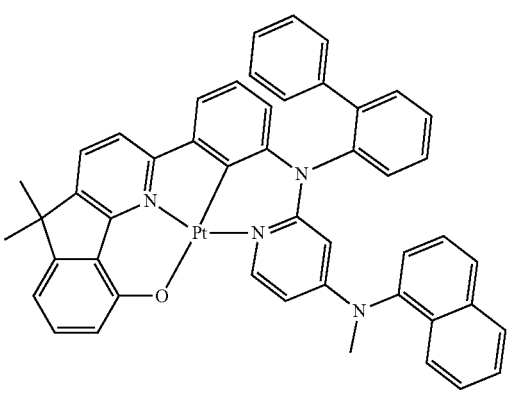
14
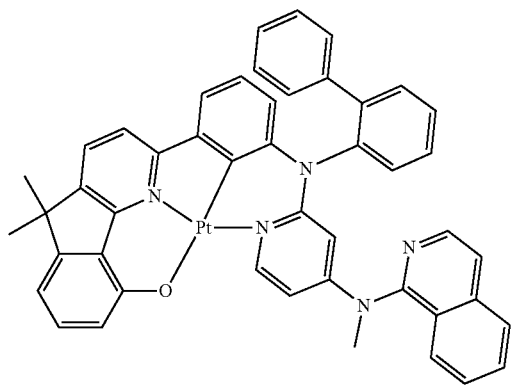
15
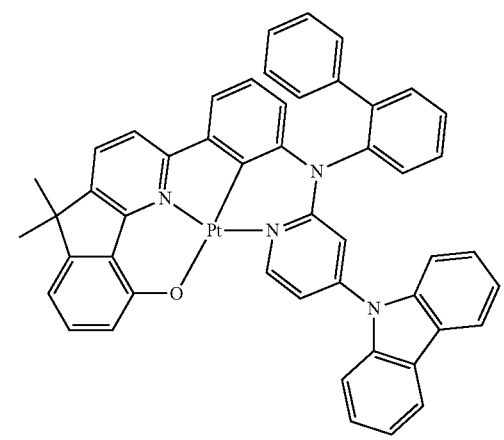
16
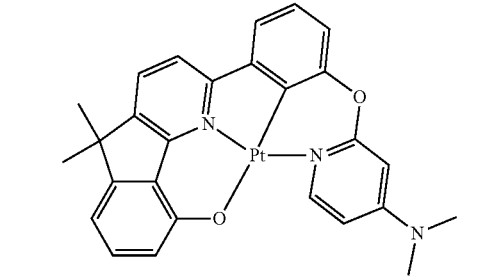
17
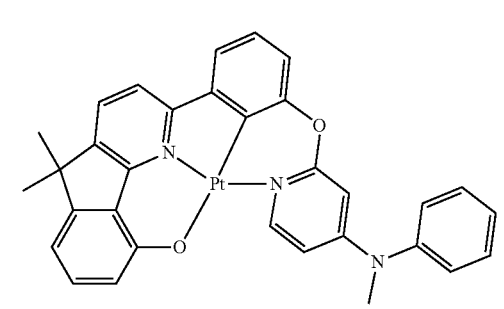
18

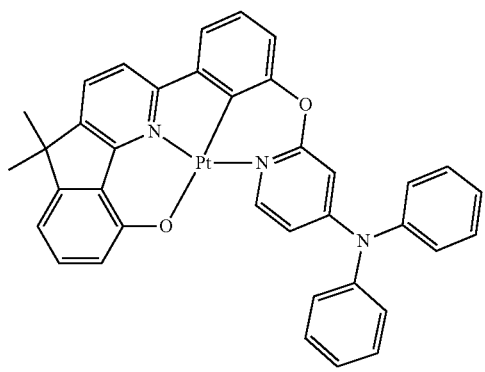
19
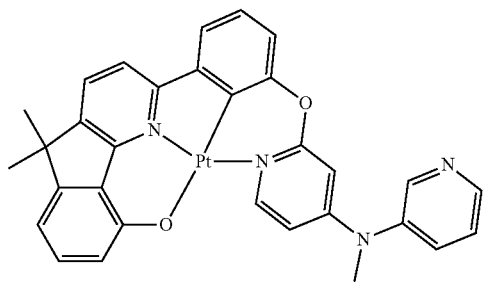
20
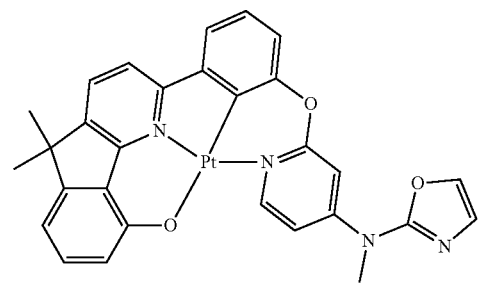
21
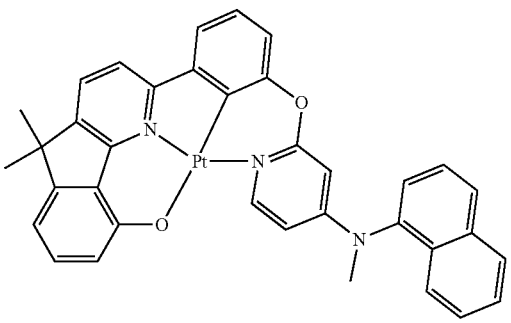
22
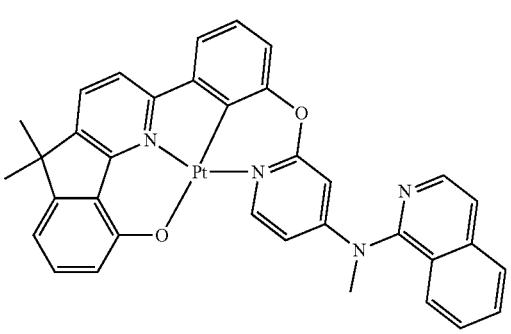
23
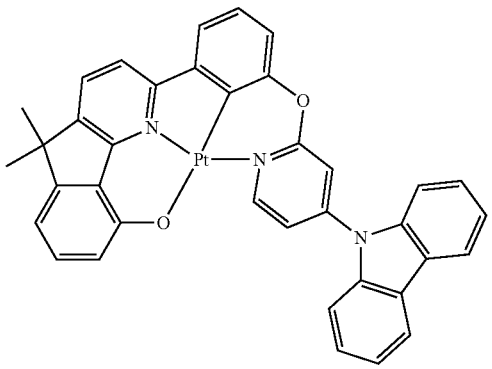
24
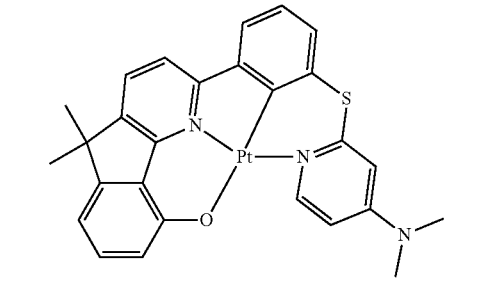
25
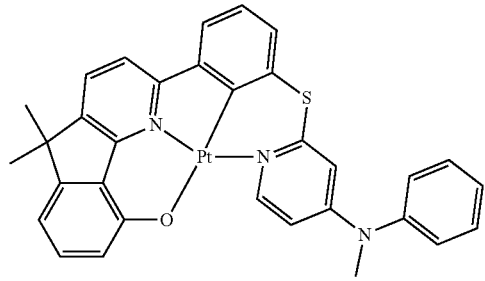
26
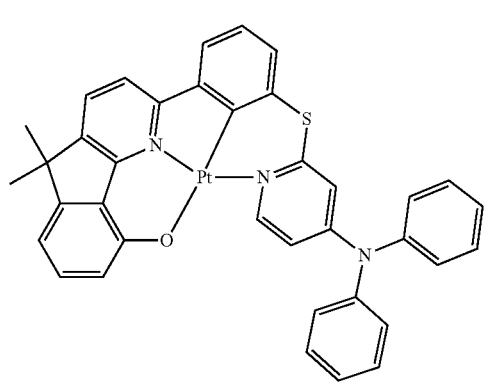
27
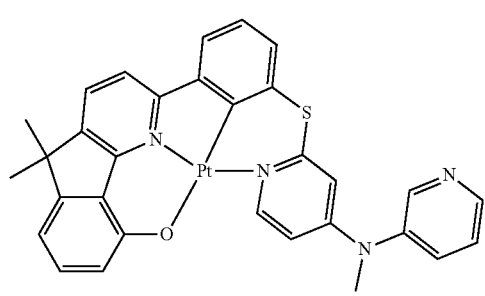
28

29
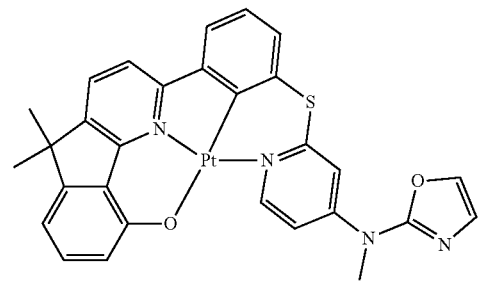
30
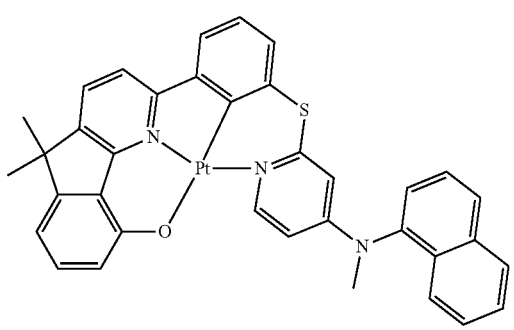
31
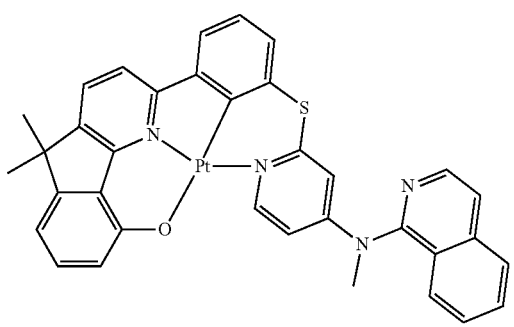
32
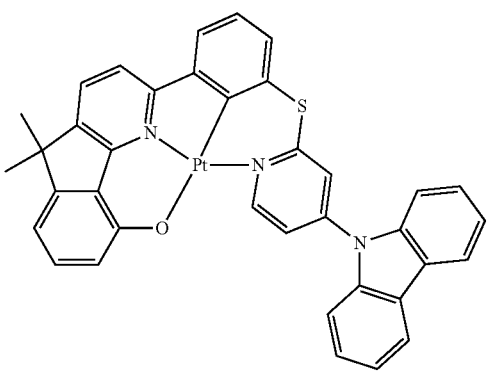
33
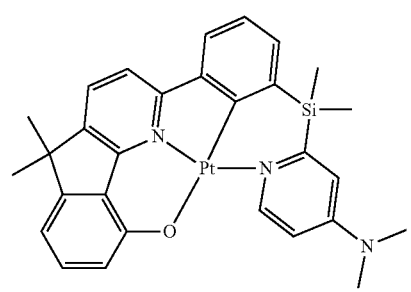
34
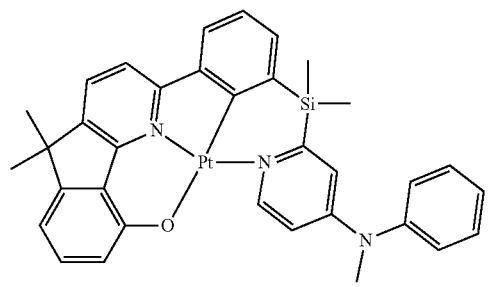
35
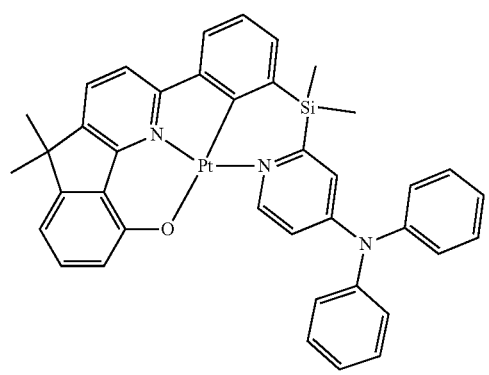
36
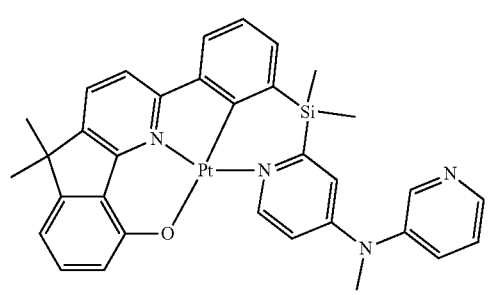
37
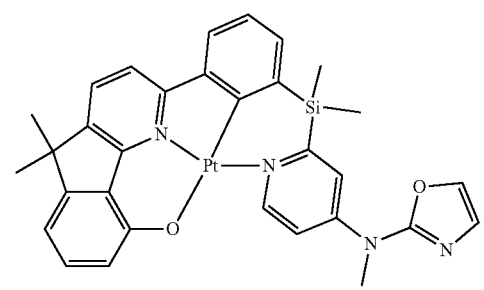
38
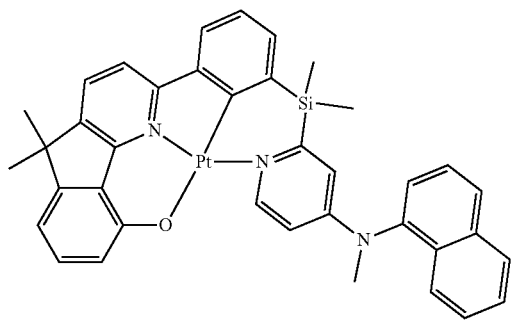

-continued

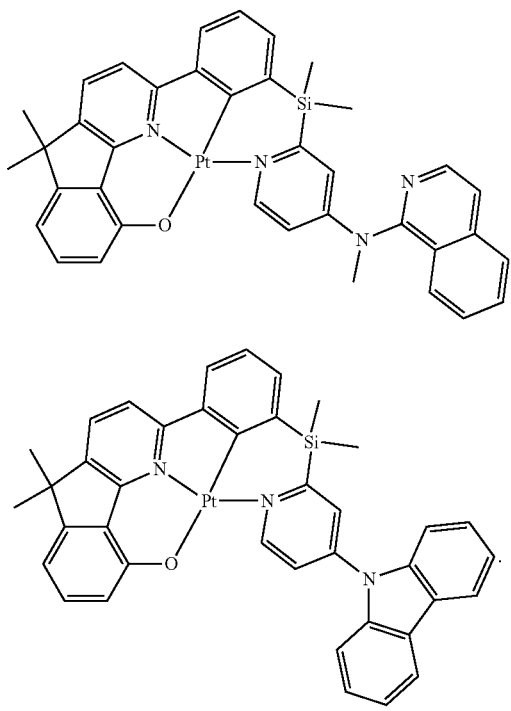

16. An organic light-emitting device comprising:
a first electrode;
a second electrode; and
an organic layer disposed between the first electrode and the second electrode, the organic layer comprising an emission layer and at least one organometallic compound of claim 1.

17. The organic light-emitting device of claim 16, wherein the first electrode is an anode,
the second electrode is a cathode, and
the organic layer comprises a hole transport region disposed between the first electrode and the emission layer and an electron transport region disposed between the emission layer and the second electrode,
wherein the hole transport region comprises a hole injection layer, a hole transport layer, an electron blocking layer, or any combination thereof, and
the electron transport region comprises a hole blocking layer, an electron transport layer, an electron injection layer, or any combination thereof.

18. The organic light-emitting device of claim 16, wherein the emission layer comprises the at least one organometallic compound.

19. The organic light-emitting device of claim 18, wherein the emission layer further comprises a host in an amount of greater than an amount of the organometallic compound.

20. A diagnostic composition comprising at least one organometallic compound of claim 1.

* * * * *